(12) United States Patent (10) Patent No.: US 12,604,398 B2
Xiao et al. (45) Date of Patent: Apr. 14, 2026

(54) SELF-HEALABLE, RECYCLABLE, AND RECONFIGURABLE WEARABLE ELECTRONICS DEVICE

(71) Applicant: THE REGENTS OF THE UNIVERSITY OF COLORADO, A BODY CORPORATE, Denver, CO (US)

(72) Inventors: Jianliang Xiao, Louisville, CO (US); Wei Zhang, Boulder, CO (US); Chuanqian Shi, Boulder, CO (US); Zhanan Zou, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 371 days.

(21) Appl. No.: 18/035,420

(22) PCT Filed: Nov. 4, 2021

(86) PCT No.: PCT/US2021/058087
§ 371 (c)(1),
(2) Date: May 4, 2023

(87) PCT Pub. No.: WO2022/098892
PCT Pub. Date: May 12, 2022

(65) Prior Publication Data
US 2023/0413432 A1 Dec. 21, 2023

Related U.S. Application Data

(60) Provisional application No. 63/110,053, filed on Nov. 5, 2020.

(51) Int. Cl.
*H05K 1/03* (2006.01)
*H01L 23/498* (2006.01)
(Continued)

(52) U.S. Cl.
CPC ..... *H05K 1/0393* (2013.01); *H01L 23/49866* (2013.01); *H01L 23/5387* (2013.01); *H05K 3/284* (2013.01); *H05K 2201/0154* (2013.01)

(58) Field of Classification Search
CPC ................ H05K 1/0283; H05K 1/189; H05K 2201/0108; H05K 2201/0137; H05K 2203/1311; H05K 2203/1327
See application file for complete search history.

(56) References Cited

U.S. PATENT DOCUMENTS

2015/0259458 A1* 9/2015 Zhang ..................... C08K 7/24
528/266
2018/0254566 A1 9/2018 Holbery et al.
(Continued)

FOREIGN PATENT DOCUMENTS

CN 108112188 A 6/2018
WO 2016118536 A2 7/2016

OTHER PUBLICATIONS

"Supplementary European Search Report dated Nov. 29, 2024 for European Appln. No. EP 21 89 0075".
(Continued)

*Primary Examiner* — Alexander G Ghyka
(74) *Attorney, Agent, or Firm* — Saul Ewing LLP; Domingos J. Silva; Sean J. D.

(57) ABSTRACT

In one aspect, the present disclosure relates to an electronic device comprising: a plurality of electronic chip components; a plurality of liquid metal (LM) electrical interconnects coupled to the plurality of electronic chips; and a polyimine film encapsulating the plurality of electronic chip components and the plurality of LM electrical interconnects. In some embodiments, the polyimine film comprises the product of the polymerization reaction between terephthaldehyde, 3,3diamino-N-methyldipropylamine, and tris(2-aminoethyl)amine. In another aspect, the present disclosure
(Continued)

relates to a method for manufacturing an electronic device, the method comprising: disposing a volume of LM on a polyimine substrate to form a plurality of electrical interconnects; disposing a plurality of electronic chip components onto the polyimine substrate and in contact with the plurality of electrical interconnects; and applying a layer of polyimine onto the polyimine substrate, the plurality of electrical interconnects, and the plurality of electronic chip components.

17 Claims, 65 Drawing Sheets

(51) Int. Cl.

| | | |
|---|---|---|
| *H01L 23/538* | (2006.01) | |
| *H05K 3/28* | (2006.01) | |

(56) References Cited

U.S. PATENT DOCUMENTS

| | | |
|---|---|---|
| 2019/0110363 A1 | 4/2019 | Bao et al. |
| 2020/0291164 A1 | 9/2020 | Xiao et al. |
| 2020/0296825 A1 | 9/2020 | Ozdoganlar et al. |

OTHER PUBLICATIONS

"International Search Report and Written Opinion dated Feb. 9, 2022 for International Appln. No. PCT/US2021/058087".

Jin , et al., "Malleable and Recyclable Thermosets: The Next Generation of Plastics", Matter. 1, 2019, 1456-1493.

Jin , et al., "Recent advances in dynamic covalent chemistry.", Che. Soc. Rev. 42, doi: 10.1039/C3CS60044K, 2013, 6634-6654.

Shi , et al., "Heterogeneous integration of rigid, soft, and liquid materials for self-healable, recyclable, and reconfigurable wearable electronics", Science Advances, vol. 6, Nov. 6, 2020, 1-8.

Taynton , et al., "Heat- or Water-Driven Malleability in a Highly Recyclable Covaltn Network Polymer", Advanced Materials, vol. 26, No. 23, Jun. 8, 2014, pp. 3938-3942.

Taynton , et al., "Re-healable polyimine thermosets: polymer composition and moisture sensitivity.", Polym. Chem. 7, doi: 10.1039/c6py01395c, 2016, 7052-7056.

Taynton , et al., "Repairable Woven Carbon Fiber Composites with Full Recyclability Enabled by Malleable Polyimine Networks.", Advanced materials 28, 2016, 2904-2909.

Whiteley , et al., "Ultra-thin Solid-State Li-lon Electrolyte Membrane Facilitated by a Self-Healing Polymer Matrix.", Adv. Mater. 27, doi: 10.1002/adma.201502636, 2015, 6922-6927.

Zou , et al., "Rehealable, fully recyclable, and malleable electronic skin enabled by dynamic covalent thermoset nanocomposite", Science Advances, vol. 4, No. 2, Feb. 9, 2018, pp. 1-7.

* cited by examiner

Wearing polyimine film

Wearing 24 hours

Original Skin

Wearing 12 hours

Biaxially stretched by 30%

$\varepsilon_{max\text{-}substrate}$ (%)

0          110

Uniaxially stretched 60% (vertical)

$\varepsilon_{max\text{-}substrate}$ (%)

0          130

Uniaxially stretched by 60% (horizontal)

$\varepsilon_{max\text{-}substrate}$ (%)

0          130

| Type | Number | Values | Manufacture | Unit Price |
|---|---|---|---|---|
| Resistor | 3 | 2KΩ | Bourns Inc. | $0.04 |
| Resistor | 1 | 100KΩ | Bourns Inc. | $0.1 |
| Resistor | 1 | 10MΩ | Bourns Inc. | $0.074 |
| Capacitor | 4 | 0.1μF | Yageo | $0.19 |
| ADXL335 | 1 | N/A | Analog Devices Inc. | $6.08 |
| MCP9700 | 1 | N/A | Microchip Technology | $0.32 |
| AD8505 | 1 | N/A | Analog Devices Inc. | $1.61 |

FIG. 13

The 1st configuration, FEA model

SELF-HEALABLE, RECYCLABLE, AND RECONFIGURABLE WEARABLE ELECTRONICS DEVICE

CROSS-REFERENCE TO RELATED APPLICATIONS

This application is a 35 U.S.C. § 371 national phase application from, and claims priority to, International Application No. PCT/US2021/058087, filed Nov. 4, 2021, which claims priority under 35 U.S.C. § 119(e) to U.S. Provisional Application No. 63/110,053, filed Nov. 5, 2020, and titled "Self-Healable, Recyclable, and Reconfigurable Wearable Electronics Device." The entire contents of these applications are hereby incorporated by reference herein in their entireties.

STATEMENT REGARDING FEDERALLY SPONSORED RESEARCH

This invention was made with government support under CMMI-1762324 awarded by the National Science Foundation. The government has certain rights in the invention.

BACKGROUND OF THE INVENTION

Stretchable, flexible electronics has attracted tremendous attention in the past 2-3 decades due to the combination of its superior mechanical attributes and electrical performance. This type of electronics can be applied in places that are not accessible by traditional rigid printed circuit boards (PCBs), such as seamless integration with soft tissues and organs of human body for healthcare, bio-inspired curvilinear imagers, and artificial skins that mimic the mechanical and electrical properties of natural skin. Among the exciting applications, wearable electronics represent one of the most important, as it is the most accessible to people, and can be integrated onto the surface of human body to provide many useful functions, including physical activity tracking, health monitoring, drug delivery, human-computer interface, and virtual/augmented reality.

These developments could lead to a future of applying technological advancements to improve the wellbeing of people and society. However, on the other hand, the mass production and application of electronics generate a large amount of electronic waste. By 2021, the total electronic waste is estimated to reach 52.2 million tons, and the majority of the waste cannot be appropriately recycled. The consequence is that a large amount of heavy metals and other hazardous substances have been entering the ecosystem, causing serious environmental problems and human health issues.

SUMMARY

Self-healable, recyclable, and reconfigurable wearable electronics devices, and associated methods of manufacture, are described herein. In one aspect, an electornic device can include a plurality of electronic chip components; a plurality of liquid metal (LM) electrical interconnects coupled to the plurality of electronic chips; and a polyimine film encapsulating the plurality of electronic chip components and the plurality of LM electrical interconnects.

This aspect can include a variety of embodiments. In one embodiment, the polyimine film includes a product of a polymerization reaction between:

(i) a dialdehyde monomer of Formula (I):

Formula (I)

where represents $C_1$-$C_{20}$ alkyl, $C_4$-$C_{10}$ heteroaryl, $C_6$-$C_{12}$ aryl, or $C_3$-$C_9$ cycloalkyl; $R_{10}$ is independently a substituent at each open valence of A; and each instance of $R_{10}$ is independently selected from the group consisting of hydrogen, deuterium, $C_1$-$C_6$ alkyl, $C_2$-$C_6$ alkenyl, $C_1$-$C_6$ alkoxy, hydroxy, halogen, and combinations thereof, (ii) a diamine monomer of Formula (II):

Formula (II)

where $Alk_{20}$, $Alk_{21}$, $Alk_{22}$, $Alk_{23}$, $Alk_{24}$, and $Alk_{25}$ are each independently $C_1$-$C_{12}$ alkyl, which is independently optionally substituted with at least one of deuterium, $C_2$-$C_6$ alkenyl, $C_1$-$C_6$ alkoxy, hydroxy, halogen, and any combination thereof, and a, b, and c are each independently an integer from 0 to 5; and (iii) a triamine monomer of Formula (III):

Formula (III)

where $Alk_{30}$, $Alk_{31}$, $Alk_{32}$, $Alk_{33}$, $Alk_{34}$, and $Alk_{35}$ are each independently $C_1$-$C_{12}$ alkyl, which is independently optionally substituted with deuterium, $C_2$-$C_6$ alkenyl, $C_1$-$C_6$ alkoxy, hydroxy, halogen, and combinations thereof, and d, e, and f are each independently an integer from 0 to 5.

In some cases, the polyimine film includes the product of the polymerization reaction between terephthaldehyde, 3,3'-diamino-N-methyldipropylamine, and tris(2-aminoethyl) amine.

In other embodiments, the polyimine film includes a layer of substrate and an enveloping layer, with the plurality of electronic chip components and the plurality of LM interconnects encapsulated between the layer of substrate and the enveloping layer.

In other embodiments, the electronic device further includes polyimine insulation interlayers disposed between at least two LM electrical interconnects that physically intersect each other.

In other embodiments, the plurality of electronic chip components are each coupled to LM contact pads, wherein the plurality of electronic chip components and the plurality of LM interconnects are coupled via the LM contact pads.

In other embodiments, the plurality of electronic chip components includes a thermal sensor, an accelerometer, an electrocardiogram (ECG) sensor, or any combination thereof.

In other embodiments, the polyimine film and the plurality of LM interconnects are self-healable. In some cases, the polyimine film is self-healable via covalent bonding at perforations or tears within the polyimine film.

In other embodiments, the electronic device is a wearable device.

In other embodiments, a dimension of the plurality of LM interconnects can be stretched to 200% relative to an initial size of the dimension.

In other embodiments, the plurality of LM interconnects comprise eutectic gallium-indium (EGaIn).

In other embodiments, the plurality of electronic chip components includes a thermoelectric generator. In some cases, the thermoelectric generator comprises a plurality of thermoelectric legs. In some cases, the plurality of thermoelectric legs includes a plurality of n-legs and a plurality of p-legs disposed in an alternating pattern along the polyimine film.

In another aspect, a method for manufacturing an electronic device can include disposing a volume of liquid metal (LM) on a polyimine substrate to form a plurality of electrical interconnects; disposing a plurality of electronic chip components onto the polyimine substrate and in contact with the plurality of electrical interconnects; and applying a layer of polyimine onto the polyimine substrate, the plurality of electrical interconnects, and the plurality of electronic chip components.

This aspect can include a variety of embodiments. In one embodiment, the polyimine substrate includes a product of a polymerization reaction between (i) a dialdehyde monomer of Formula (I):

Formula (I)

where represents $C_1$-$C_{20}$ alkyl, $C_4$-$C_{10}$ heteroaryl, $C_6$-$C_{12}$ aryl, or $C_3$-$C_9$ cycloalkyl; $R_{10}$ is independently a substituent at each open valence of A; and each instance of $R_{10}$ is independently selected from the group consisting of hydrogen, deuterium, $C_1$-$C_6$ alkyl, $C_2$-$C_6$ alkenyl, $C_1$-$C_6$ alkoxy, hydroxy, halogen, and any combination thereof, (ii) a diamine monomer of Formula (II):

Formula (II)

where $Alk_{20}$, $Alk_{21}$, $Alk_{22}$, $Alk_{23}$, $Alk_{24}$, and $Alk_{25}$ are each independently $C_1$-$C_{12}$ alkyl, which is independently optionally substituted with deuterium, $C_2$-$C_6$ alkenyl, $C_1$-$C_6$ alkoxy, hydroxy, halogen, and any combination thereof, and a, b, and c are each independently an integer from 0 to 5; and (iii) a triamine monomer of Formula (III):

Formula (III)

where $Alk_{30}$, $Alk_{31}$, $Alk_{32}$, $Alk_{33}$, $Alk_{34}$, and $Alk_{35}$ are each independently $C_1$-$C_{12}$ alkyl, which is independently optionally substituted with deuterium, $C_2$-$C_6$ alkenyl, $C_1$-$C_6$ alkoxy, hydroxy, halogen, and any combination thereof, and d, e, and f are each independently an integer from 0 to 5.

In some cases, the polyimine substrate includes the product of the polymerization reaction between terephthaldehyde, 3,3'-diamino-N-methyldipropylamine, and tris(2-aminoethyl)amine.

In other embodiments, the method further includes curing the layer of polyimine at room temperature.

In other embodiments, the method can further include applying a layer of insulating polyimine over a portion of the electrical interconnects; and applying a second volume of LM on the polyimine substrate to form additional electrical interconnects, wherein a portion of the additional electrical interconnects overlap a portion of the layer of insulating polyimine.

In other embodiments, the method can further include compressing a portion of the layer of polyimine, the polyimine substrate, and/or both; and generating covalent bonds within the portion of the layer of polyimine, the polyimine substrate, and/or both, from the compressing.

In other embodiments, the method can further include introducing a volume of diamine monomers, triamine monomers, or both, to the polyimine substrate and the layer of polyimine; and depolymerizing the polyimine substrate and the layer of polyimine with the volume of diamine monomers, triamine monomers, or both.

In some cases, the volume of diamine monomers, triamine monomers, or both are components of a recycling solution including: (i) a diamine monomer of Formula (II):

Formula (II)

where $Alk_{20}$, $Alk_{21}$, $Alk_{22}$, $Alk_{23}$, $Alk_{24}$, and $Alk_{25}$ are each independently $C_1$-$C_{12}$ alkyl, which is independently optionally substituted with deuterium, $C_2$-$C_6$ alkenyl, $C_1$-$C_6$ alkoxy, hydroxy, halogen, and any combination thereof, and a, b, and c are each independently an integer from 0 to 5; or (ii) a triamine monomer of Formula (III):

Formula (III)

$$H_2N \overbrace{}^{Alk_{31}} \underbrace{}_{O}{}_d \overbrace{}^{Alk_{30}} N \overbrace{}^{Alk_{34}} \underbrace{}_{O}{}_e NH_2;$$

$$H_2N \overbrace{}^{Alk_{33}} \underbrace{}_{O}{}_f Alk_{32}$$

where $Alk_{30}$, $Alk_{31}$, $Alk_{32}$, $Alk_{33}$, $Alk_{34}$, and $Alk_{35}$ are each independently $C_1$-$C_{12}$ alkyl, which is independently optionally substituted with deuterium, $C_2$-$C_6$ alkenyl, $C_1$-$C_6$ alkoxy, hydroxy, halogen, and any combinations thereof, and d, e, and f are each independently an integer from 0 to 5; or a combination of (i) and (ii).

In some cases, the recycling solution includes a volume of 3,3'-diamino-N-methyldipropylamine and a volume of tris (2-aminoethyl)amine dissolved in methanol.

In some cases, a volume of a dialdehyde monomer of Formula (I) is added to the recycling solution including depolymerized polyimine Formula (I)

$$\underset{H}{\overset{O}{\|}}\diagdown \underset{A}{\overset{R_{10}}{\bigcirc}} \diagup \underset{O}{\overset{H}{\|}};$$

where $$\bigcirc\!\!A$$

represents $C_1$-$C_{20}$ alkyl, $C_4$-$C_{10}$ heteroaryl, $C_6$-$C_{12}$ aryl, or $C_3$-$C_9$ cycloalkyl;

$R_{10}$ is independently a substituent at each open valence of A; and each instance of $R_{10}$ is independently selected from the group consisting of hydrogen, which is independently optionally substituted with at least one of deuterium, $C_1$-$C_6$ alkyl, $C_1$-$C_6$ alkenyl, $C_1$-$C_6$ alkoxy, hydroxy, halogen, and any combination thereof.

In some cases, a volume of terephthaldehyde is added to the recycling solution including depolymerized polyimine.

In some cases, the dialdehyde monomer of Formula (I), the diamine monomer of Formula (II), and the triamine monomer of Formula (III) are polymerized to form a recycled polyimine.

In some cases, the method can further include disposing the plurality of electronic chips onto another polyimine substrate and in contact with another plurality of electrical interconnects subsequent to the depolymerization.

In other embodiments, disposing the volume of LM on the polyimine substrate is performed via screen printing or 3-D printing.

BRIEF DESCRIPTION OF THE DRAWINGS

The following detailed description of exemplary embodiments of the invention will be better understood when read in conjunction with the appended drawings. For the purpose of illustrating the invention, non-limiting embodiments are shown in the drawings. It should be understood, however, that the invention is not limited to the precise arrangements and instrumentalities of the embodiments shown in the drawings.

Figures 1A, 1B:
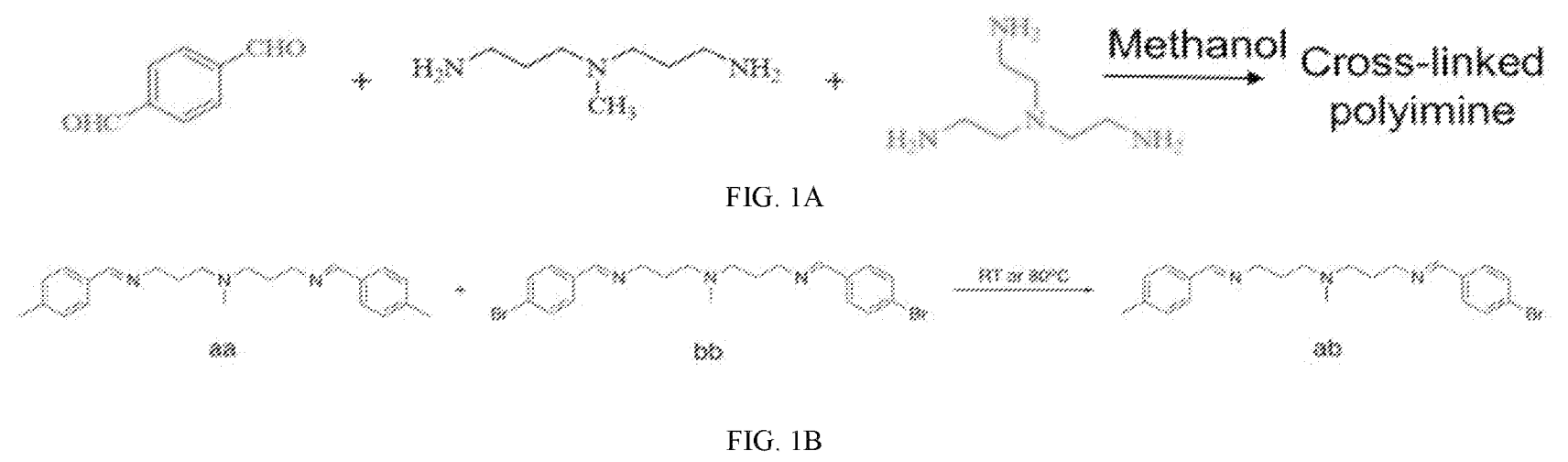

FIGS. 1A-1D depict formation of polyimine and its properties. FIG. 1A: Polymerization of polyimine. FIG. 1B: Model reaction design. Model reaction scheme includes the two reactants aa and bb, and the product ab. $^1$H-NMR of aa, bb, mixture after 5 minutes at room temperature, mixture after 12 hours at room temperature, and mixture after 12 hours at 80° C. FIG. 1C: A new peak corresponding to the N—$CH_3$ around 2.26 indicates the formation of ab. FIG. 1D: FTIR of terephthalaldehyde (black), original polyimine (red), and recycled polyimine (blue).

FIG. 2A: Schematic illustration of the fabrication processes of the multifunctional wearable electronics. FIG. 2B: Motion tracking performance with the multifunctional device worn on the wrist. FIG. 2C: Indoor and outdoor body temperatures acquired using the wearable electronics mounted on the forehead (top), and comparison of measured indoor body temperatures when the wearable electronics is mounted at different locations (bottom). FIG. 2D: Acoustic data acquired using the wearable electronics mounted on the neck. FIG. 2E: ECG data acquired using the wearable electronics when the subject is at rest (top), and after exercising for 13 seconds (middle) and 34 seconds (bottom).

FIG. 3A: Optical image of the liquid metal (LM) circuitry (left), and optical microscope image of two crossing wires insulated using a polyimine interlayer (right). FIG. 3B: Optical image of the cable for connecting the multifunctional wearable electronics with data acquisition equipment. FIG. 3C: Circuit design of the multifunctional wearable electronics, where the single lines mark the crossing wires.

FIG. 4A: Stress-strain curves of the original and self-healed films. FIG. 4B: Resistance data of a polyimine encapsulated LM conductor during self-healing. FIGS. 4C-4D: Optical images of the LM conductor before (FIG. 4C) and after (FIG. 4D) cutting. FIGS. 4E-4G: The required self-healing time of polyimine encapsulated LM conductor with three different applied weights, 90 g (FIG. 4E), 400 g (FIG. 4F), and 1000 g (FIG. 4G). FIG. 4H: The polyimine encapsulated LM conductor after 5 times self-healing. The self-healed films can be stretched by 100%.

FIG. 5A: Schematic illustration of a multifunctional wearable electronic system mounted on the hand, which integrates ECG, acoustic, motion and temperature sensing capabilities. FIG. 5B: Exploded view of the multifunctional wearable electronics. FIG. 5C: Optical images of the multifunctional device being crumpled on skin, bended, twisted and stretched. FIG. 5D: Schematic illustration of the dynamic covalent thermoset polyimine: polymerization and depolymerization, and bond exchange reaction induced bond breaking and reforming. FIG. 5E: Schematic illustration of self-healing and recycling of the multifunctional wearable electronics.

FIG. 6A: Multilayer construction of the multifunctional wearable electronics. FIG. 6B: Optical images of the multifunctional wearable electronics from top view (top), tilted view (bottom left) and back view (bottom right). FIG. 6C: Optical microscope images of the LM connection with the pins of chips at different configurations.

FIG. 7A: Body temperature measurements from the wearable electronics compared with those from a commercial thermometer. FIG. 7B: Acoustic data measured by the wearable electronics (top) and by a PC microphone (bottom).

FIG. 9A: The uniaxial tension stress-strain curve of a polyimine film (left) and the linear fitting at small strain (right). FIG. 9B: The loading and unloading stress-strain curves of the polyimine film. FIG. 9C: Optical microscope image of the cross section of an 100 m-thick polyimine film (left), and the optical image of this film being stretched by 100% (right).

FIGS. 10A and 10B: Resistance data of a polyimine encapsulated LM conductor subjected to rubbing (FIG. 10A) and pressing (FIG. 10B). FIG. 10C: Resistance data of a polyimine encapsulated LM conductor subjected to cyclic 60% uniaxial strain.

FIG. 11A: Optical image of the undeformed device (left), and the FEA model for simulation (right). FIGS. 11B-11D: Optical images and max principal strain contours of the multifunctional wearable electronics being uniaxially stretched by 60% along vertical direction (FIG. 11B), along horizontal direction (FIG. 11C), and being biaxially stretched by 30% (FIG. 11D). FIG. 11E: ECG data of the same device under different deformation modes.

FIG. 13 depicts a list of the chip components used for the multifunctional wearable electronics.

FIG. 14A: Motion data when the multifunctional electronics is subjected to 30% biaxial strain (top left), 60% uniaxial strain along horizontal (top right), and vertical (bottom left) directions. FIG. 14B: Temperature data when the multifunctional electronics is subjected to 30% biaxial strain (top left), 60% uniaxial strain along horizontal (top right), and vertical (bottom left) directions. The measurements using commercial thermometer are also shown for comparison.

FIG. 15A: Optical images of the multifunctional device during self-healing processes. The insets show optical microscope images of the cut at different self-healing stages. FIG. 15B: The ECG data during cutting and self-healing (top), and the ECG data when the device is stretched by 60% after self-healing for 48 hours. FIG. 15C: Optical images of the multifunctional device during recycling processes. FIG. 15D: Motion tracking data measured using the recycled device. FIGS. 15E-15F: Comparison of the stress-strain curves between the original and self-healed multifunctional device (FIG. 15E), and between the original and recycled multifunctional device (FIG. 15F).

FIG. 16A: Sensing performance of the self-healed device: Motion data (top left), Acoustic sensor data (top right), and Temperature measurements (compared with commercial thermometer results, bottom left). FIG. 16B: Sensing performance of the recycled device: ECG signal (top left), Acoustic sensor data (top right), and Temperature data (compared with commercial thermometer results, bottom left).

FIG. 17A: Storage modulus, loss modulus and tan δ of polyimine versus temperature. FIG. 17B: Relaxation test of polyimine at different temperatures.

FIG. 18A: The first (left), second (middle), and third (right) configurations of the multifunctional electronics in its flat states (top), and when its worn on the wrist, the ankle, and the neck (bottom). FIGS. 18B-18D: The FEA model (FIG. 18B) and the max principal strain contours of the multifunctional device when it's stretched by 45% in the second configuration (FIG. 18C), and when it's stretched by 112% in the third configuration (FIG. 18D). FIG. 18E: ECG data obtained using the multifunctional wearable device in its first configuration (on the wrist). FIG. 18F: Motion tracking data obtained using the same device in its second configuration (on the ankle). FIG. 18G: Acoustic data obtained using the same device in its third configuration (on the neck). FIG. 18H: Comparison of the body temperature measurements using the same wearable device in its first (on the wrist), second (on the ankle), and third (on the neck) configurations.

FIG. 19A: ECG signals of the multifunctional wearable electronics in its second (left) and third (right) configurations. FIG. 19B: Motion data of the multifunctional wearable electronics in its first (left) and third (right) configurations. FIG. 19C: Acoustic sensor data of the multifunctional wearable electronics in its first (left) and second (right) configurations.

FIG. 20A: a schematic illustration of the configuration of an RHS-TEG. FIG. 20B: photos showing the layout of an RHS-TEG in bent (up) and flat (down) states. FIG. 20C: photos of an RHS-TEG when it is rolled, twisted, worn on an arm, and stretched. FIG. 20D: fabrication process of an RHS-TEG. FIG. 20E: Schematic illustration of the healing and recycling processes of an RHS-TEG.

FIG. 21A: Thermoelectric (TE) power generation performance of an RHS-TEG at various temperature differences. FIG. 21B: variation of output Seebeck voltage and maximum power with temperature difference.

FIGS. 21C and 21D: comparison of the output voltage (FIG. 21C) and power (FIG. 21D) versus normalized power density between various forms of TEGs.

FIG. 22A: optical image of an original RHS-TEG and its output performance at different ΔT. FIG. 22B: Optical image of the cut broken LM electrode and a magnified image around the crack. Real time measurement of internal resistance of the RHS-TEG during the cutting and healing process. FIG. 22C: optical images of the damaged LM electrode after 24 hours healing, and the output performance of the healed RHS-TEG at various ΔT. FIG. 22D: optical images showing the recycling process of the RHS-TEG, and the output performance of the recycled RHS-TEG at various ΔT. FIG. 22E: comparison of output performances between the original RHS-TEG, and the healed and recycled TEG at ΔT=20K.

FIG. 23A: stress-strain curve of the TEG. The inset shows a picture of the broken device. FIG. 23B: optical images of an RHS-TEG in the undeformed states (up) and when stretched by 20% (down). FIG. 23C: strain distribution in the device under 20% strain obtained from finite element simulation. FIG. 23D: real-time internal resistance during 20% stretching release cycles. FIG. 23E: TE performance comparison of the RHS-TEG between the undeformed state and deformed state subjected to 20% tensile strain. FIG. 23F: internal resistance of the TEG during the cyclic bending test. The bending radius is 10 mm.

DEFINITIONS

Figure 1C:
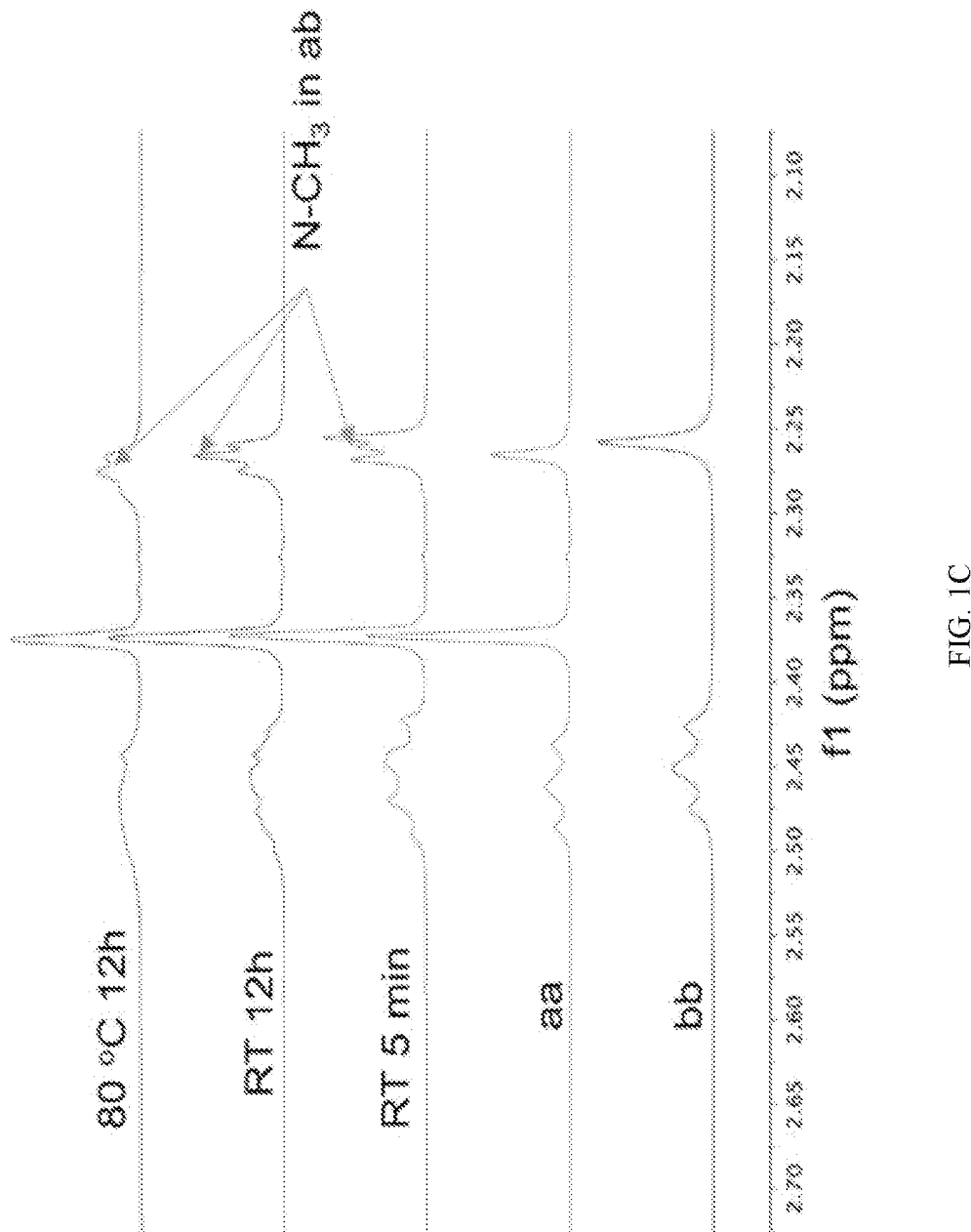
Figure 1D:
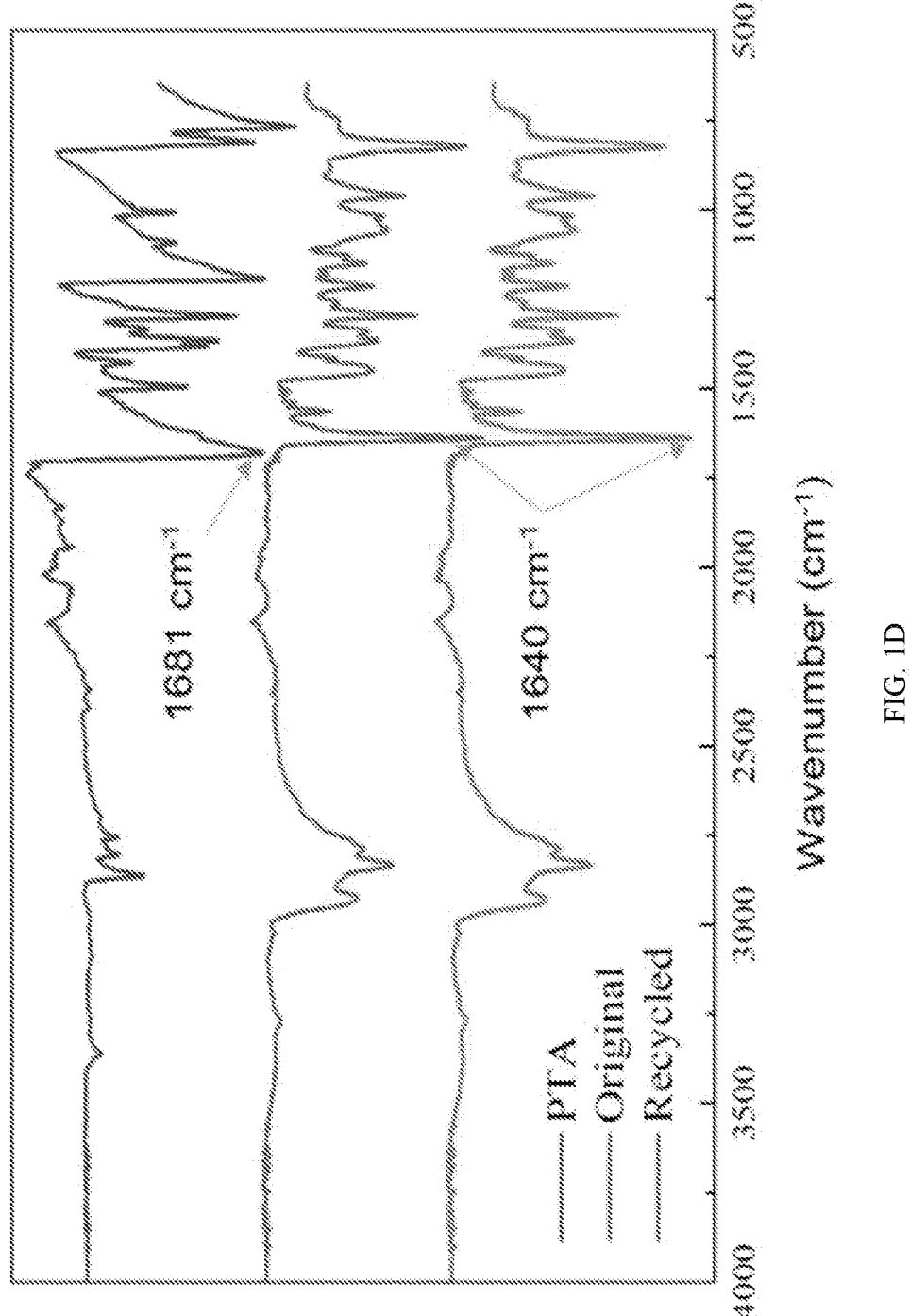

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, selected methods and materials are described.

In this document, the terms "a," "an," or "the" are used to include one or more than one unless the context clearly dictates otherwise. The term "or" is used to refer to a nonexclusive "or" unless otherwise indicated. The statement "at least one of A and B" or "at least one of A or B" has the same meaning as "A, B, or A and B." "About" as used herein when referring to a measurable value such as an amount, a temporal duration, and the like, is meant to encompass variations of 20% or ±10%, in certain embodiments±5%, in certain embodiments±1%, in certain embodiments±0.1% from the specified value, as such variations are appropriate to perform the disclosed methods.

As used herein, the term "alkenyl," employed alone or in combination with other terms, means, unless otherwise stated, a stable monounsaturated or diunsaturated straight chain or branched chain hydrocarbon group having the stated number of carbon atoms. Examples include vinyl, propenyl (or allyl), crotyl, isopentenyl, butadienyl, 1,3-pentadienyl, 1,4-pentadienyl, and the higher homologs and isomers. A functional group representing an alkene is exemplified by $—CH_2—CH=CH_2$.

As used herein, the term "alkoxy" employed alone or in combination with other terms means, unless otherwise stated, an alkyl group having the designated number of carbon atoms, as defined elsewhere herein, connected to the rest of the molecule via an oxygen atom, such as, for example, methoxy, ethoxy, 1-propoxy, 2-propoxy (or isopropoxy) and the higher homologs and isomers. A specific example is $(C_1-C_3)$alkoxy, such as, but not limited to, ethoxy and methoxy.

As used herein, the term "alkyl" by itself or as part of another substituent means, unless otherwise stated, a straight or branched chain hydrocarbon having the number of carbon atoms designated (i.e., $C_1-C_{10}$ means one to ten carbon atoms) and includes straight, branched chain, or cyclic substituent groups. Examples include methyl, ethyl, propyl, isopropyl, butyl, isobutyl, tert-butyl, pentyl, neopentyl, hexyl, and cyclopropylmethyl. A specific embodiment is $(C_1-C_6)$alkyl, such as, but not limited to, ethyl, methyl, isopropyl, isobutyl, n-pentyl, n-hexyl, and cyclopropylmethyl.

As used herein, the term "aromatic" refers to a carbocycle or heterocycle with one or more polyunsaturated rings and having aromatic character, i.e., having (4n+2) delocalized π (pi) electrons, where 'n' is an integer.

As used herein, the term "aryl" employed alone or in combination with other terms means, unless otherwise stated, a carbocyclic aromatic system containing one or more rings (typically one, two or three rings) wherein such rings may be attached together in a pendent manner, such as a biphenyl, or may be fused, such as naphthalene. Examples include phenyl, anthracyl and naphthyl. Aryl groups also include, for example, phenyl or naphthyl rings fused with one or more saturated or partially saturated carbon rings (e.g., bicyclo[4.2.0]octa-1,3,5-trienyl, or indanyl), which can be substituted at one or more carbon atoms of the aromatic and/or saturated or partially saturated rings.

As used herein, the term "cycloalkyl" by itself or as part of another substituent refers to, unless otherwise stated, a cyclic chain hydrocarbon having the number of carbon atoms designated (i.e., $C_3-C_6$ refers to a cyclic group comprising a ring group consisting of three to six carbon atoms) and includes straight, branched chain or cyclic substituent groups. Examples of $(C_3-C_6)$cycloalkyl groups are cyclopropyl, cyclobutyl, cyclopentyl and cyclohexyl. Cycloalkyl rings can be optionally substituted. Non-limiting examples of cycloalkyl groups include: cyclopropyl, 2-methyl-cyclopropyl, cyclopropenyl, cyclobutyl, 2,3-dihydroxycyclobutyl, cyclobutenyl, cyclopentyl, cyclopentenyl, cyclopentadienyl, cyclohexyl, cyclohexenyl, cycloheptyl, cyclooctanyl, decalinyl, 2,5-dimethylcyclopentyl, 3,5-dichlorocyclohexyl, 4-hydroxycyclohexyl, 3,3,5-trimethylcyclohex-1-yl, octahydropentalenyl, octahydro-1H-indenyl, 3a,4,5,6,7,7a-hexahydro-3H-inden-4-yl, decahydroazulenyl; bicyclo[6.2.0]decanyl, decahydronaphthalenyl, and dodecahydro-1H-fluorenyl. The term "cycloalkyl" also includes bicyclic hydrocarbon rings, non-limiting examples of which include, bicyclo[2.1.1]hexanyl, bicyclo[2.2.1]heptanyl, bicyclo[3.1.1]heptanyl, 1,3-dimethyl[2.2.1]heptan-2-yl, bicyclo[2.2.2]octanyl, and bicyclo[3.3.3]undecanyl.

As used herein, the term "halo" or "halogen" alone or as part of another substituent refers to, unless otherwise stated, a fluorine, chlorine, bromine, or iodine atom.

As used herein, the term "heteroaryl" or "heteroaromatic" refers to a heterocycle having aromatic character. A polycyclic heteroaryl may include one or more rings that are partially saturated. Examples include tetrahydroquinoline and 2,3-dihydrobenzofuryl.

As used herein, the term "heterocycle" or "heterocyclyl" or "heterocyclic" by itself or as part of another substituent refers to, unless otherwise stated, an unsubstituted or substituted, stable, mono- or multi-cyclic heterocyclic ring system that includes carbon atoms and at least one heteroatom selected from the group consisting of N, O, and S, and wherein the nitrogen and sulfur heteroatoms may be optionally oxidized, and the nitrogen atom may be optionally quaternized. The heterocyclic system may be attached, unless otherwise stated, at any heteroatom or carbon atom that affords a stable structure. A heterocycle may be aromatic or non-aromatic in nature. In certain embodiments, the heterocycle is a heteroaryl.

Examples of non-aromatic heterocycles include monocyclic groups such as aziridine, oxirane, thiirane, azetidine, oxetane, thietane, pyrrolidine, pyrroline, imidazoline, pyrazolidine, dioxolane, sulfolane, 2,3-dihydrofuran, 2,5-dihydrofuran, tetrahydrofuran, thiophane, piperidine, 1,2,3,6-tetrahydropyridine, 1,4-dihydropyridine, piperazine, morpholine, thiomorpholine, pyran, 2,3-dihydropyran, tetrahydropyran, 1,4-dioxane, 1,3-dioxane, homopiperazine, homopiperidine, 1,3-dioxepane, 4,7-dihydro-1,3-dioxepin, and hexamethyleneoxide.

Examples of heteroaryl groups include pyridyl, pyrazinyl, pyrimidinyl (such as, but not limited to, 2- and 4-pyrimidinyl), pyridazinyl, thienyl, furyl, pyrrolyl, imidazolyl, thiazolyl, oxazolyl, pyrazolyl, isothiazolyl, 1,2,3-triazolyl, 1,2,4-triazolyl, 1,3,4-triazolyl, tetrazolyl, 1,2,3-thiadiazolyl, 1,2, 3-oxadiazolyl, 1,3,4-thiadiazolyl, and 1,3,4-oxadiazolyl.

Examples of polycyclic heterocycles include indolyl (such as, but not limited to, 3-, 4-, 5-, 6- and 7-indolyl), indolinyl, quinolyl, tetrahydroquinolyl, isoquinolyl (such as, but not limited to, 1- and 5-isoquinolyl), 1,2,3,4-tetrahydroisoquinolyl, cinnolinyl, quinoxalinyl (such as, but not limited to, 2- and 5-quinoxalinyl), quinazolinyl, phthalazinyl, 1,8-naphthyridinyl, 1,4-benzodioxanyl, coumarin, dihydrocoumarin, 1,5-naphthyridinyl, benzofuryl (such as, but not limited to, 3-, 4-, 5-, 6- and 7-benzofuryl), 2,3-dihydrobenzofuryl, 1,2-benzisoxazolyl, benzothienyl (such as, but not limited to, 3-, 4-, 5-, 6-, and 7-benzothienyl), benzoxazolyl, benzothiazolyl (such as, but not limited to, 2-benzothiazolyl and 5-benzothiazolyl), purinyl, benzimidazolyl, benztriazolyl, thioxanthinyl, carbazolyl, carbolinyl, acridinyl, pyrrolizidinyl, and quinolizidinyl.

The aforementioned listing of heterocyclyl and heteroaryl moieties is intended to be representative and not limiting.

As used herein, the term "substituted" refers to that an atom or group of atoms has replaced hydrogen as the substituent attached to another group.

As used herein, the term "substituted alkyl," "substituted cycloalkyl," "substituted alkenyl," or "substituted alkynyl" refers to alkyl, cycloalkyl, alkenyl, or alkynyl, as defined elsewhere herein, substituted by one, two or three substituents independently selected from the group consisting of halogen, —OH, alkoxy, tetrahydro-2-H-pyranyl, —NH$_2$, —NH(C$_1$-C$_6$ alkyl), —N(C$_1$-C$_6$ alkyl)$_2$, 1-methyl-imidazol-2-yl, pyridin-2-yl, pyridin-3-yl, pyridin-4-yl, —C(=O)OH, —C(=O)O(C$_1$-C$_6$)alkyl, trifluoromethyl, —C≡N, —C(=O)NH$_2$, —C(=O)NH(C$_1$-C$_6$)alkyl, —C(=O)N ((C$_1$-C$_6$)alkyl)$_2$, —SO$_2$NH$_2$, —SO$_2$NH(C$_1$-C$_6$ alkyl), —SO$_2$N(C$_1$-C$_6$ alkyl)$_2$, —C(=NH)NH$_2$, and —NO$_2$, in certain embodiments containing one or two substituents independently selected from halogen, —OH, alkoxy, —NH$_2$, trifluoromethyl, —N(CH$_3$)$_2$, and —C(=O)OH, in certain embodiments independently selected from halogen, alkoxy and —OH. Examples of substituted alkyls include, but are not limited to, 2,2-difluoropropyl, 2-carboxycyclopentyl and 3-chloropropyl.

For aryl, aryl-(C$_1$-C$_3$)alkyl and heterocyclyl groups, the term "substituted" as applied to the rings of these groups refers to any level of substitution, namely mono-, di-, tri-, tetra-, or penta-substitution, where such substitution is permitted. The substituents are independently selected, and substitution may be at any chemically accessible position. In certain embodiments, the substituents vary in number between one and four. In other embodiments, the substituents vary in number between one and three. In yet another embodiment, the substituents vary in number between one and two. In yet other embodiments, the substituents are independently selected from the group consisting of C$_1$-C$_6$ alkyl, —OH, C$_1$-C$_6$ alkoxy, halo, cyano, amino, acetamido and nitro. As used herein, where a substituent is an alkyl or alkoxy group, the carbon chain may be branched, straight or cyclic.

Whenever a term or either of their prefix roots appear in a name of a substituent the name is to be interpreted as including those limitations provided herein. For example, whenever the term "alkyl" or "aryl" or either of their prefix roots appear in a name of a substituent (e.g., arylalkyl, alkylamino) the name is to be interpreted as including those limitations given elsewhere herein for "alkyl" and "aryl" respectively.

In certain embodiments, substituents of compounds are disclosed in groups or in ranges. It is specifically intended that the description include each and every individual subcombination of the members of such groups and ranges. For example, the term "C$_{1-6}$ alkyl" is specifically intended to individually disclose C$_1$, C$_2$, C$_3$, C$_4$, C$_5$, C$_6$, C$_1$-C$_6$, C$_1$-C$_5$, C$_1$-C$_4$, C$_1$-C$_3$, C$_1$-C$_2$, C$_2$-C$_6$, C$_2$-C$_5$, C$_2$-C$_4$, C$_2$-C$_3$, C$_3$-C$_6$, C$_3$-C$_5$, C$_3$-C$_4$, C$_4$-C$_6$, C$_4$-C$_5$, and C$_5$-C$_6$ alkyl.

Ranges: throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

DETAILED DESCRIPTION

Polymerizable Composition

In one aspect, the present disclosure provides a polymerizable composition including a dialdehyde monomer, a diamine monomer, and a triamine monomer.

In some embodiments, the dialdehyde monomer is a compound of Formula (I):

Formula (I)

wherein

represents a C$_1$-C$_{20}$ alkyl, C$_4$-C$_{10}$ heteroaryl, a C$_6$-C$_{12}$ aryl, or a C$_3$-C$_9$ cycloalkyl;

R$_{10}$ is independently a substituent at each open valence of A; and each instance of R$_{10}$ is independently selected from the group consisting of hydrogen, deuterium, C$_1$-C$_6$ alkyl, C$_1$-C$_6$ alkenyl, C$_1$-C$_6$ alkoxy, hydroxy, halogen, and combinations thereof.

In some embodiments,

is a $C_6$-$C_{12}$ aryl. In some embodiments,

is benzene. In some embodiments, each instance of $R_{10}$ is hydrogen. In some embodiments, the compound of Formula (I) is terephthaldehyde.

In some embodiments the diamine monomer is a compound of Formula (II):

Formula (II)

$$H_2N \left( Alk_{21} \diagdown O \right)_a Alk_{20} \diagdown N \diagup Alk_{24} \left( O \diagup Alk_{25} \right)_b NH_2,$$
$$\left( Alk_{23} \diagdown O \right)_c Alk_{22}$$

wherein $Alk_{20}$, $Alk_{21}$, $Alk_{22}$, $Alk_{23}$, $Alk_{24}$, and $Alk_{25}$ are each independently a $C_1$-$C_{12}$ alkyl, optionally substituted with deuterium, $C_1$-$C_6$ alkenyl, $C_1$-$C_6$ alkoxy, hydroxy, halogen, and combinations thereof, and a, b, and c are each independently an integer from 0 to 5.

In some embodiments, $Alk_{20}$ and $Alk_{24}$ each represent an unsubstituted $C_3$ alkyl. In some embodiments, $Alk_{20}$ and $Alk_{24}$ each represent —$(CH_2)_3$—. In some embodiments, $Alk_{22}$ represents an unsubstituted $C_1$ alkyl. In some embodiments, $Alk_{22}$ represents —$CH_3$. In some embodiments, a, b, and c are each 0. In some embodiments, the compound of Formula (II) is 3,3'-diamino-N-methyldipropylamine.

In some embodiments, the triamine monomer is a compound of Formula (III):

Formula (III)

$$H_2N \left( Alk_{31} \diagdown O \right)_d Alk_{30} \diagdown N \diagup Alk_{34} \left( O \diagup Alk_{35} \right)_e NH_2,$$
$$H_2N \left( Alk_{33} \diagdown O \right)_f Alk_{32}$$

$Alk_{30}$, $Alk_{31}$, $Alk_{32}$, $Alk_{33}$, $Alk_{34}$, and $Alk_{35}$ are each independently a $C_1$-$C_{12}$ alkyl, optionally substituted with deuterium, $C_1$-$C_6$ alkenyl, $C_1$-$C_6$ alkoxy, hydroxy, halogen, and combinations thereof; and d, e, and f are each independently an integer from 0 to 5.

In some embodiments, $Alk_{30}$, and $Alk_{32}$, and $Alk_{34}$ each represent an unsubstituted $C_2$ alkyl. In some embodiments, $Alk_{30}$, and $Alk_{32}$, and $Alk_{34}$ each represent —$(CH_2)_2$—. In some embodiments, d, e, and f are each 0. In some embodiments, the compound of Formula (III) is tris(2-aminoethyl) amine.

In some embodiments, the composition includes a ratio of between about 1:1 to about 1:0.4 mmol of dialdehyde monomer to diamine monomer. In some embodiments, the composition includes a ratio of between about 1:1 to about 1:0.6 mmol of dialdehyde monomer to diamine monomer. In some embodiments, the composition includes a ratio of between about 1:1 to about 1:0.8 mmol of dialdehyde monomer to diamine monomer. In some embodiments, the composition includes a ratio of between about 1:0.7 to about 1:0.05 mmol of dialdehyde monomer to triamine monomer. In some embodiments, the composition includes a ratio of between about 1:0.5 to about 1:0.05 mmol of dialdehyde monomer to triamine monomer. In some embodiments, the composition includes a ratio of between about 1:0.4 to about 1:0.05 mmol of dialdehyde monomer to triamine monomer. In some embodiments, the composition includes a ratio of between about 1:0.3 to about 1:0.1 mmol of dialdehyde monomer to triamine monomer. In some embodiments, the composition includes a ratio of between about 1:0.7 to about 1:0.05 mmol of diamine monomer to triamine monomer. In some embodiments, the composition includes a ratio of between about 1:0.5 to about 1:0.05 mmol of diamine monomer to triamine monomer. In some embodiments, the composition includes a ratio of between about 1:0.4 to about 1:0.05 mmol of diamine monomer to triamine monomer. In some embodiments, the composition includes a ratio of between about 1:0.3 to about 1:0.1 mmol of diamine monomer to triamine monomer. In some embodiments, the composition includes a ratio of between about 1:1 to about 1:0.8 mmol of terephthaldehyde to 3,3'-diamino-N-methyldipropylamine, a ratio of between about 1:0.3 to about 1:0.1 mmol of terephthaldehyde to tris(2-aminoethyl)amine, and a ratio of between about 1:0.3 to about 1:0.1 mmol of 3,3'-diamino-N-methyldipropylamine to tris(2-aminoethyl) amine. In some cases, in lieu of a dialdehyde monomer, the composition can include a trialdehyde monomer.

In some embodiments, the polymerizable composition includes an organic solvent. Exemplary organic solvents include, but are not limited to, diethylether, dichloromethane, chloroform, benzene, toluene, methanol, ethanol, isopronanol, n-butanol, pentanes, hexanes, acetone, acetonitrile, DMF, DMSO, ethyl acetate, and combinations thereof. In some embodiments, the polymerizable composition includes methanol.

In some embodiments, the polymerizable composition is polymerized to form a polyimine. In some embodiments, the polyimine is synthesized by stirring components of the polymerizable composition described elsewhere herein in an organic solvent described elsewhere herein. In some embodiments, the polyimine is synthesized by stirring terephthaldehyde, 3,3'-diamino-N-methyldipropylamine, and tris(2-aminoethyl)amine in methanol.

Polyimine Composition

In another aspect, the present disclosure relates to a polyimine formed from the polymerizable composition described elsewhere herein. In some embodiments, the polyimine is a crosslinked polyimine. In some embodiments, the polyimine crosslinks are based on the dynamic covalent chemistry principle where the polyimine undergoes an imine bond exchange reaction. In some embodiments, the imine bond exchange reaction occurs at room temperature. In other embodiments, the imine bond exchange reaction occurs at elevated temperatures (e.g., temperatures above room temperature).

In some embodiments, the solvent used during the polymerization reaction is removed from the resulting polyimine and a polyimine film is formed. In some embodiments, the film is formed by heat pressing the polyimine at an elevated temperature under pressure. In some embodiments, the polyimine film is formed by heat pressing the polyimine at about 80° C. and about 8.5 kPa for about 12 hours. Although not wishing to be limited by theory, it is believed that the imine bond exchange reaction that the polyimine undergoes lead to effective stress relaxation. In some embodiments, the effective stress relaxation leads to excellent malleability and reprocessibility. Although not wishing to be limited by theory, it is believed that the imine bond exchange reaction can occur at the interface of two polyimine films (e.g. at the interface of a cut in a previously intact polyimine film), producing new covalent boding across the interface and therefore leading to interfacial bonding or healing.

In some embodiments, the polyimine undergoes a transimination reaction when excessive diamine and/or triamine monomers are introduced. Therefore, in some embodiments, the polyimine depolymerizes into oligomers and/or monomers that are soluble in an organic solvent described elsewhere herein. In some embodimentss, the oligomers and/or monomers formed in the depolymerization reaction can be used in repeated polymerization reactions to reform the polyimine. In some embodiments, the polyimine can be 100% recycled to form a new polyimine that has substantially identical properties as a "fresh" polyimine which was not made from recycled polymerizable monomers. In some embodiments, an amount of the dialdehyde monomer is added to the oligomers and/or monomers formed from the depolymerization reaction in order to have the desired ratio between monomers for polymerization. In some embodiments, the desired ratio of dialdehyde monomer to diamine monomer and triamine monomer is a ratio described elsewhere herein.

Electronics Device

Further disclosed herein is an electronic device capable of performing as a wearable device. The electronic device can include polyimine layers 105 (e.g., 105-a and 105-b of FIG. 2) discussed in more detail above. The polyimine layers can act as enveloping layers for embedded electronic chips. The electronic chips 120 can include a variety of chips having the dimensions sufficient to be encompassed by polyimine layers. For example, the electronic chips can include a temperature sensor, an electrocardiogram (ECG) sensor, an accelerometer, a battery, transceivers, resistors, capacitors, inductors, telecommunication chips (e.g., Bluetooth, near-field communication, Wifi), LEDs, photodetectors, memory, CPUs, strain sensors, flow sensors, pressure sensors, proximity sensors, humidity sensors, blood pressure sensors, glucose sensors, sweat sensors, UV sensors, blood oxygen sensors, and the like. The electronic chips can be coupled (e.g., for electronic communication) to one another via a set of Liquid metal (LM) interconnects. The LM interconnects can, for example, include gallium-indium (EGaIn), although other types of LMs can be used as well. In some cases, the electronic chip components can also include thermoelectric legs or modules (e.g., n-legs 120-a and p-legs 120-b of FIG. 20A), such as the embodiments described in Example 2 below.

The polyimine film 105 can stretch, twist, and compress, allowing for a flexible electronics device. For example, the polyimine film 105 can incur a uniaxial straining of up to 60%, a cyclic strain of up to 60%, biaxial straining of up to 30%, and the like, without damaging the polyimine film, or the electronic chip components.

Further, the LM interconnects 115 can also incur strains while maintaining the coupling between electronic chip components. For example, EGaIn can stretch up to 200% of an initial dimension while still maintaining an electrical connection between electronic chip components. The electronic device described herein can thus be physically manipulated for an intended use (e.g., for wrapping around a user's arm, and the like) without breaking electrical connections between the electronic chip components 120.

The electronic device can also self-heal. For example, the polyimine layers 105 can experience covalent bond exchanging between the layers, or tears in the layers, when physically contacted with one another. This can lead to effective interfacial healing of the polyimine layers. Additional force at the repair site can further expedite the repair process. The polyimine layers 105 can thus provide repairable protection to the integrated electronic chip components 120.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the compounds of the present invention and practice the claimed methods. The following working examples therefore, specifically point out the preferred embodiments of the present invention, and are not to be construed as limiting in any way the remainder of the disclosure.

Example 1: Heterogeneous Integration of Rigid, Soft and Liquid Materials for Self-Healable, Recyclable, and Reconfigurable Wearable Electronics Materials and Methods
Polyimine Synthesis To synthesize polyimine, terephthalaldehyde (1.5 g, 11.18 mmol), 3,3'-Diamino-N-methyldipropylamine (1.251 g, 8.61 mmol), and tris(2-aminoethyl)amine (0.252 g, 1.72 mmol) were mixed in methanol (20 mL), as shown in FIG. 1A. The solution was vigorously stirred and poured into a silicon paper mold, followed by evaporating methanol in a fume hood for 12 hours at room temperature and heat pressing at 80° C. and 8.5 kPa for 12 hours. For self-healable polyimine films, the solution was placed in fume hood for evaporating methanol for 2 hours at room temperature.

Chemical Characterization of Polyimine

To demonstrate the imine bond exchange reactions, compounds aa and bb were mixed in 1:1 mole ratio, and the model reaction was run at room temperature or 80° C., as shown in FIG. 1B. $^1$H-NMR characterization was conducted in $CDCl_3$ after mixing under room temperature for 5 minutes, 12 hours and at 80° C. for 12 hours. The only distinguishable signal is the H on N-Me, 2.25 ppm vs. 2.27 ppm, due to the similarity of the structures. A new signal corresponding to the proton nuclei in the N-Me moiety of the target product ab showed up after mixing for only 5 minutes. The 12-hour reactions, at room temperature or 80° C., showed similar ratios of the three species, indicating an equilibrium reached. These results clearly showed the imine bond exchange reaction is efficient at both room temperature and 80° C.

The FTIR spectra of terephthaldehyde, original polyimine and recycled polyimine are shown in FIG. 1C. The disappearance of C=O stretch at 1681 cm$^{-1}$ and appearance of C=N stretch at 1640 cm$^{-1}$ in both original and recycled polyimine suggest a full conversion of aldehyde into imine linkage. Also, the high similarity between the FTIR spectra of the original polyimine and recycled polyimine support the notion that these two films are chemically identical.

LM Preparation

The LM used in this study is eutectic metal alloy consisting of gallium (75%) and indium (25%) (EGaIn, Sigma-Aldrich). Its melting temperature is 15.7° C., and therefore maintains liquid state at room temperature. The resistivity of EGaIn is $29.4 \times 10^{-6}$ $\Omega \cdot$cm.

Fabrication of Multifunctional Wearable Electronics

A silicon paper mask (e.g., mask 110 of FIG. 2A), made by laser cutting (Lide laser cutting machine) a 0.2 mm thick silicon paper film (Ruspepa non-stick silicone paper), was laminated over a polyimine film. Then LM was screen printed over the silicon paper mask using a razor blade. The liquid metal solidified after been cooled down to below 15.7° C. Removing the silicon paper mask left solidified LM traces on the polyimine film. After the temperature was raised to room temperature, the chip components were pick-and-placed on the pre-defined contact pads. The placement accuracy was ensured using an optical microscope. Pouring polyimine solution on top and curing at room temperature for 48 hours, the LM circuitry and chip components were encapsulated. For intersections, insulating polyimine was introduced to separate two crossing LM interconnects (interconnects 125 of FIG. 2A and FIG. 3A). The fabricated multifunctional electronics was then connected to external power source and data acquisition system using copper wires (FIG. 3B).

Self-Healing and Recycling Process

To heal the broken polyimine device, an 1 kg weight was used to press polyimine for 13 minutes at room temperature to ensure good contact at the interface. Then the weight was removed, and the device was placed in a chemical hood for 48 hours.

The recycling solution was prepared by mixing 3,3'-Diamino-N-methyldipropylamine (0.417 g, 2.87 mmol) and tris(2-aminoethyl)amine (0.084 g, 0.574 mmol) in methanol. The device was then soaked in the recycling solution for 47 minutes to depolymerize the polyimine network into oligomers/monomers that can dissolve in methanol. After separating the LM and the chip components from the polymer solution, terephthalaldehyde (0.5 g, 3.72 mmol) was added into the polymer solution for synthesis of a new polyimine film. Diluted hydrochloric acid was used to remove the oxide layer on the surface of the LM, leading to congregation of LM. Then both the LM and chip components can be cleaned using methanol.

Tension Mechanical Testing

Multifunctional wearable devices were tested using an Instron mechanical testing system, under quasi-static tension conditions. For multifunctional sensing devices, the samples were cut into rectangular ($40 \times 55$ mm$^2$) shapes.

Self-Healing Test and Mechanical Characterization

Figures 4A, 4B:
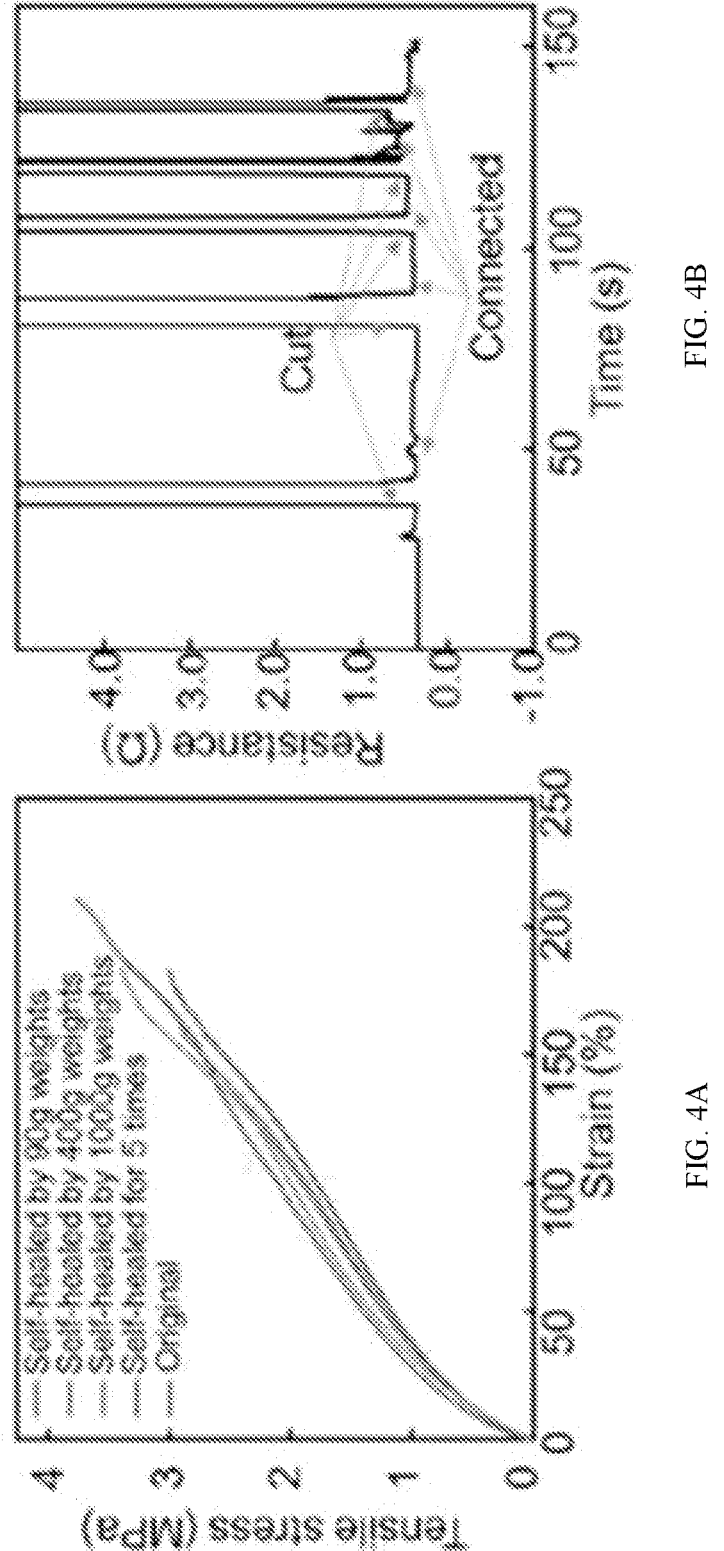
FIGS. 4A-4H compare the original film to self-healed films.
Figure 4D:
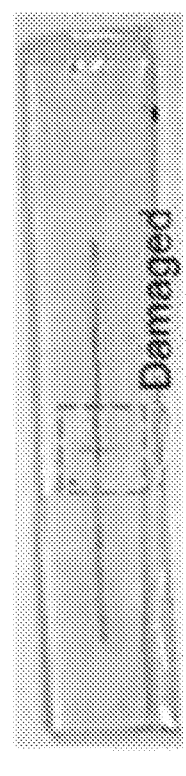
Figure 4C:
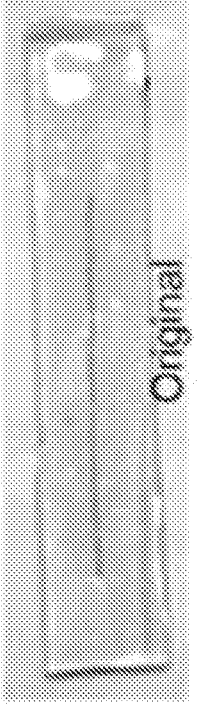
Figure 4E:
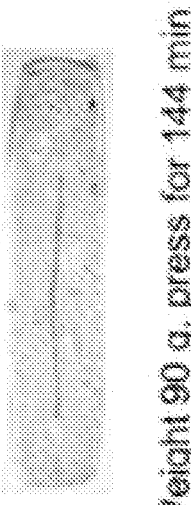
Figure 4F:
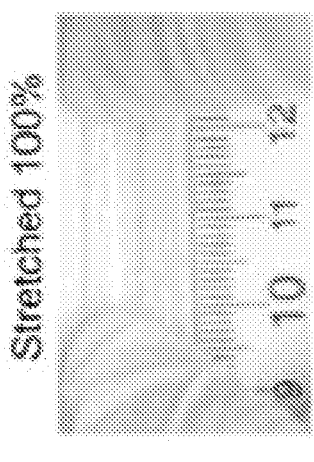
Figure 4F:
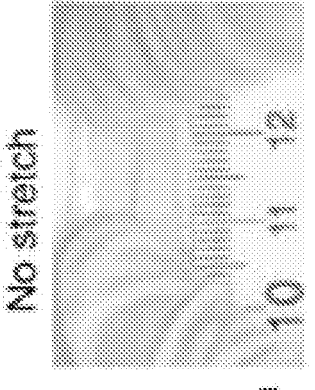
Figure 4F:
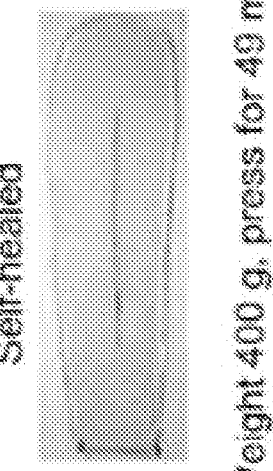
Figure 4G:
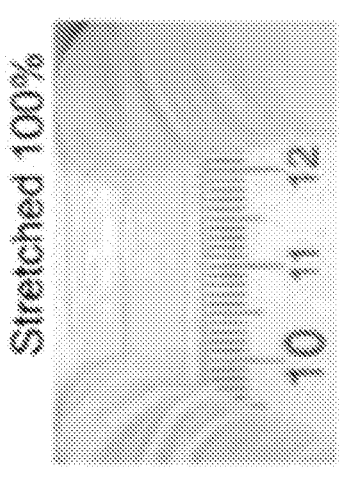
Figure 4G:
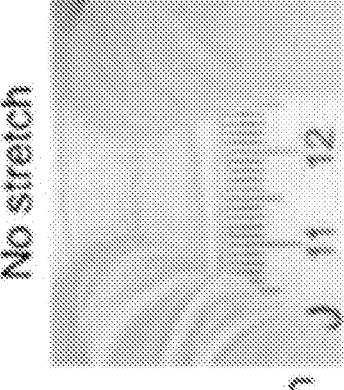
Figure 4G:
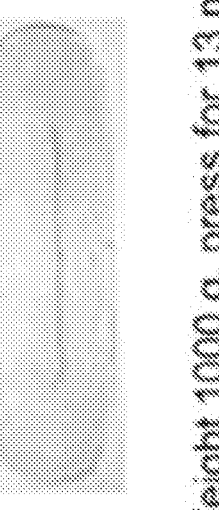
Figure 4H:
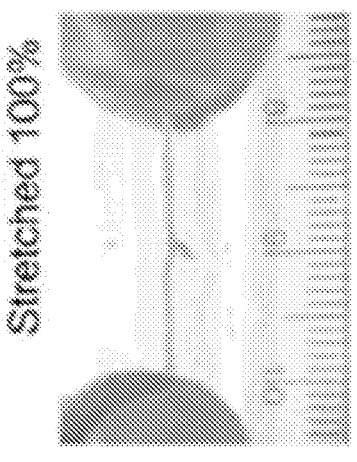
Figure 4H:
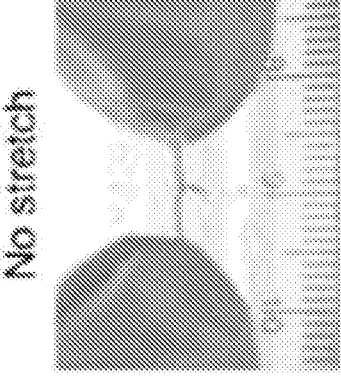
Figure 4H:
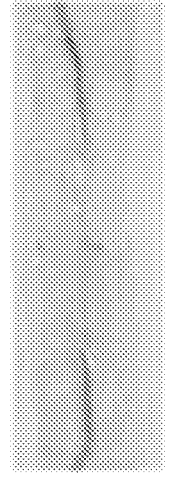

The influence of applied weight on the self-healing time of the polyimine encapsulated LM wire was investigated at room temperature, as shown in FIGS. 4C-4G. It shows that the required self-healing time for polyimine encapsulated LM wire decreases with the increase of applied weight. For example, the required self-healing time with a 90 g weight was 144 minutes, which drastically decreased to 13 minutes with a 1000 g weight. To further demonstrate the self-healing performance, the cutting and self-healing process at the same location of a polyimine encapsulated LM conductor was repeated for 5 times. As shown in FIG. 4B, the resistance recovers to the original value after 5 times cutting and self-healing. As demonstrated in FIG. 4H, the LM conductor can still be stretched by 100% after 5 times self-healing. The stress-strain curve of the self-healed device was cut to rectangular with scissors ($10 \times 50$ mm$^2$) then measured using an Instron mechanical testing system (FIG. 4A).

Isolation of Wires at Intersection

Figure 3A:
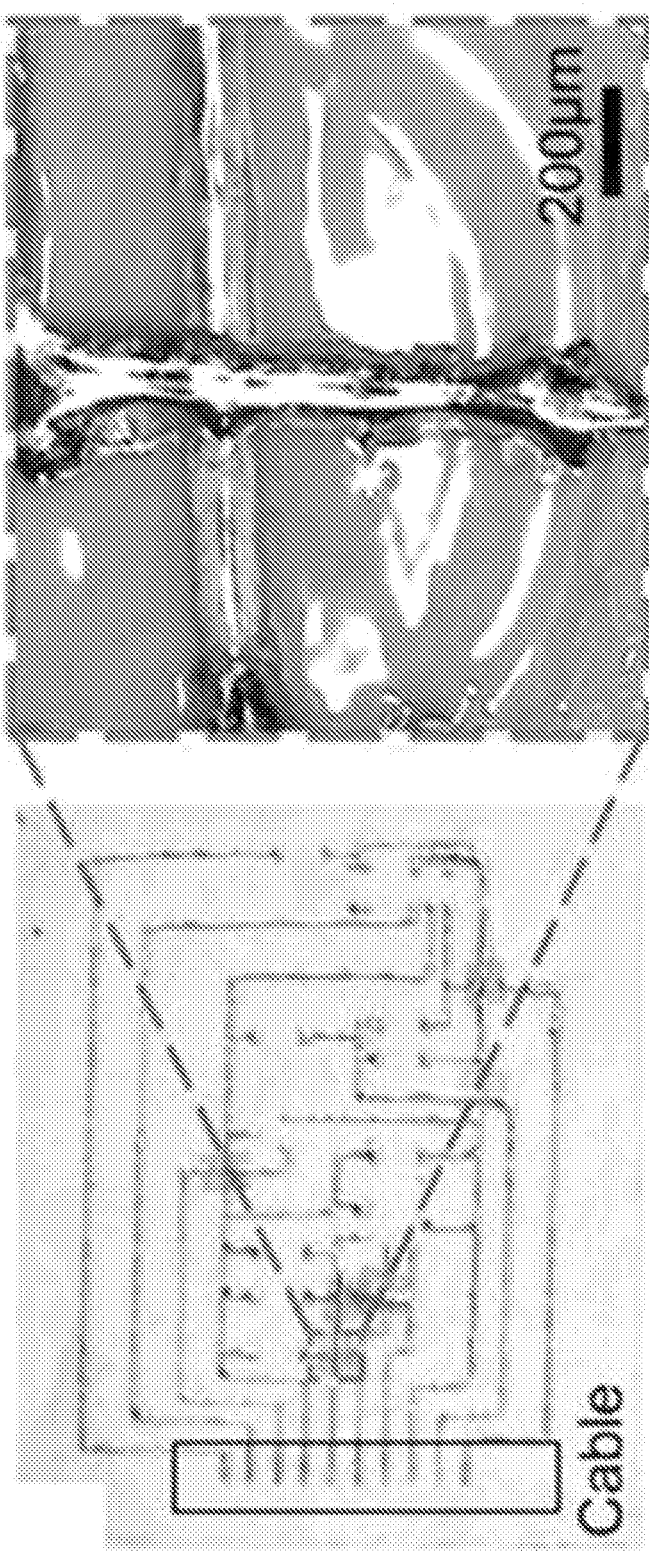
FIGS. 3A-3C depict the circuitry of the wearable electronics.

To avoid short circuit, the red dotted line in FIG. 3A shows the isolation of wires on intersection. As shown in the right image, polyimine was inserted between the crossing wires for insulation.

FEA Simulation

To investigate the mechanical performance of the multifunctional wearable electronics, finite element analysis (FEA) was conducted using a commercial software package ABAQUS. The polyimine and LM were modelled as Neo-Hookean hyperelastic material using 3D hybrid stress elements (C3D8H), and the chip components were modelled using elastic isotropic material with 3D stress elements (C3D8). The Young's moduli and Poisson's ratios were 2 MPa and 0.35 for polyimine, and 160 GPa and 0.4 for the chip components. For simplicity, the LM circuitry was modelled as an extremely soft solid, with Young's modulus 10 Pa and Poisson's Ratio 0.5, which doesn't noticeably affect the mechanical behavior of the wearable electronic system, as the Young's modulus is 5 orders of magnitude smaller than polyimine.

Sensing Performance Test

Figures 2A, 2B:
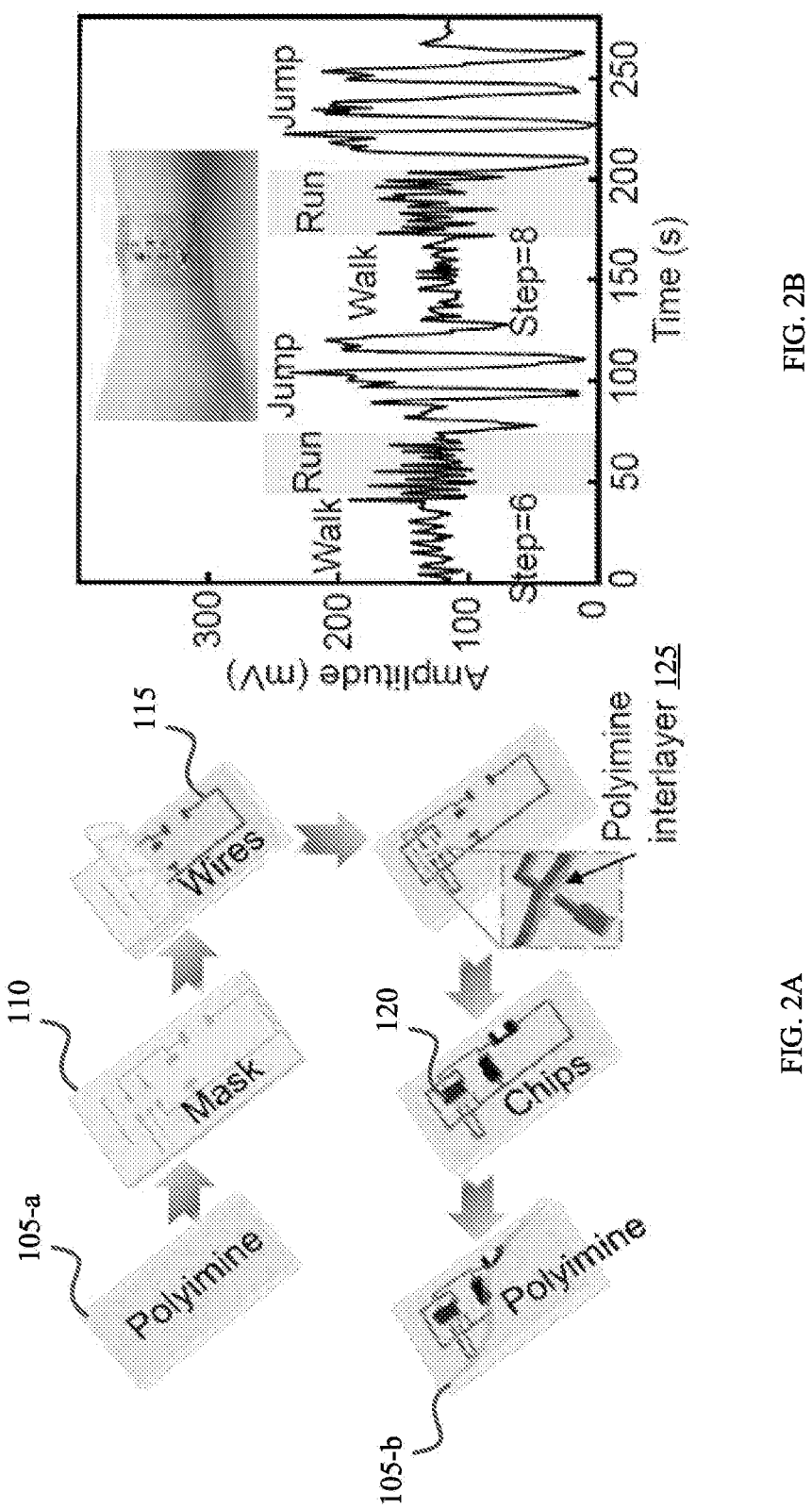
FIGS. 2A-2E depict the fabrication processes and sensing performance of the multifunctional wearable electronics.
Figures 2C, 2D, 2E:
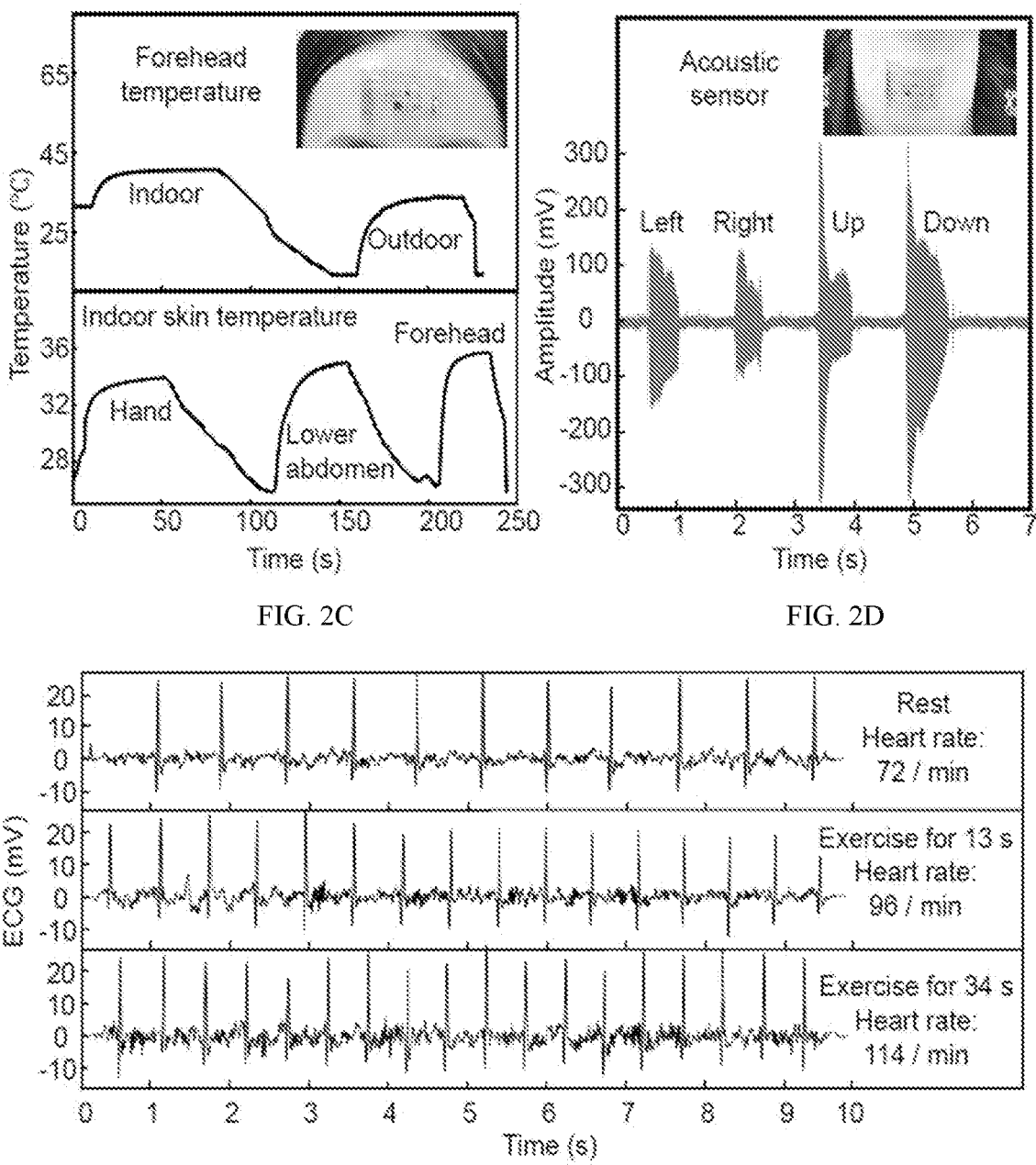
Figure 3B:
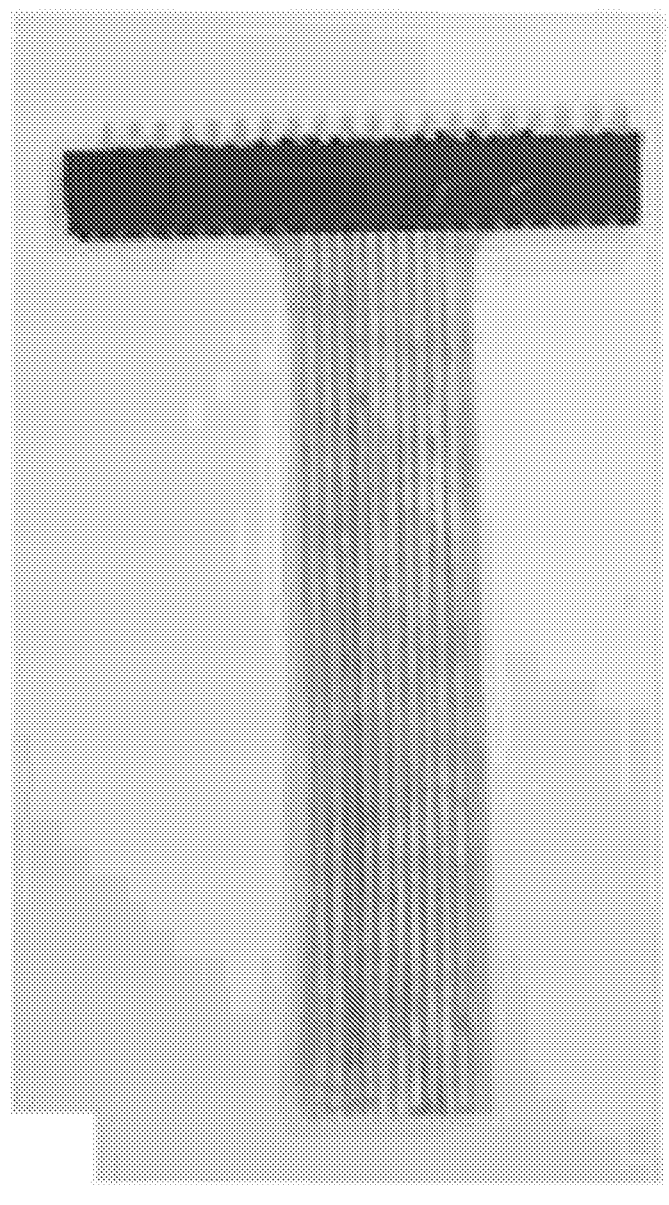

The upper insets shown in FIGS. 2B-2D are completed devices laminated onto the skin of the forearm, forehead and neck, respectively, using 50 m thickness VHB double side tape. The device could be connected to the signal processing system through LM cable in the device and an etched copper foil cable out of the device ($\sim 18 \times 82$ mm$^2$) (FIG. 3B). A thin lithium polymer battery (3.7 V, 45 mAh, GMB, China) was used to supply power and the total power consumption of the device is $\sim 2.06$ mW.

For ECG, three electrodes (AUVON TENS Unit Pads) with Electrode Gel (Spectra PAR12-02 Parker Laboratories 360 Electrode Gel) were connected to Chest1, Chest2 and Leg inputs. The Out1 and Out2 (ECG outputs) were connected to a PC microphone jack, and low-pass filter and high-pass filter were realized by digital filter using a python program.

For temperature sensing, Arduino as well as a 16 bit analog to digital converter (ADS1115) were used for measuring the voltage from Out3 (thermometer output) every 0.1 second.

For motion sensing, Arduino was used for measuring the voltage from Xout, Yout, and Zout (accelerometer outputs) every 0.1 second.

For acoustic sensing, the ground and Z outputs from the accelerometer were plugged into a PC microphone jack, and the signal was recorded and analyzed by a python program.

Design of the Circuit

Figure 3C:
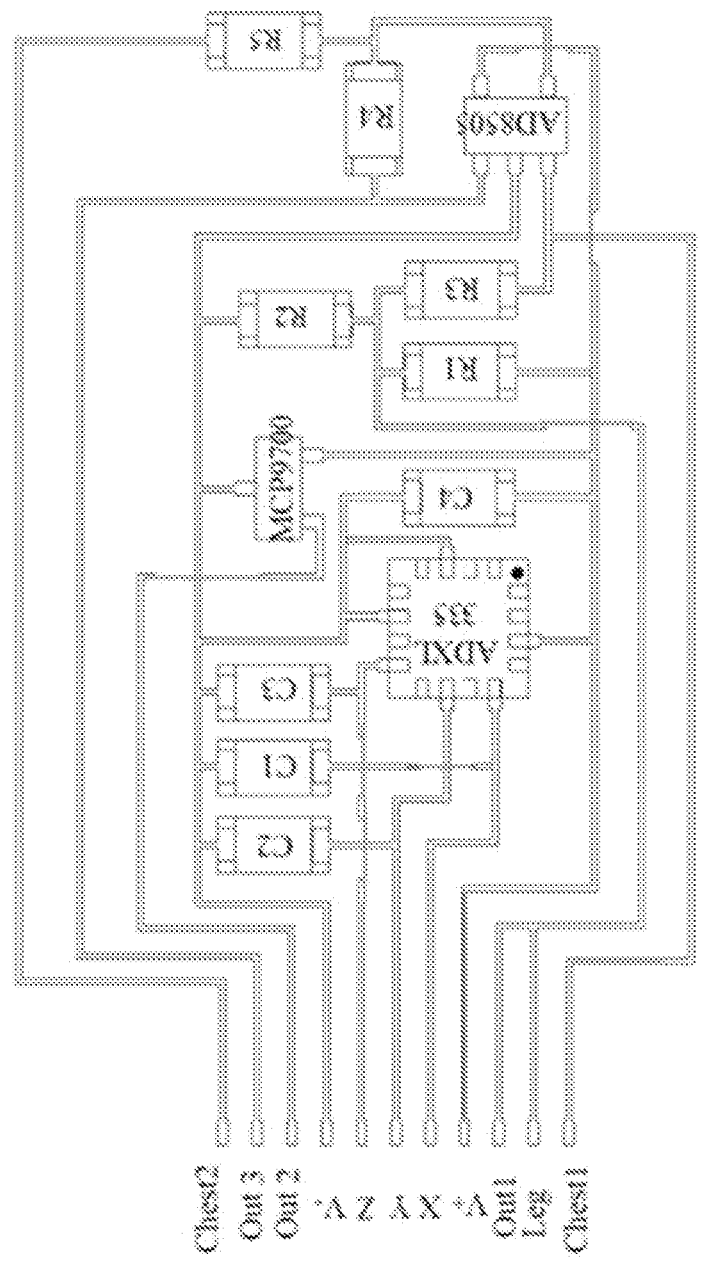

FIG. 3C illustrates the circuit of the multifunctional wearable electronics. For ECG sensing, chip AD8505 (Operational amplifier), chip $R_4$ (100 k$\Omega$ resistor) and chip $R_5$ (2 k$\Omega$ resistor) were used to amplify the voltage difference between chest1 and chest2 electrodes by 50 times. Chip $R_1$ (2 k$\Omega$ resistor) and chip $R_2$ (2 k$\Omega$ resistor) were used to form dual supply for the amplifier. Chip R3 (10 M$\Omega$ resistor) was used for the protection of electrical circuits. Chip ADXL335 (accelerometer) was used for acceleration sensing. Chip C1 (0.1 μF capacitor) and an internal resistor (32 k$\Omega$) of Xout formed low-pass filter for antialiasing and noise reduction. Chip C2 (0.1 μF capacitor) and chip C3 (0.1 μF capacitor)

had the same functions as Chip C1 for Yout and Zout, respectively. The equation for the frequency is $$F = \frac{1}{2\pi \times R_i \times C_i},$$ (S1)

where F is the low-pass frequency, $R_i$ and $C_i$ are the resistor and capacitor, respectively, and i is the output of X, Y, or Z. Chip C4 (0.1 µF capacitor) placed close to the ADXL335 supply pins adequately decouples the accelerometer from noise on the power supply.

For thermometer sensing, chip MCP9700 was used to measure the body temperature.

Results and Discussion

There have been numerous developments in the field of stretchable/flexible electronics in the past 2-3 decades. To achieve excellent mechanical compliance and electrical performance simultaneously, integration techniques that combine stretchable substrates, interconnects, and hard commercial chip components were developed, including soft microfluidic assemblies, solderable and stretchable platforms, and liquid metal based systems. More recently, various chemistry and mechanisms have been explored to enable self-healability and degradability in wearable electronics. For example, microvascular agents, dynamic covalent bonds, metal-ligand supramolecular chemistry, and hydrogen bonds have been studied to realize self-healable electronics, for improved reliability, durability, and cost. Among these mechanisms, polymer networks with covalent bonding demonstrate advantages in robustness, stability and mechanical strength when compared with non-covalent chemistry.

One issue with the increased demand for stretchable/flexible electronics is the generation of electronic waste associated with these products. To resolve this issue, dynamic covalent thermoset polyimine has been developed, which can be not only self-healable/rehealable but also recyclable (Taynton, P. et al., "Re-healable polyimine thermosets: polymer composition and moisture sensitivity," Polym. Chem., 2016, 7:7052-7056; Whiteley, J. M. et al., "Ultra-thin Solid-State Li-Ion Electrolyte Membrane Facilitated by a Self-Healing Polymer Matrix," Adv. Mater., 2015, 27:6922-6927; Jin, Y. et al., "Malleable and Recyclable Thermosets: The Next Generation of Plastics," Matter, 2019, 1:1456-1493; Taynton, P. et al., "Heat- or Water-Driven Malleability in a Highly Recyclable Covalent Network Polymer," Adv. Mater., 2014, 26:3938-3942; Taynton, P. et al., "Repairable woven carbon fiber composites with full recyclability enabled by malleable polyimine networks," Adv. Mater., 2016, 28:2904-2909). A rehealable, fully recyclable, and malleable electronic skin was recently reported (Zou, Z. et al., "Rehealable, fully recyclable, and malleable electronic skin enabled by dynamic covalent thermoset nanocomposite," Sci. Adv., 2018, 4:eaaq0508) that is based on the polyimine chemistry and its nanocomposites. However, the electronic skin reported in this work has limited compliance and stretchability (failure strain ~4%, Young's modulus ~10 MPa) while the resistivity (~1×10$^{-3}$ Ω·cm) of the nanocomposite is too high for high-performance electronics. Furthermore, the rehealing process requires heat press, which is not ideal for wearable devices. Thus, this previously reported polyimine and its nanocomposites are not optimal for stretchable, compliant, and self-healable electronics.

Herein, a multifunctional wearable electronic system is presented that can simultaneously provide full recyclability, excellent mechanical stretchability, self-healability, and reconfigurability based on modified polyimine chemistry. Such wearable electronics are achieved by heterogeneous integration of rigid (chip components), soft (dynamic covalent thermoset polyimine, new formula) and liquid (eutectic liquid metal) materials through advanced mechanical design and low-cost fabrication method. In such wearable electronic system, off-the-shelf chip components provide high-performance sensing and monitoring of the human body, including physical motion tracking, temperature monitoring, and sensing of acoustic and electrocardiogram (ECG) signals. They are interconnected by intrinsically stretchable and robust liquid metal circuitry, and encapsulated by dynamic covalent thermoset polyimine matrix. Bond exchange reactions in the polyimine network, together with the flowability of liquid metal, enable the wearable electronics to self-heal from damages and to be reconfigured into distinct configurations for different application scenarios. Furthermore, through transimination reactions, the polyimine matrix can be depolymerized into oligomers/monomers that are soluble in methanol and are separated from the chip components and liquid metal. All recycled materials and components can be reused to fabricate new materials and devices.

Figures 5A, 5B:
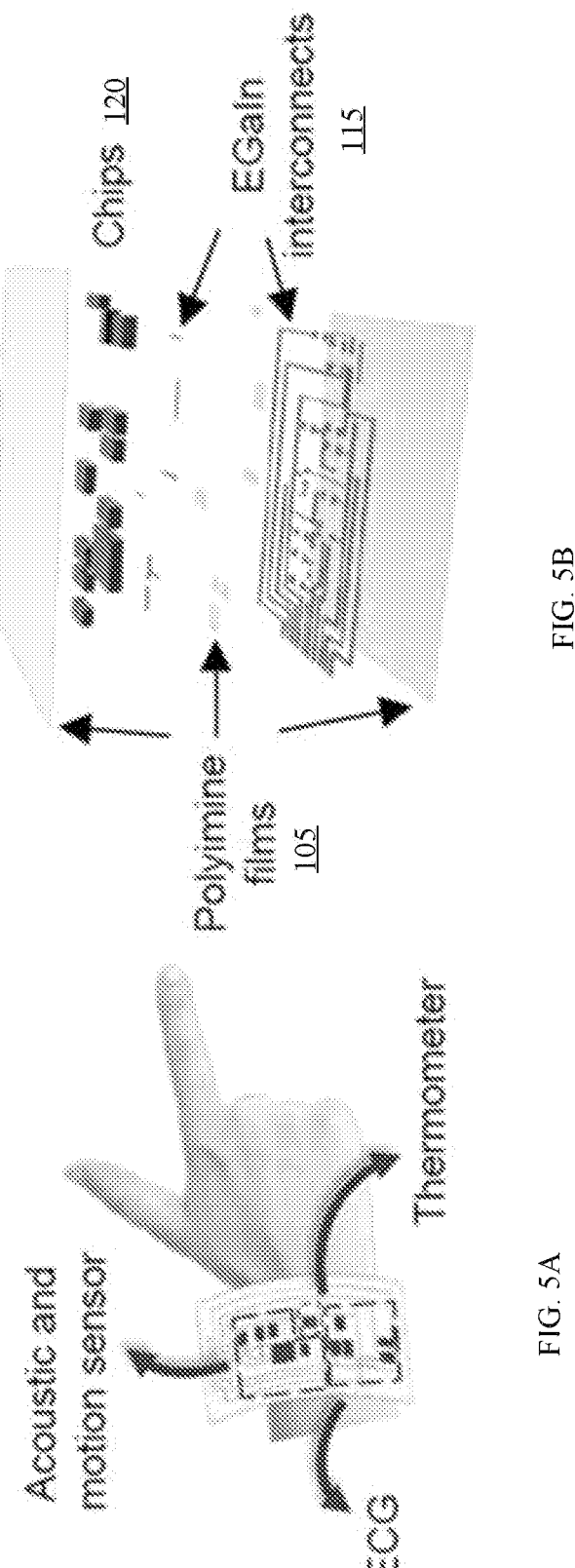
FIGS. 5A-5E depict the design and schematic illustration of highly stretchable, self-healable, and recyclable multifunctional wearable electronics.
Figure 5D:
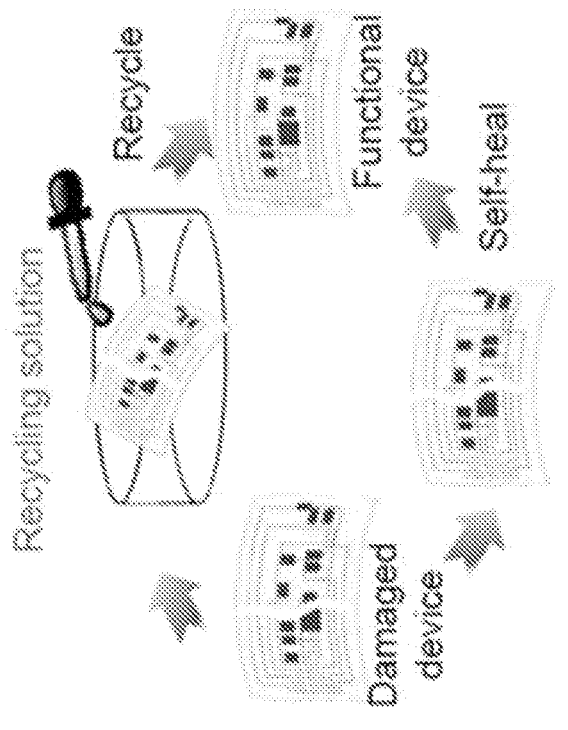
Figure 5D:
Figure 5C:
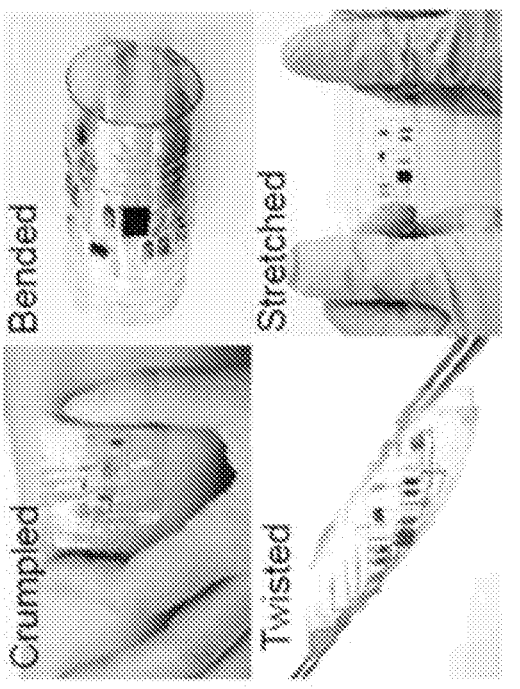
Figure 6A:
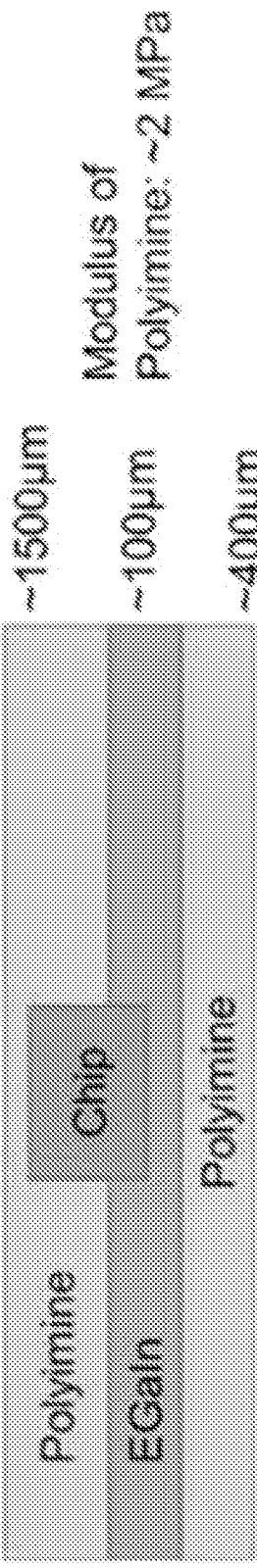
FIGS. 6A-6C depict images of the multifunctional wearable electronics.
Figure 6B:
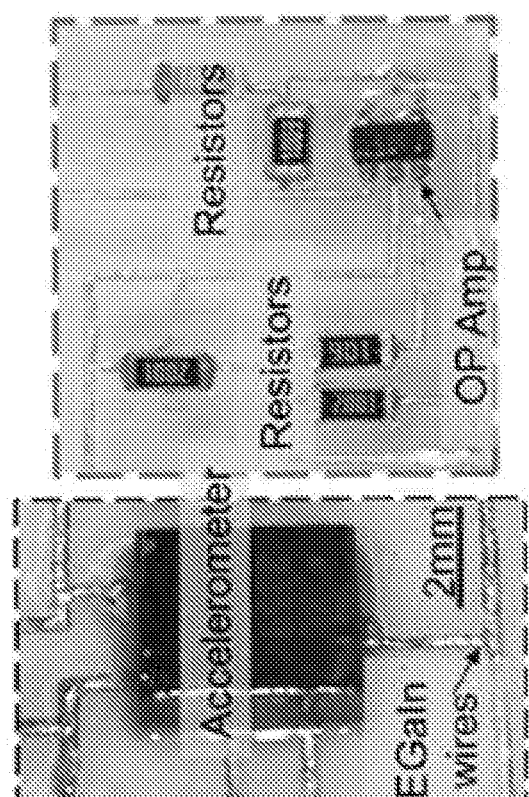
Figure 6B:
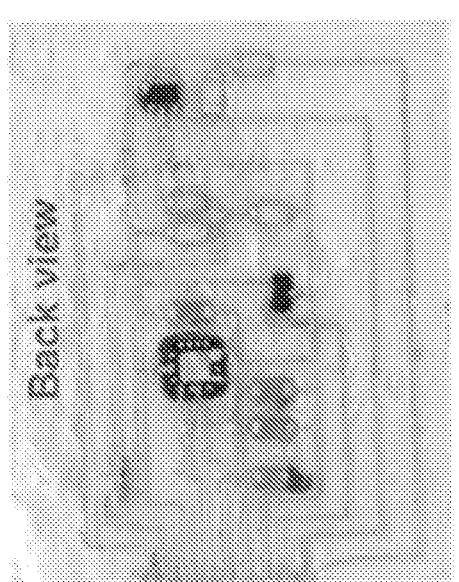
Figure 6B:
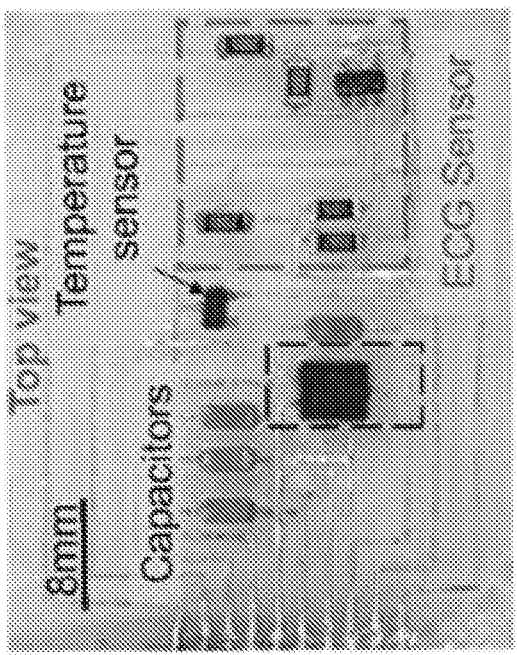
Figure 6B:
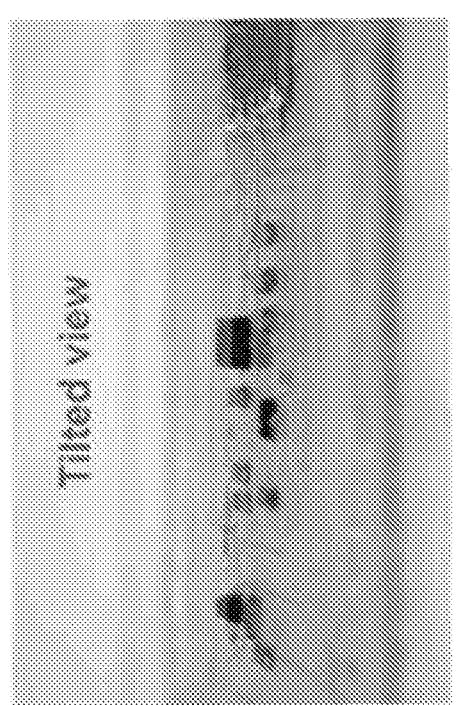
Figure 6C:
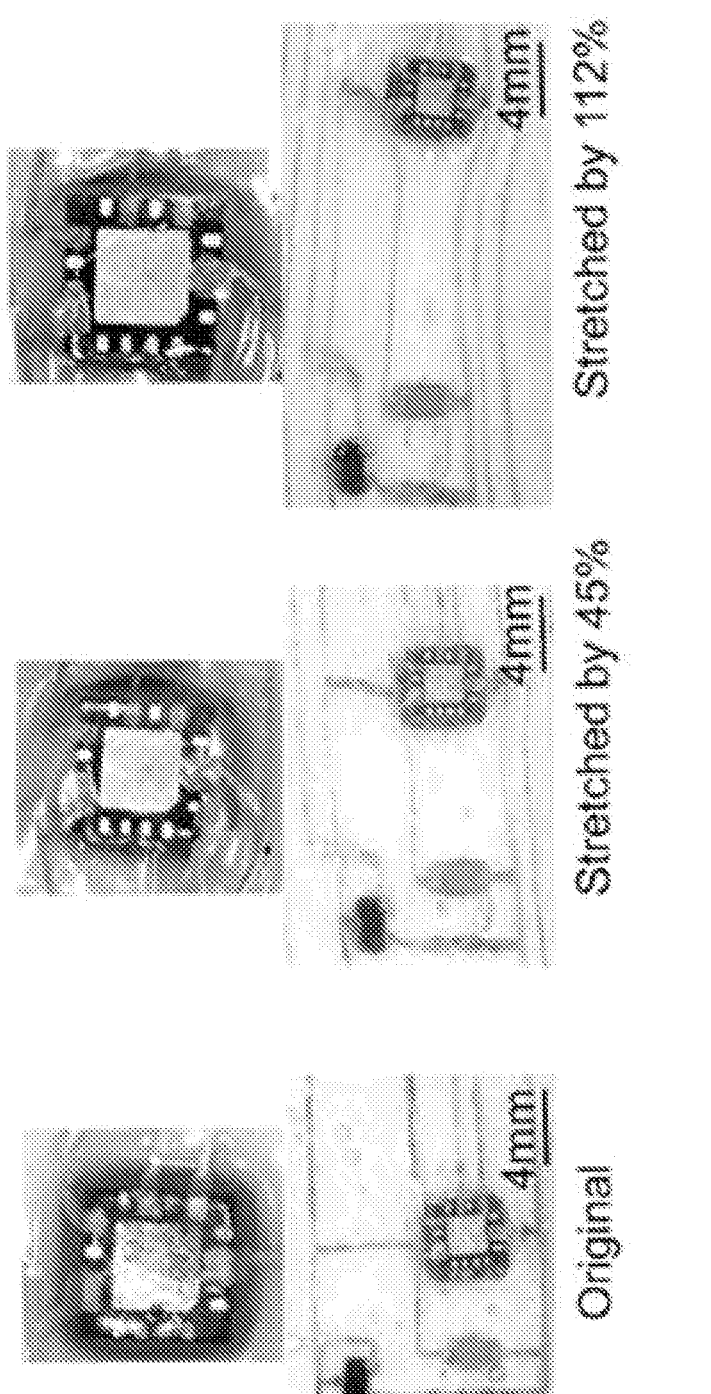

The multifunctional wearable electronics incorporates three sensing modules: (i) electrocardiograph (ECG) sensor implemented by operational amplifiers and resistors, (ii) thermometer sensor for body temperature sensing, and (iii) accelerometer for acoustic and motion sensing (FIG. 5A). FIG. 5B provides an exploded view of the schematic illustration of the design, which includes eutectic gallium-indium (EGaIn) liquid metal (LM) alloy, and commercial small-scale chip components encapsulated between two thin elastomeric polyimine membranes (FIG. 6A). The LM serves as electrical interconnects between chips, and each chip's pins are mounted precisely onto the patterned LM contact pads, similar to printed circuit boards but without the need of welding (FIGS. 6B and 6C). The device in this case includes 12 chip components, the specifications of which are summarized in table Si. The LM circuitry in this multifunctional wearable electronics provides a combination of excellent electrical conductivity (3.4×10$^6$ S/m) and superior intrinsic mechanical softness and deformability, so that the device can be crumpled when attached on human skin (FIG. 5C, top left), bended (FIG. 5C, top right), twisted (FIG. 5C, bottom left) and stretched (FIG. 5C, bottom right).

Figure 5E:
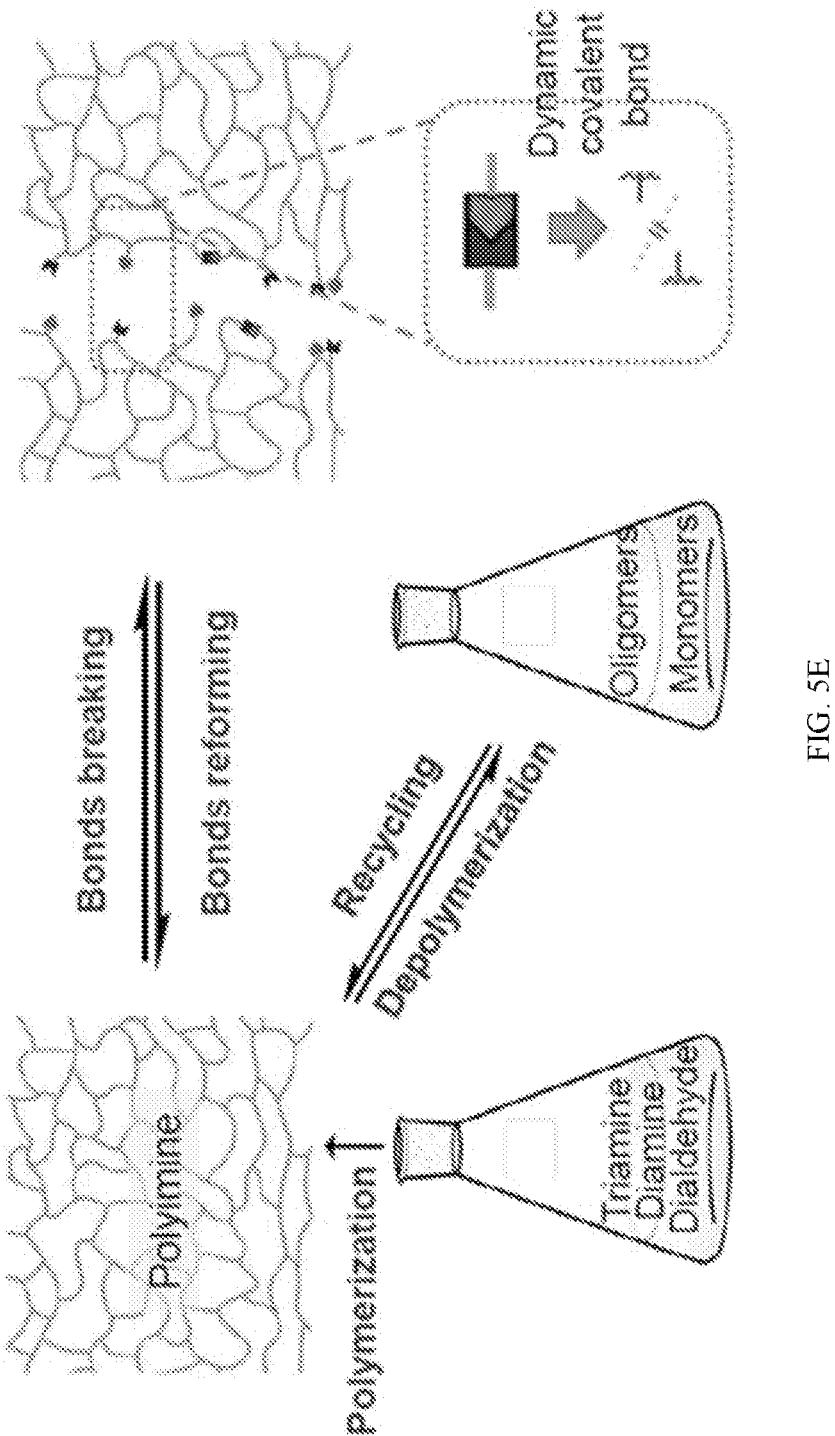

The stretchable substrate, insulation and encapsulation films in this wearable electronics are made of polyimine, which can be synthesized by using three commercially available monomers: terephthalaldehyde, 3,3'-diamino-N-methyldipropylamine and tris(2-aminoethyl)amine (FIG. 1A). As schematically illustrated in FIG. 5D, the cross-linked polyimine functions are based on the dynamic covalent chemistry principle. A model reaction as shown in FIG. 1B clearly indicates the imine bond exchange reaction is efficient at both room temperature and 80° C. The FTIR spectra of terephthaldehyde and polyimine shown in FIG. 1C further prove the full conversion of aldehyde into imine bonds. At appropriate environmental conditions, bond exchange reactions in polyimine network lead to effective stress relaxation, enabling excellent malleability and reprocessibility (Jin, Y. et al., "Malleable and Recyclable Thermosets: The Next Generation of Plastics," Matter, 2019, 1:1456-1493; Taynton, P. et al., "Heat- or Water-Driven Malleability in a Highly Recyclable Covalent Network Polymer," Adv. Mater., 2014, 26:3938-3942; Taynton, P. et al., "Repairable woven carbon fiber composites with full recyclability enabled by malleable polyimine networks," Adv. Mater., 2016, 28:2904-2909). At the interface between two polyimine films, bond exchange reactions produce new covalent bonding across the interface, leading to effective interfacial bonding or healing. Another interesting characteristic of the polyimine network is that when excessive diamine and/or triamine monomers are introduced, transimination reactions lead to depolymerization of the polyimine network into oligomers/monomers soluble in methanol. This mechanism enables 100% recycling of the cross-linked polyimine. As shown in FIG. 1C, the high similarity between the FTIR spectra of the original and recycled polyimine supports the notion that these two films are chemically identical. Because of these properties of polyimine, the multifunctional wearable electronics is self-healable and fully recyclable (FIG. 5E). When the device is damaged, the broken pieces can be brought into contact, and bond exchange reactions can generate new covalent bonds at the interface. It should be noted, different from those self-healing materials using non-covalent supramolecular bonding interactions (e.g., hydrogen bonding, metal-ligand coordination, etc.), the polyimine matrix used herein consists of covalent bonds, thus making the devices much more robust and can operate under a broad range of conditions. The self-healed device regains both mechanical and electrical functions. When necessary, press can be used to improve interfacial contact and to accelerate bond exchange reactions for more effective interfacial healing. When the device is severely damaged or not needed, it can be fully recycled by soaking in the recycling solution, which is 3,3'-diamino-N-methyldipropylamine and tris(2-aminoethyl)amine dissolved in methanol. When polyimine is completely depolymerized, the electrical components, including the chips and EGaIn LM, can be easily separated from the solution. The polymer solution and the electrical components can be reused for making new devices.

Fabrication of the multifunctional wearable electronics is schematically illustrated in FIG. 2A. It starts with mounting a silicon paper mask onto a synthesized polyimine film substrate. Screen printing method is adopted to brush EGaIn LM against the mask, and peeling off of the mask leaves patterned LM traces on the polyimine substrate. At each intersection of LM traces, a polyimine insulation layer is added. Then chip components are pick-and-placed onto the pre-designed locations with LM contact pads. Applying and curing uncured polyimine solution onto the device provides encapsulation and protection to the LM circuitry and chip components. This process is very low-cost, and compatible with printing technology.

Figure 7A:
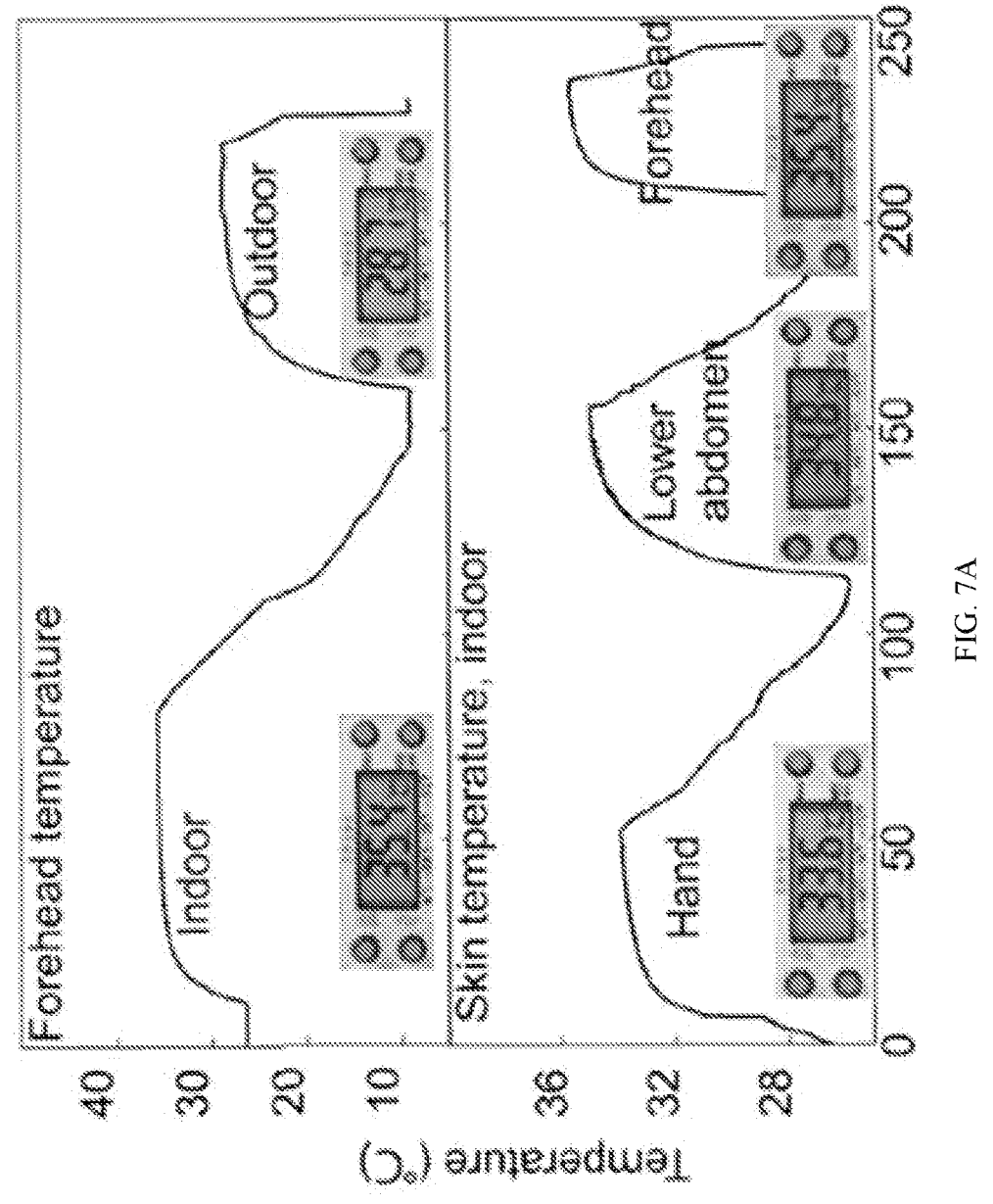
FIGS. 7A-7B depict temperature and acoustic measurements.
Figure 7B:
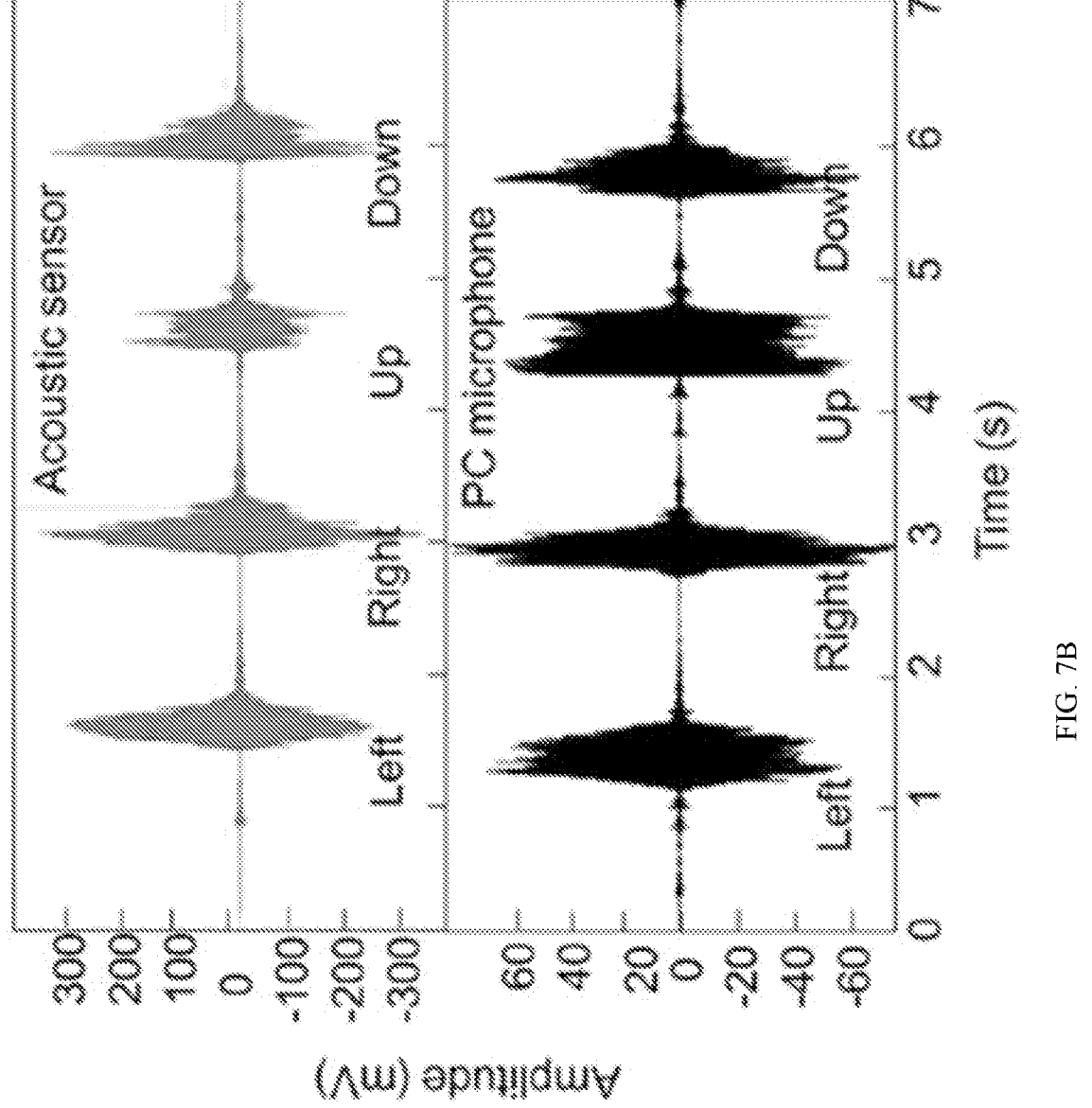
Figure 8:
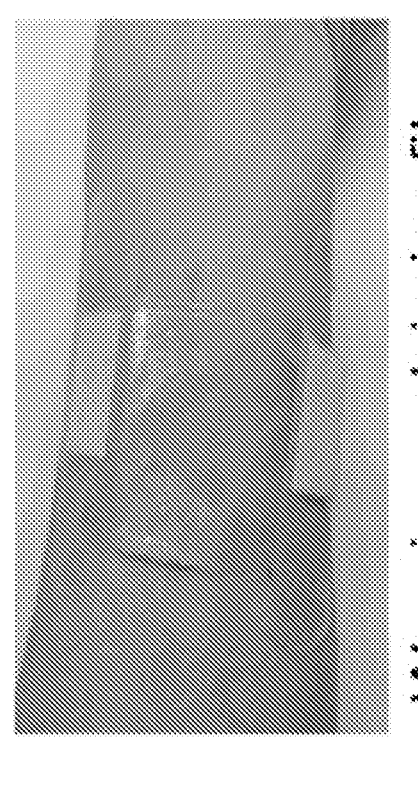
FIG. 8 depicts optical images of skin before (top left) and after wearing a polyimine film (top right) for 12 hours (bottom left) and 24 hours (bottom right).
Figure 8:
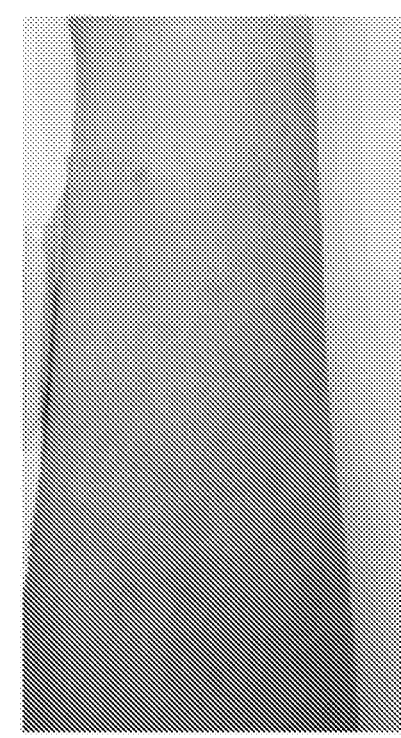
Figure 8:
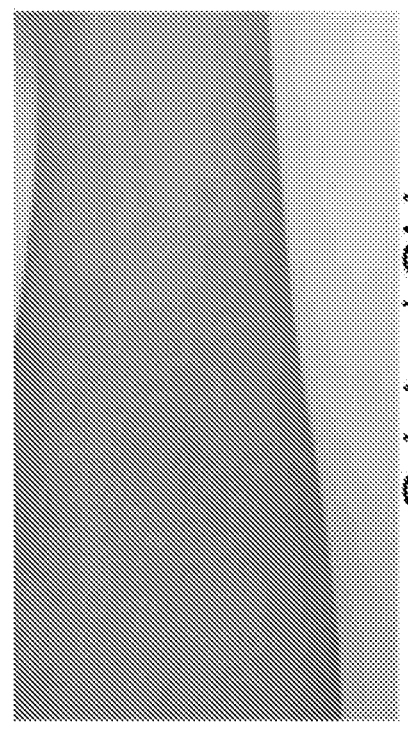
Figure 8:
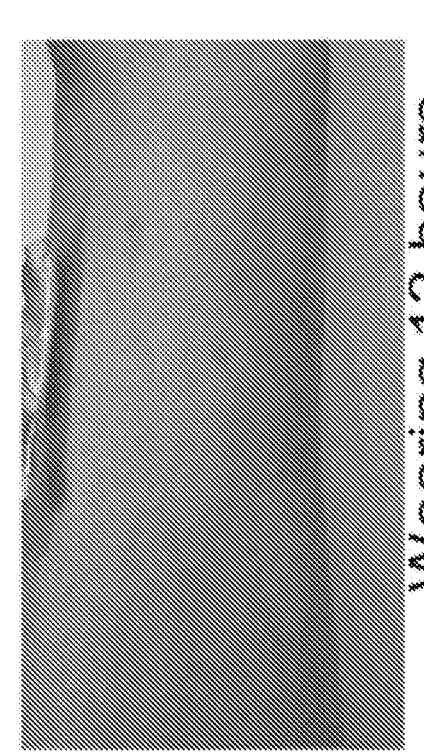

The multifunctional wearable electronics integrates a thermal sensor (MCP9700, Microchip Technology), a tri-axial accelerometer (ADXL335, Analog Devices Inc.), and a ECG sensor (AD8505, Analog Devices Inc. and Resistors, Bourns Inc.), so that it can provide real-time monitoring of body temperature, physical activities, health state, and also can serve as human-machine interfaces, as demonstrated in FIGS. 2B-2E. The multifunctional wearable electronics can be worn on the wrist, to provide monitoring of physical activities, as shown in FIG. 2B. It can detect the different amplitude and frequency of walking, running and jumping. The thermal sensor can provide accurate measurement of body temperature in different environments and at different body locations. FIG. 2C shows the measured forehead temperature when the subject stayed indoors (35.4° C.) and outdoors (28.7° C.) (top frame), and the different indoor temperatures on hand (33.6° C.), lower abdomen (34.8° C.), and forehead (35.4° C.) (bottom frame). These measurements are consistent with the data obtained by using a commercial thermometer (FIG. 7A). When attached on the throat, the acoustic sensor can capture the vibration characteristics of the vocal cords, and serve as human-machine interfaces. As exhibited in FIG. 2D, the data captured clearly show distinct vibration signatures of different verbal commands, which are consistent with those obtained by using a commercial PC microphone (FIG. 7B). The ECG sensor monitors the electrocardiogram of the heart. The ECG data of the subject at rest, after exercised for 13 seconds and 34 seconds are presented in FIG. 2E. They correspond to the heart beating rate of 72/minute, 96/minute, and 114/minutes, respectively. To test biocompatibility, FIG. 8 shows optical images comparing the skin conditions before (top left) and after wearing a polyimine film for 12 hours (bottom left) and 24 hours (bottom right), respectively. No noticeable adverse effects on the skin can be observed.

Figure 9A:
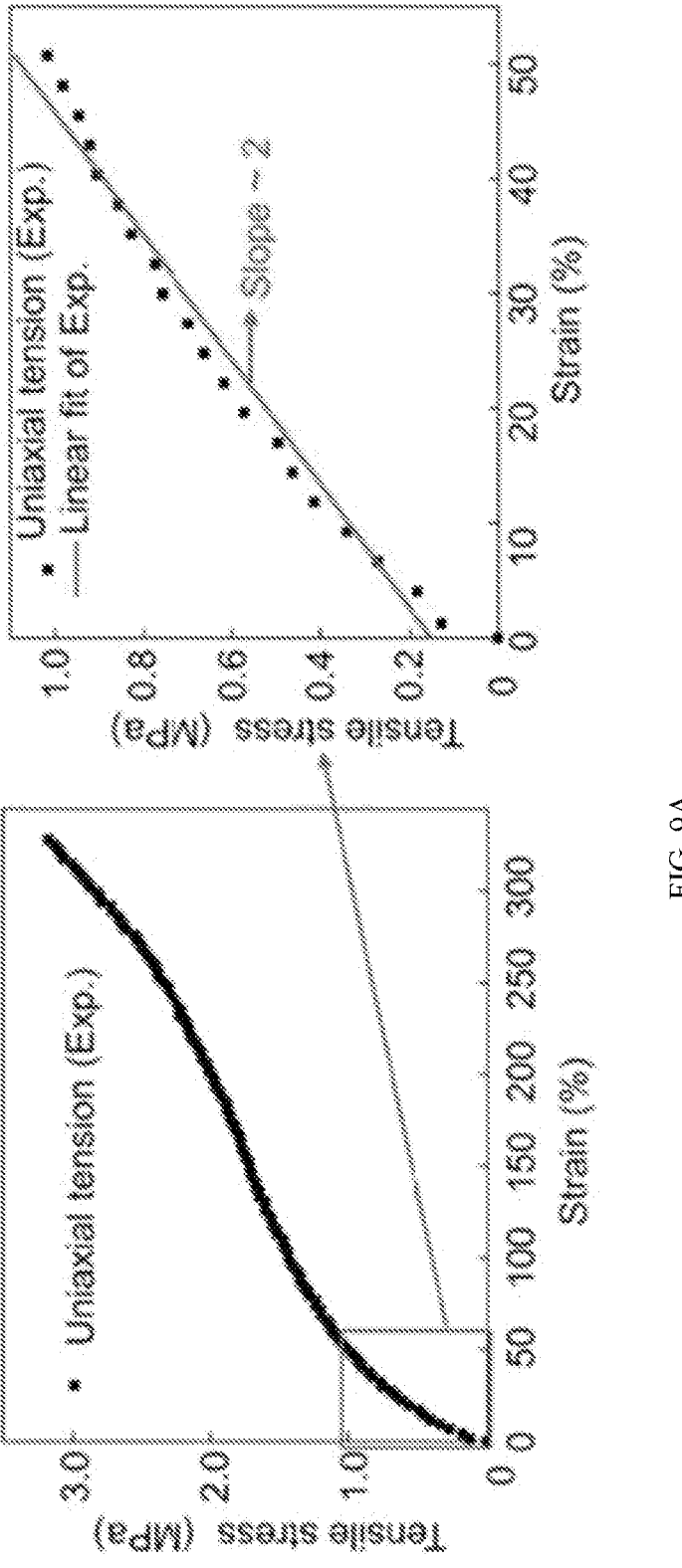
FIGS. 9A-9C depict the stress-strain properties of a polyimine film.
Figure 9B:
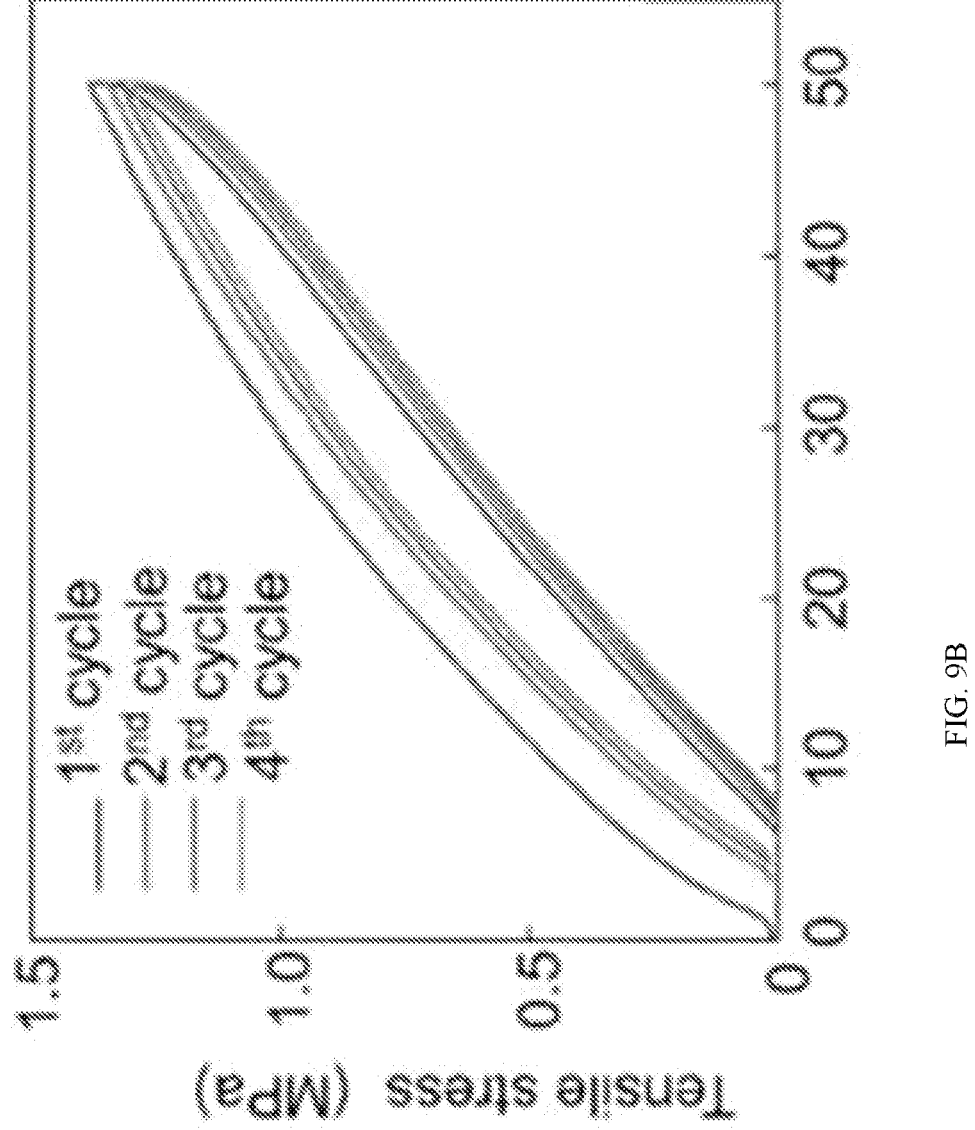
Figure 9C:
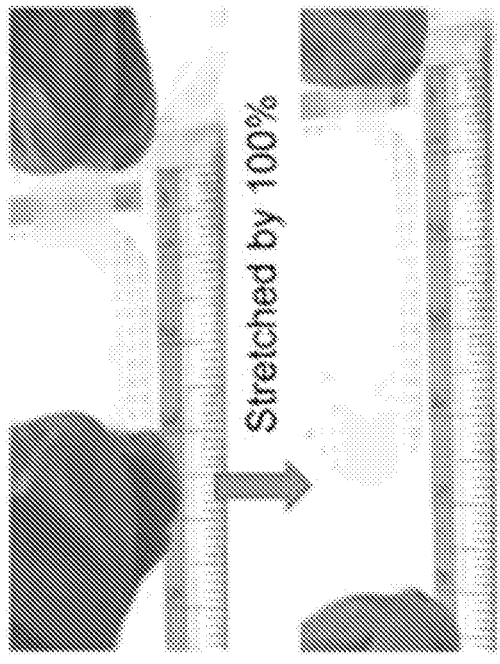
Figure 9C:
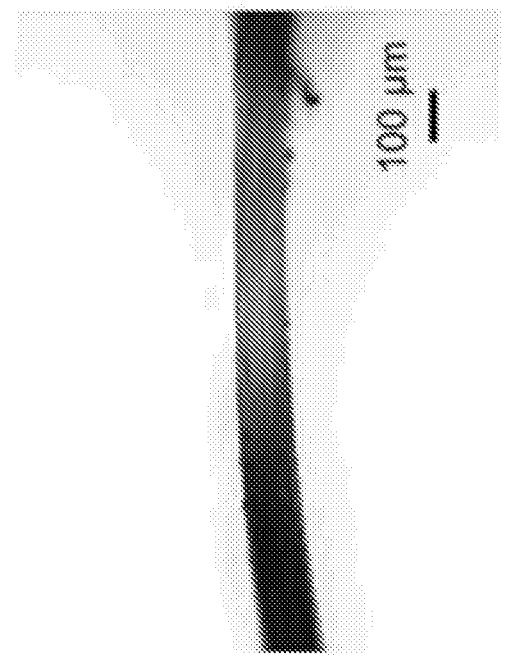
Figure 10A:
FIGS. 10A-10C depict resistance data of a polyimine encapsulated LM conductor.
Figure 10A:
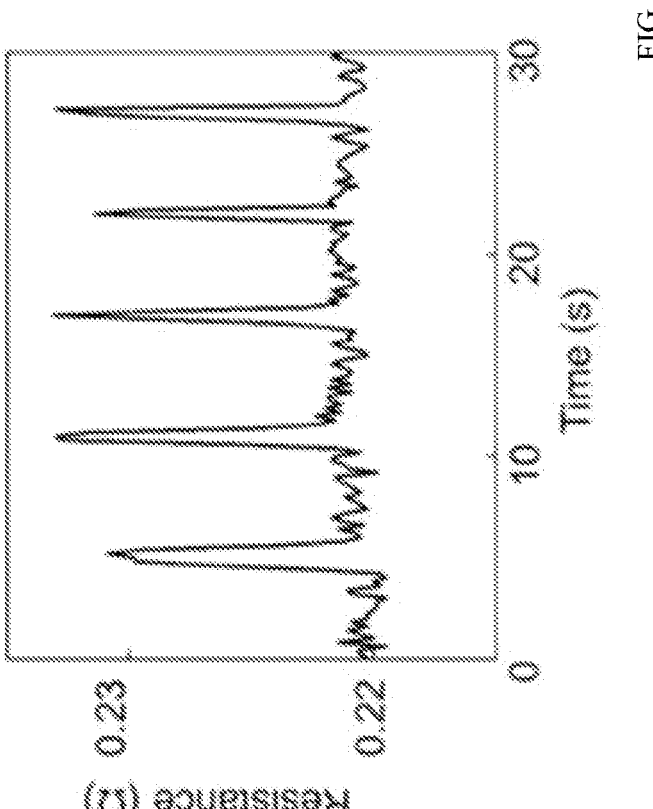
Figure 10B:
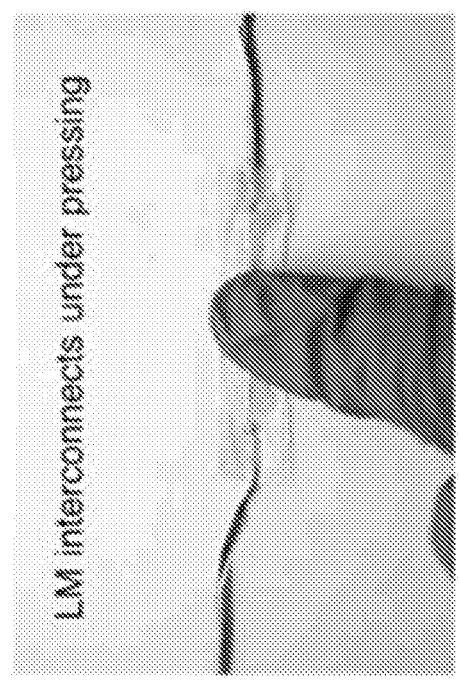
Figure 10B:
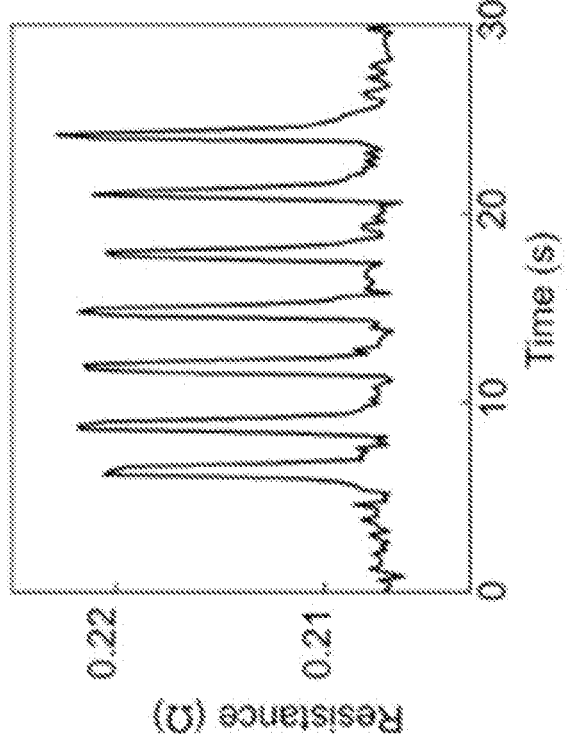
Figure 10C:
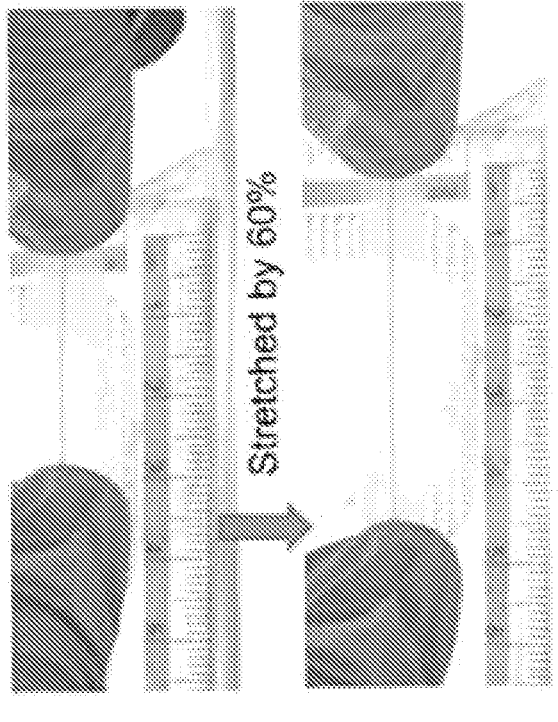
Figure 10C:
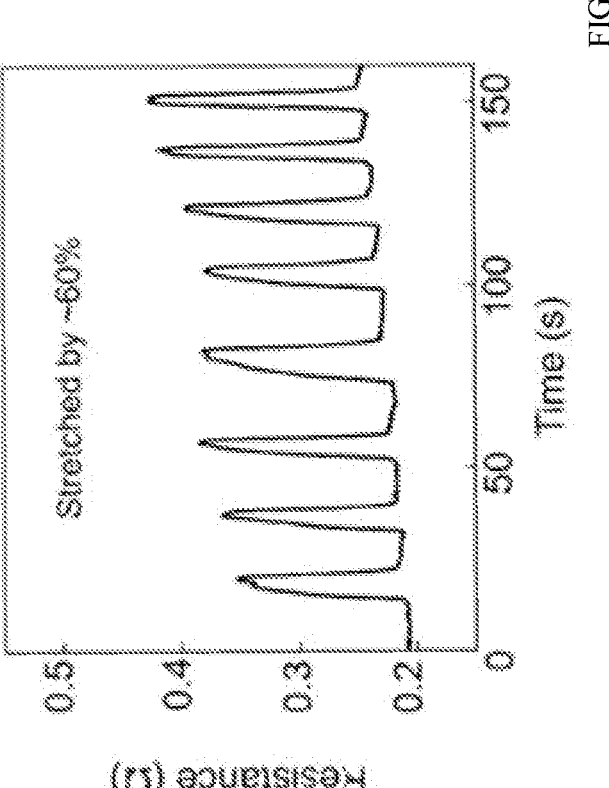
Figures 11A, 11B:
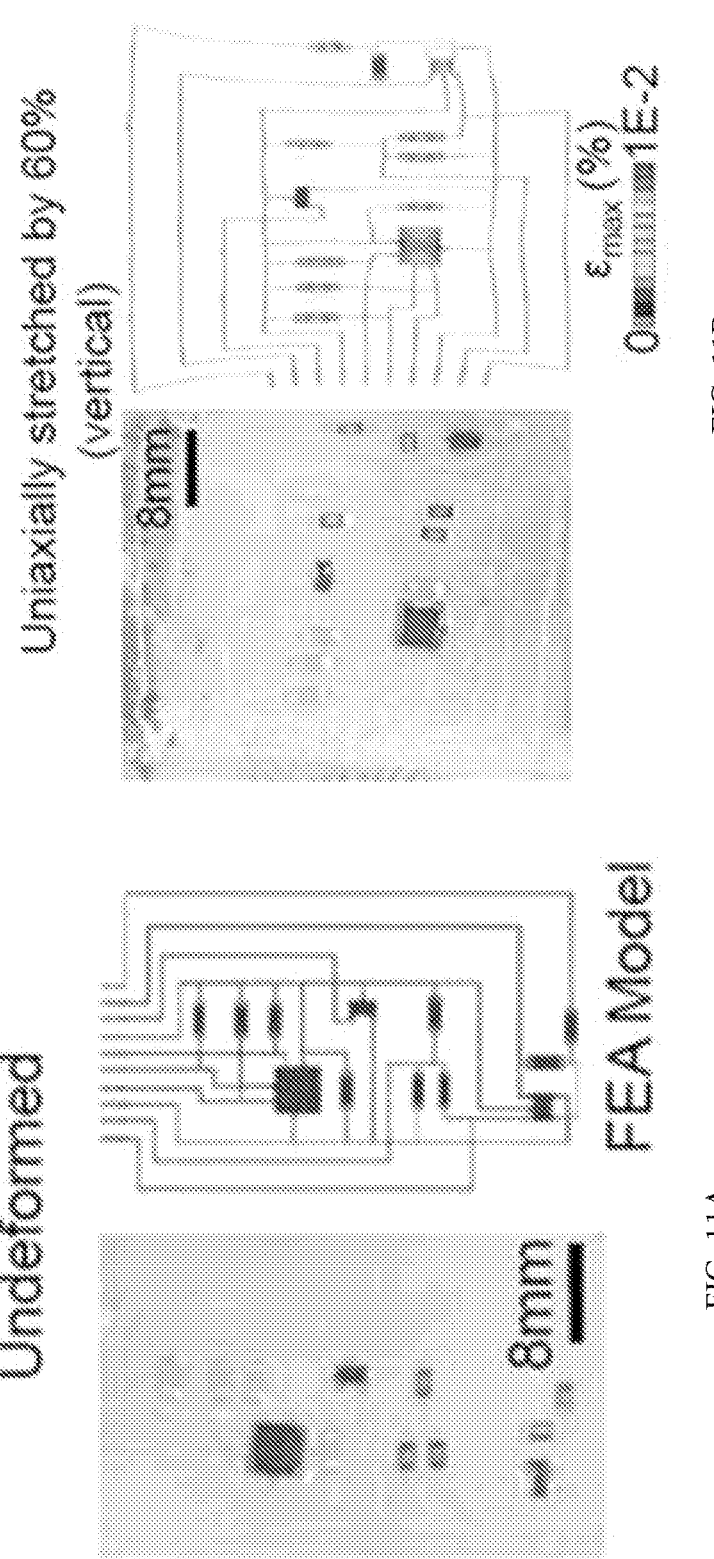
FIGS. 11A-11E depict computational and experimental studies of the stretchability of the multifunctional wearable electronics.
Figure 11D:
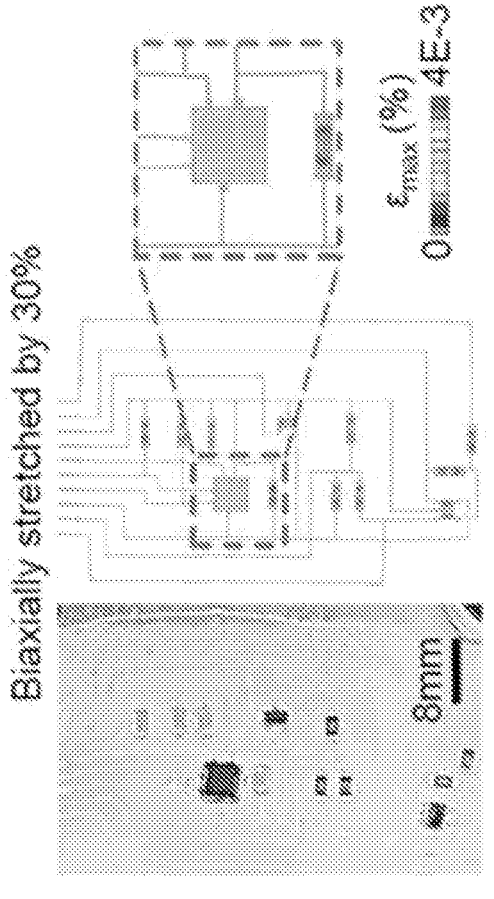
Figure 11C:
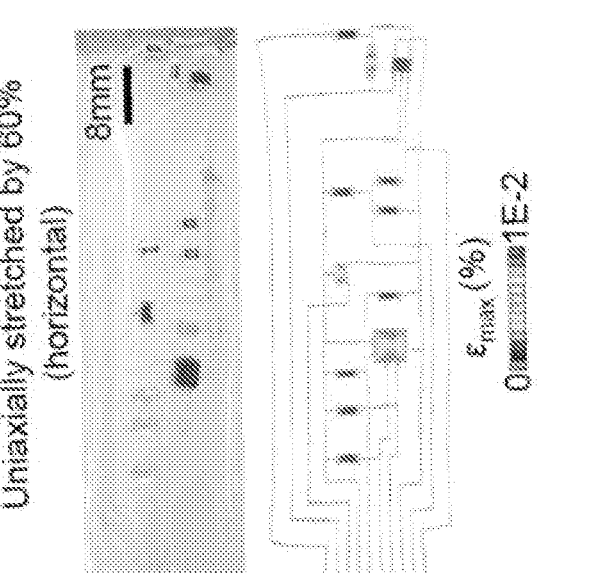
Figure 11E:
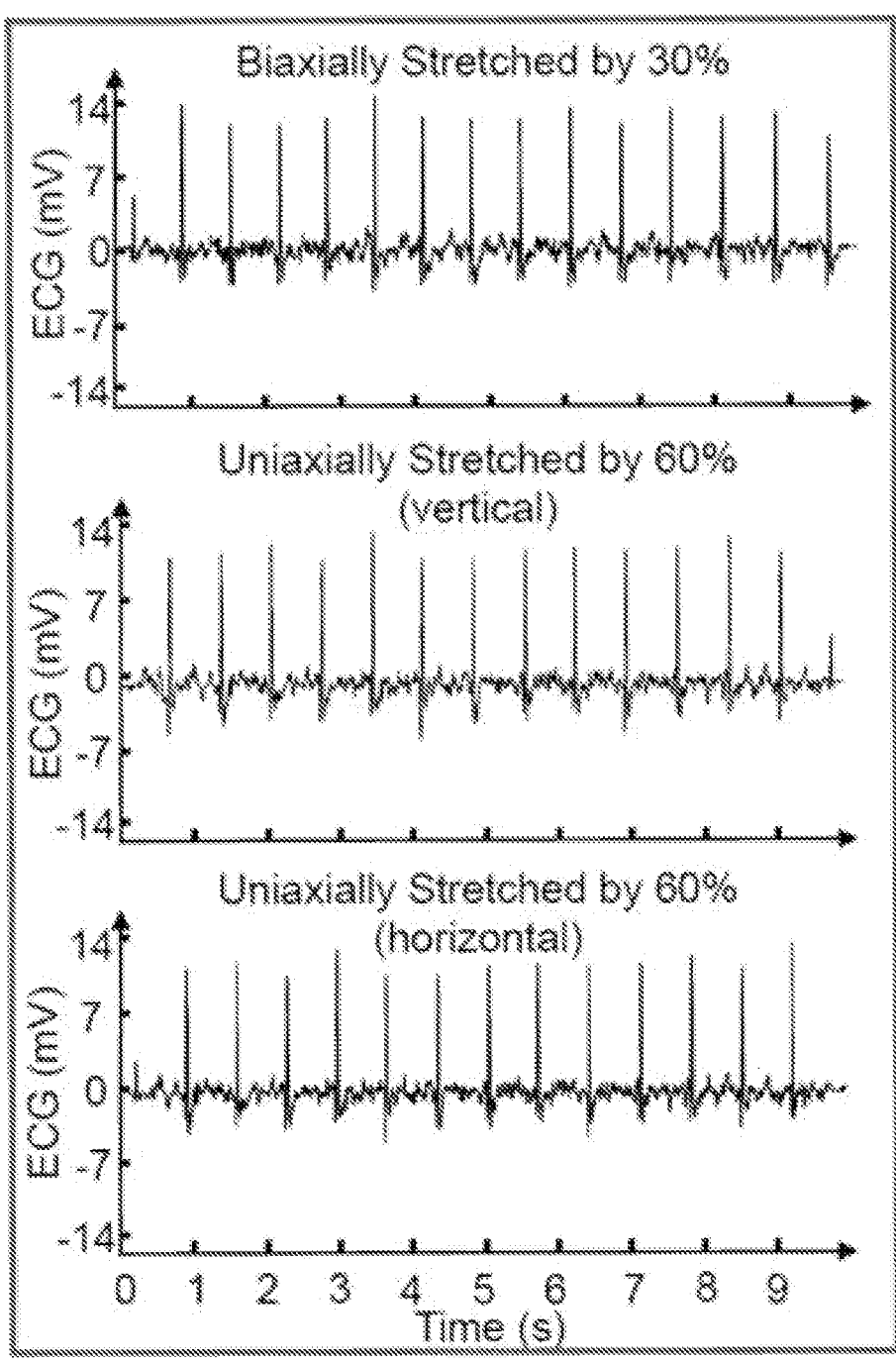
Figure 12:
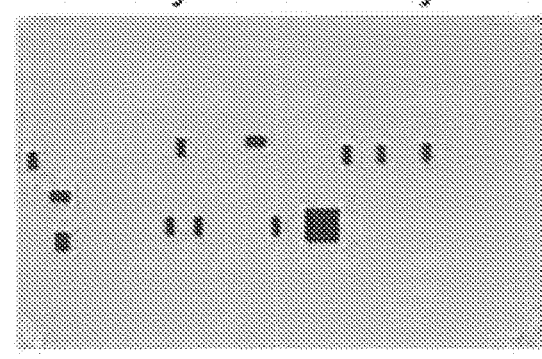
FIG. 12 depicts max principal strain contours in polyimine when the multifunctional electronics is subjected to 30% biaxial strain (top), 60% uniaxial strain along vertical (middle) and horizontal (bottom) directions.
Figure 12:
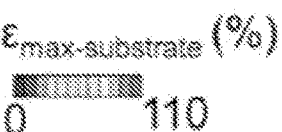
Figure 12:
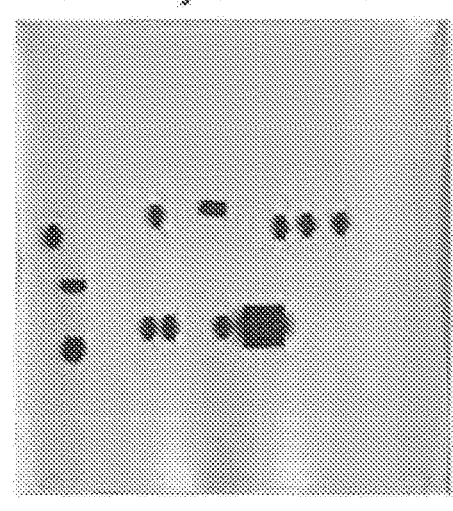
Figure 12:
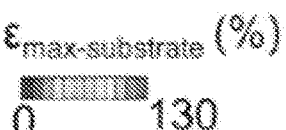
Figure 12:
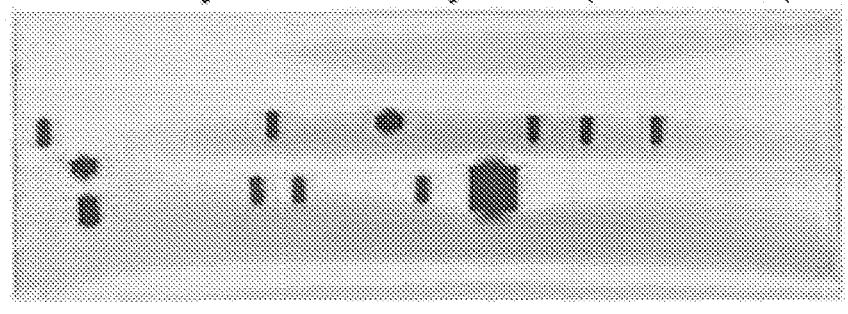
Figure 14A:
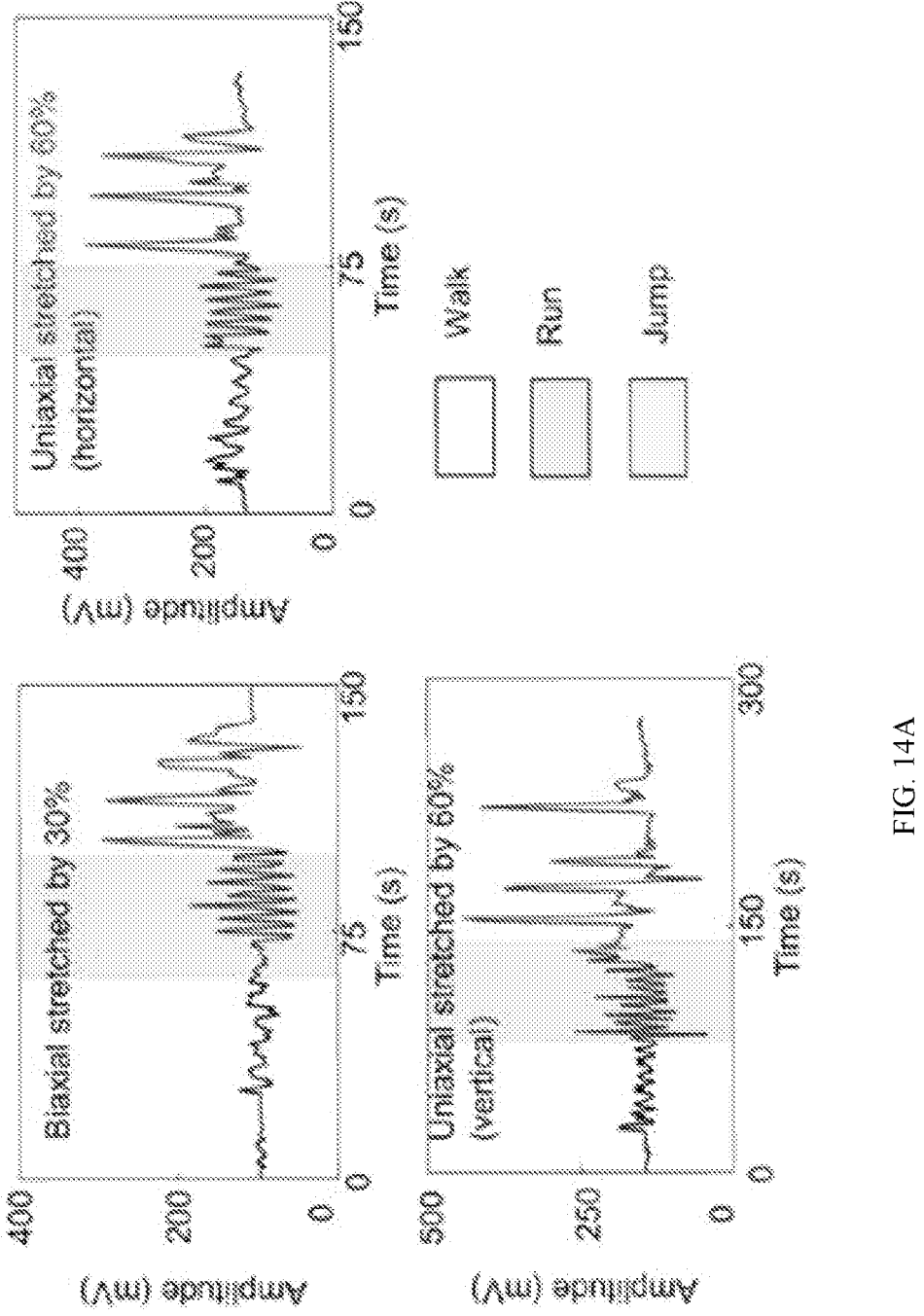
FIGS. 14A-14B depict motion and temperature data obtained under strain.
Figure 14B:
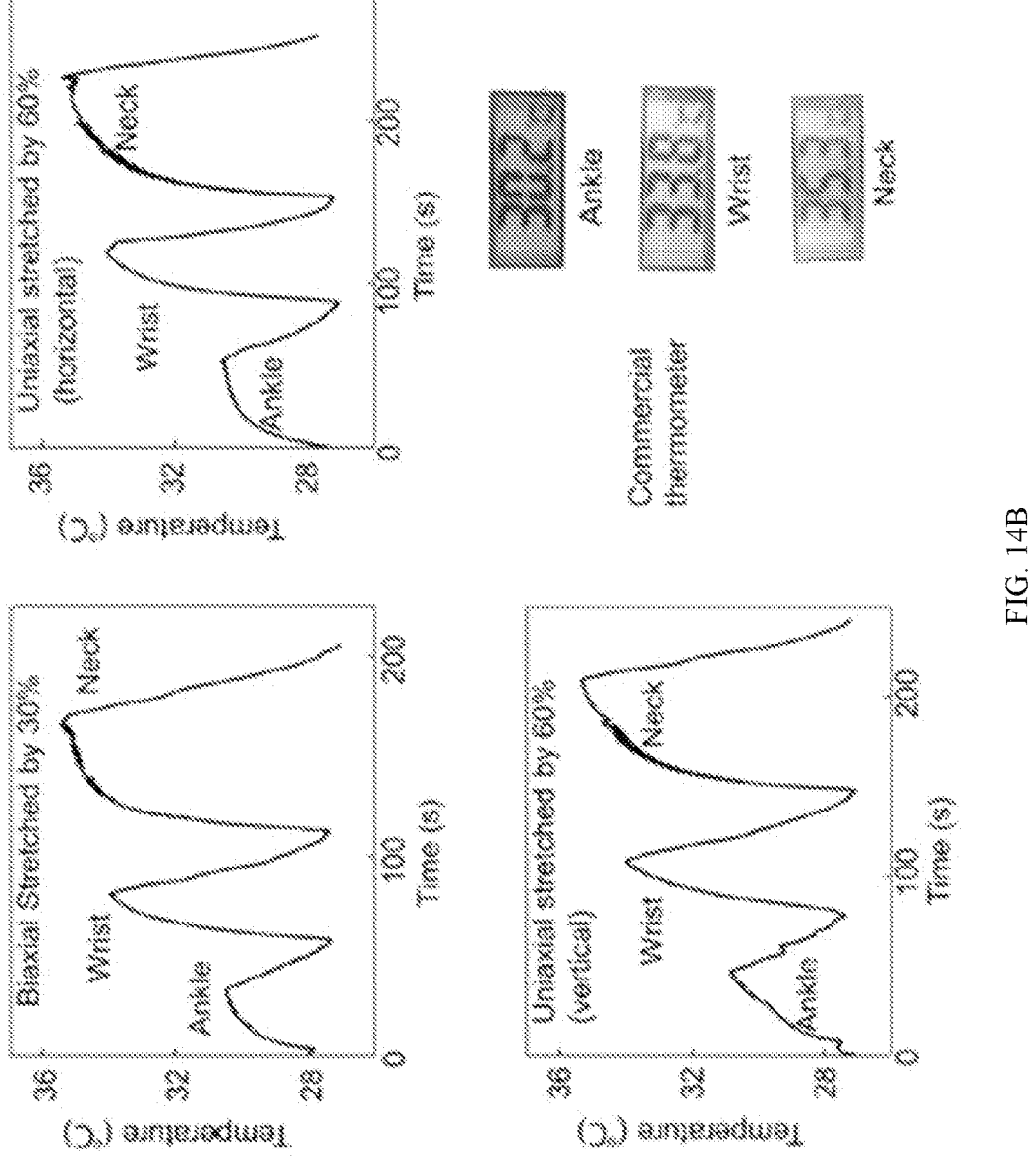

To ensure superior stretchability of the wearable electronics, both elastic polymer substrates and highly stretchable conductors are essential. The mechanical properties of the polyimine film are demonstrated in FIGS. 9A-9C. The uniaxial stress-strain curve as shown in FIG. 9A exhibits a hyperelastic behavior of polyimine, and the initial slope gives the Young's modulus to be 2 MPa. FIG. 9B shows the loading and unloading stress-strain curves of polyimine under cyclic loading test, which exhibits good elasticity with slight hysteresis. For the conductor, as LM is a liquid and can flow, it doesn't add rigidity to the wearable device and provides excellent deformability to the electronic system. How much the LM conductor can be stretched is limited by the polymer encapsulation. As shown in FIG. 9A, the LM conductor encapsulated by polyimine can be stretched by ~200%. Compared with stretchable conductors based on serpentine metal filamentary interconnects or buckled arc-shaped bridges, LM circuitry doesn't have fatigue issues, encapsulation doesn't affect the mechanical performance, and there is no stress concentration in the conductor at the interfaces between the rigid chip components and the soft substrate (FIG. 6C). Furthermore, the LM interconnects are robust and reliable under mechanical disturbances. As shown in FIGS. 10A and 10B, the resistance of a polyimine encapsulated LM conductor subjected to repeated rubbing and pressing recovers to the original value when the mechanical forces are removed. These properties of the LM circuitry lead to superior mechanical stretchability, robustness and reliability in the multifunctional wearable electronics. FIG. 11A shows an as-fabricated, undeformed multifunctional wearable device (left), and its finite element analysis (FEA) model (right). FIGS. 11B and 11C exhibit the multifunctional wearable device being uniaxially stretched by 60% along vertical and horizontal directions, respectively. The FEA results show that the maximum strains in the chip components are below 0.01%, far below the typical failure strain of silicon (~1%). FIG. 11D presents the results of the device being stretched by 30% in both directions (areal strain ~70%). From FEA simulation, the maximum strain in the chip components is below 0.004%. The strain distributions in the polyimine substrate when the device is under different loading conditions are presented in FIG. 12. FIG. 10C shows the resistance data of a LM conductor encapsulated by polyimine subjected to cyclic 60% strain. Since the resistance of the LM conductor is several orders of magnitude smaller than that of the electronic components shown in FIG. 13, the resistance change of the LM conductor during stretching should have negligible effect on the performance of the wearable device. FIG. 11E exhibits the ECG data obtained by the wearable device under 30% biaxial stretching, and 60% uniaxial stretching along vertical and horizontal directions. The sensing performance of the other devices under different loading conditions is shown in FIGS. 14A-14B. No noticeable influence of mechanical stretching on the sensing performance of the device is observed.

Figure 15A:
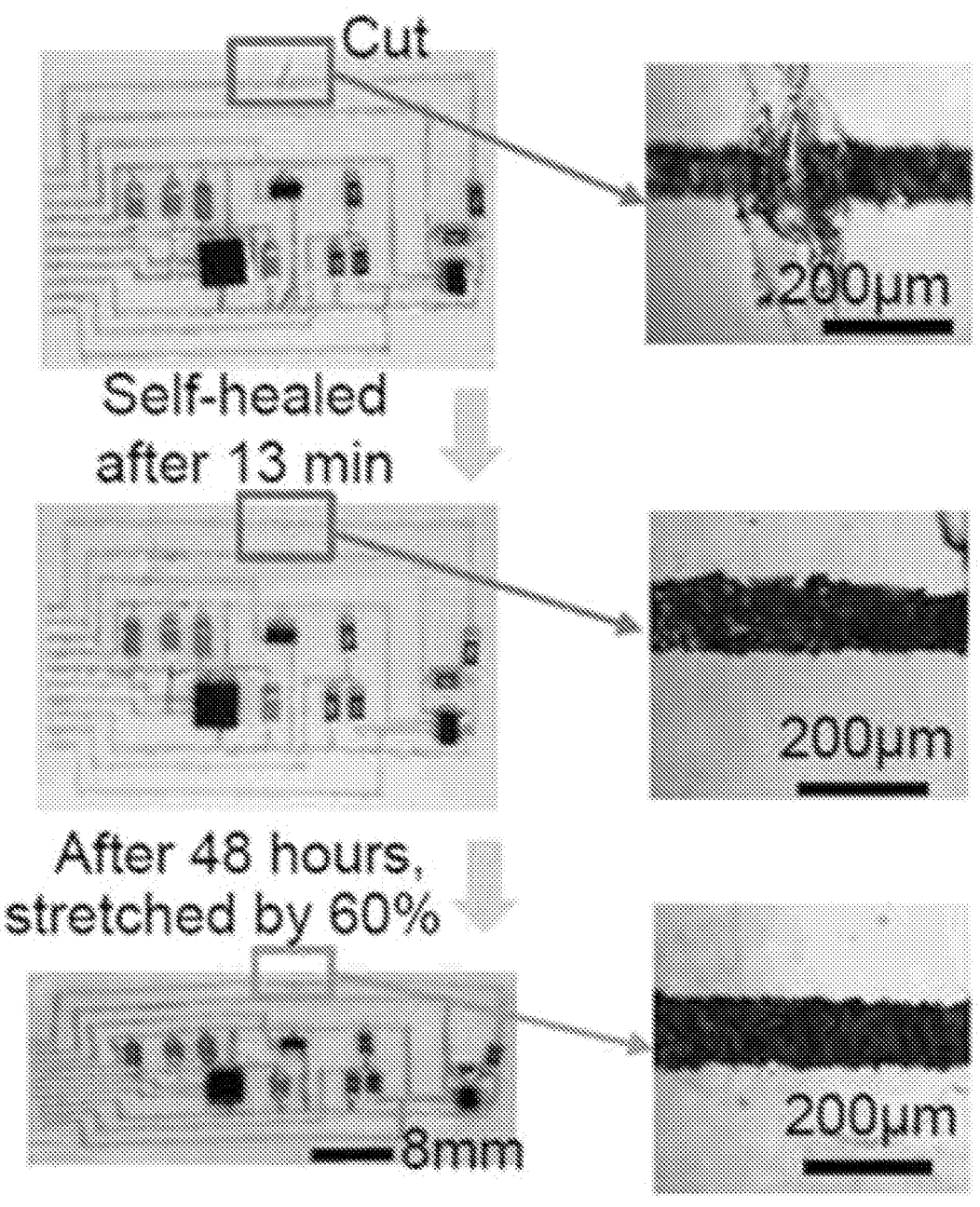
FIGS. 15A-15F depict the self-healing and recycling of the multifunctional wearable electronics.
Figure 15B:
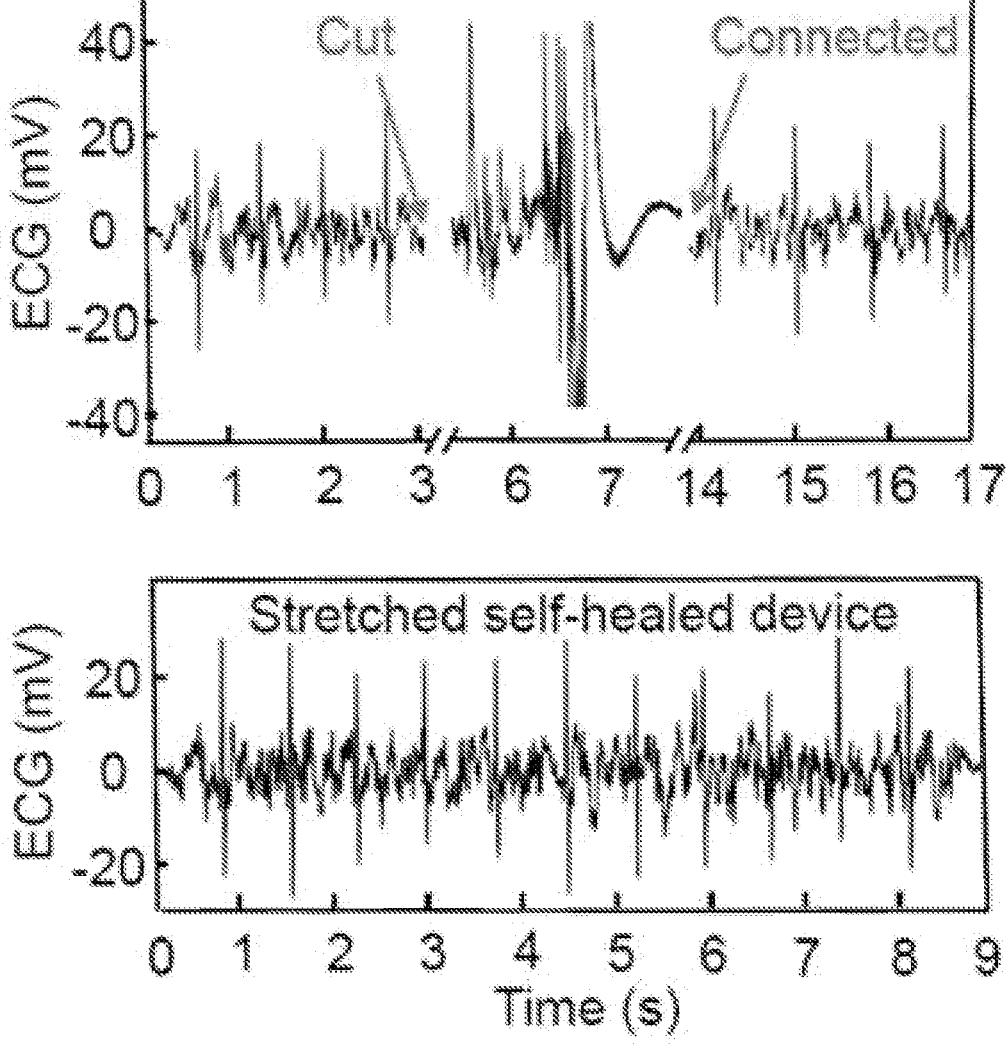
Figure 16A:
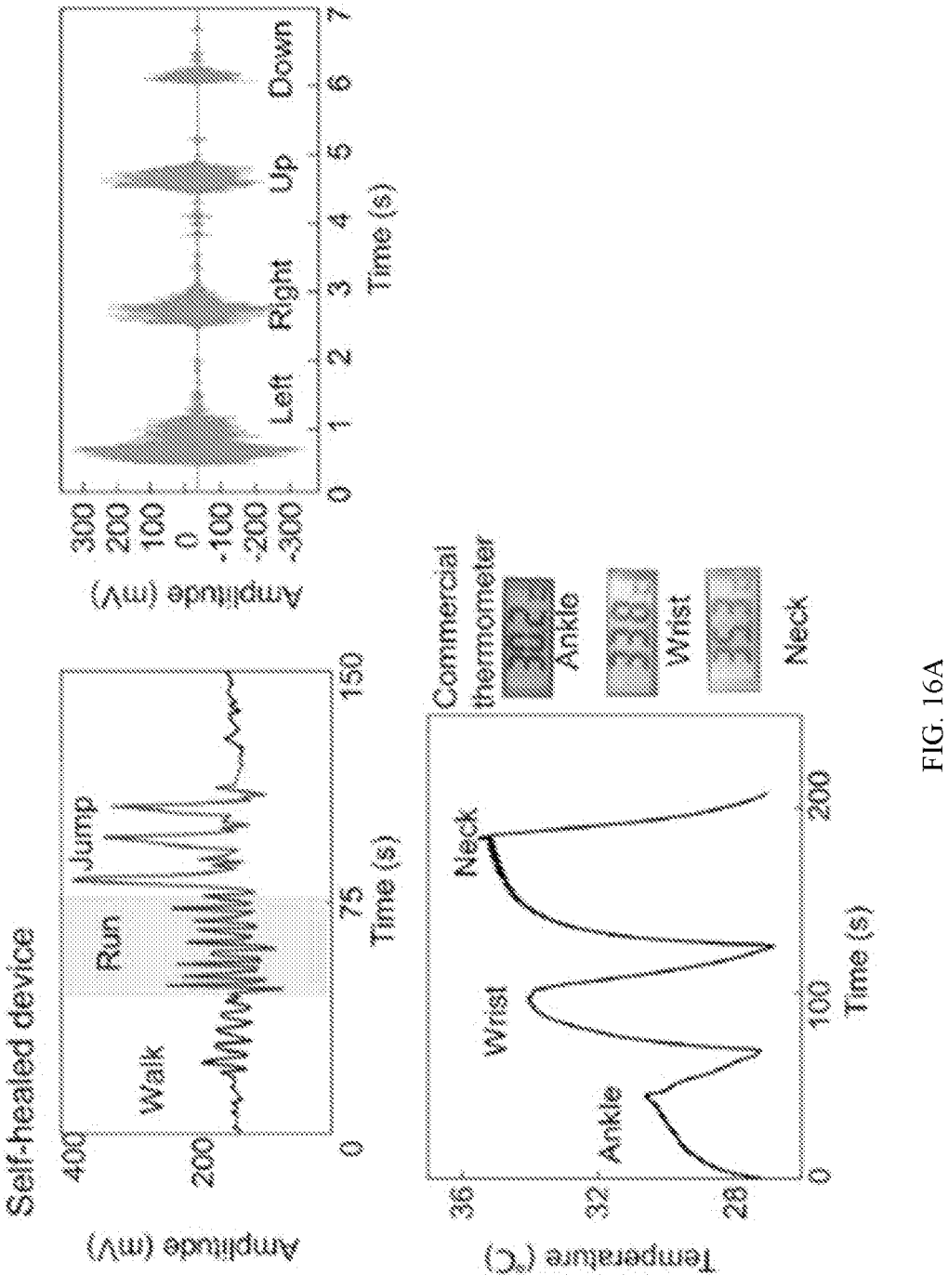
FIGS. 16A-16B depict the sensing performance of self-healed and recycled devices.

In addition to superior mechanical properties, the LM circuitry in polyimine matrix also provides excellent self-healing capability for the multifunctional wearable electronics. As demonstrated in FIG. 15A, when the LM circuit is cut broken by a razor blade (top frame), the ECG signal is lost (FIG. 15B, top). The top inset in FIG. 15A illustrates a magnified view of the broken LM conductor. After slightly pressing the two sides of the cut location, the LM conductor is self-healed, and the ECG sensor regains sensing capability (FIG. 15B, top). After the device self-heals for 13 minutes, the cut is optically invisible (FIG. 15A, middle), even under the optical microscope, as shown by the inset. After 48 hours of self-healing, bond exchange reactions at the interface lead to reformation of sufficient covalent bonds and effective interfacial healing. The mechanical strength of the healed interface is comparable to the original polyimine, as demonstrated by the tensile test results of self-healed LM conductors shown in FIG. 4A. Therefore, the self-healed multifunctional wearable electronics can be stretched by 60% (FIG. 15A, bottom), and the sensing performance is not affected (FIG. 15B, bottom). To effectively improve contact at the interface and to accelerate self-healing, some pressure can be applied on the broken device at room temperature. As shown in FIGS. 4C-4G, by introducing a 90 g weight on the self-healing device, the self-healing time can be reduced to 144 minutes. When the weight is increased to 1000 g, the self-healing time can be further reduced to 13 minutes. All the self-healed devices show mechanical robustness and stretchability comparable to the original device (FIG. 4A). The sensing performances of the other devices, including motion, temperature, and acoustic sensing, are shown in FIG. 16A, which are also comparable to the original sensors. To further demonstrate the self-healing performance, the cutting and self-healing process at the same location of a polyimine encapsulated LM conductor was repeated for 5 times. As shown in FIG. 4B, the resistance recovers to the original value after 5 times cutting and self-healing. The stress-strain curve of the self-healed device shows elasticity comparable to the original device (FIG. 4A). As demonstrated in FIG. 4H, the LM conductor can still be stretched by 100% after 5 times self-healing.

Figure 15C:
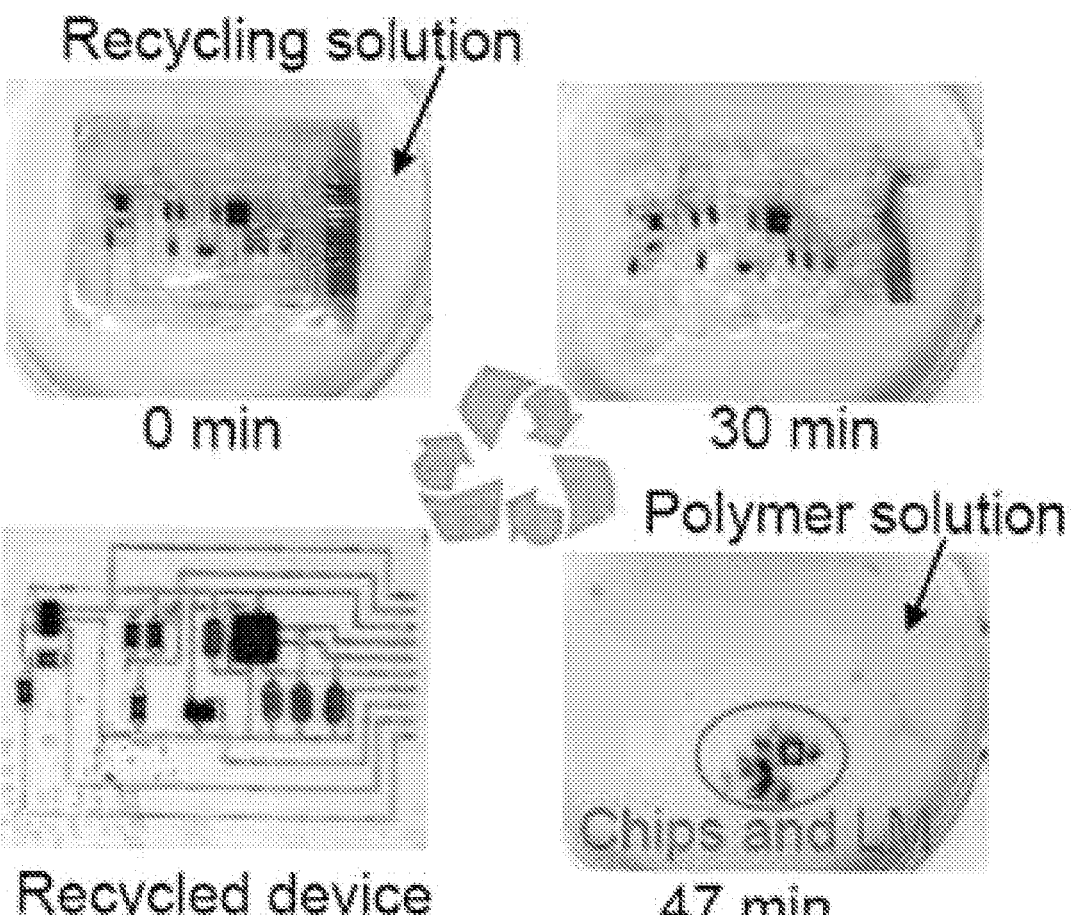
Figure 15D:
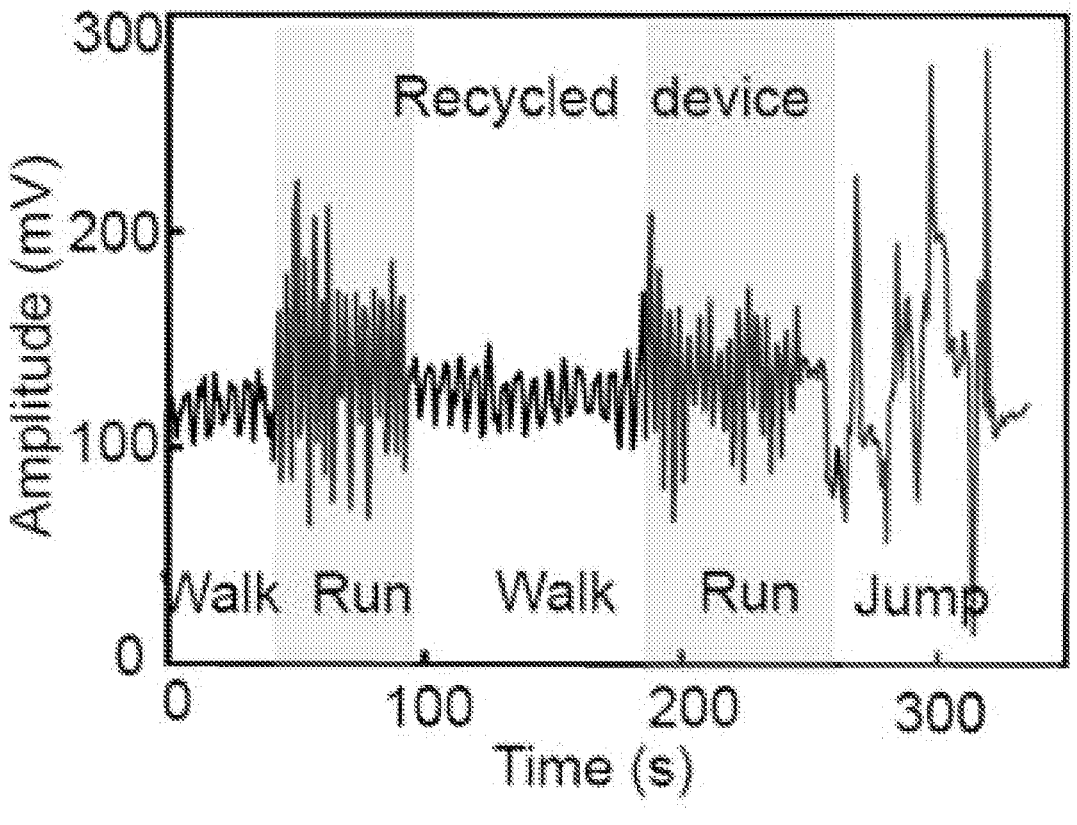
Figure 15F:
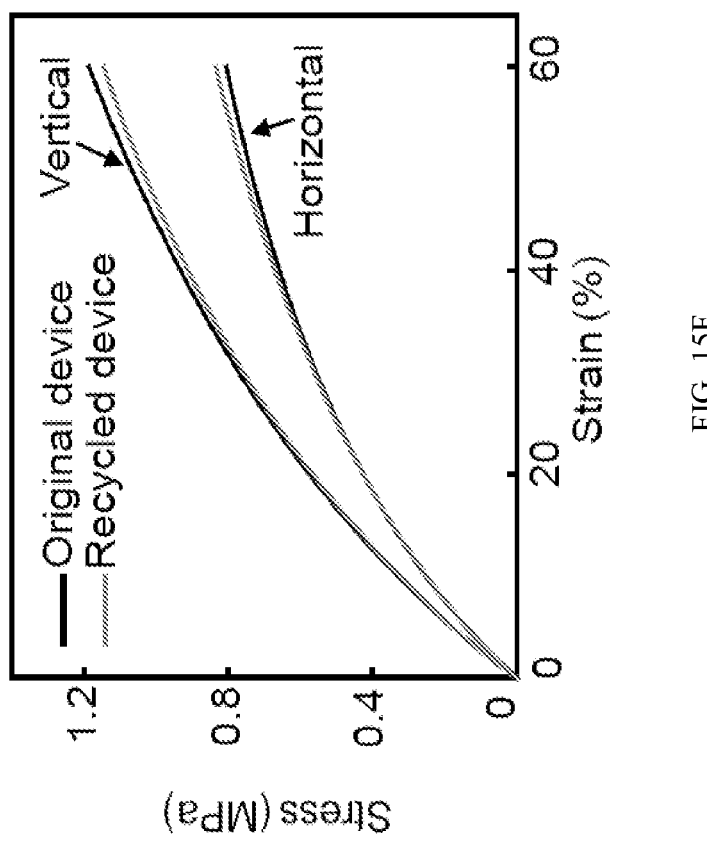
Figure 15E:
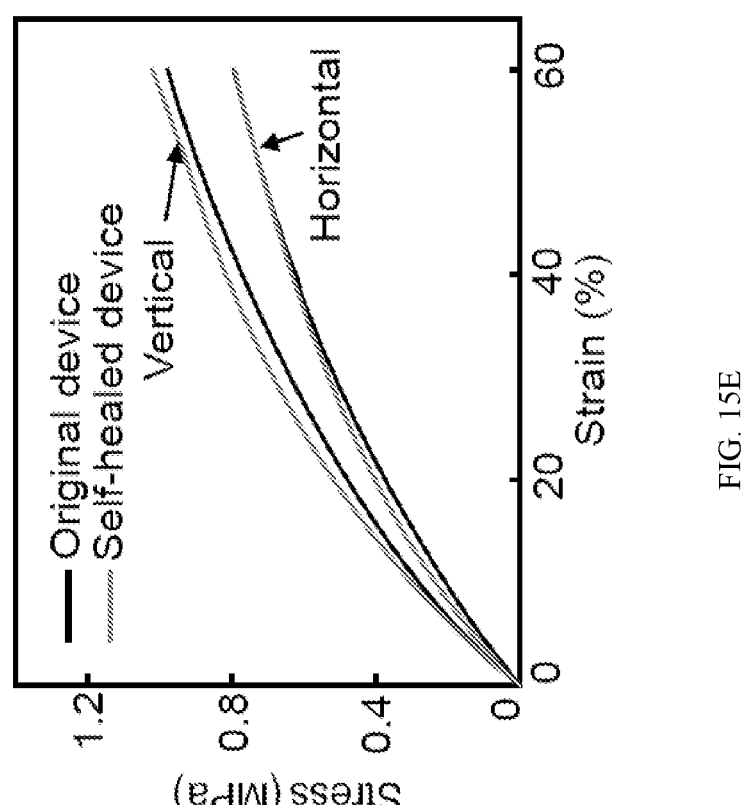
Figure 16B:
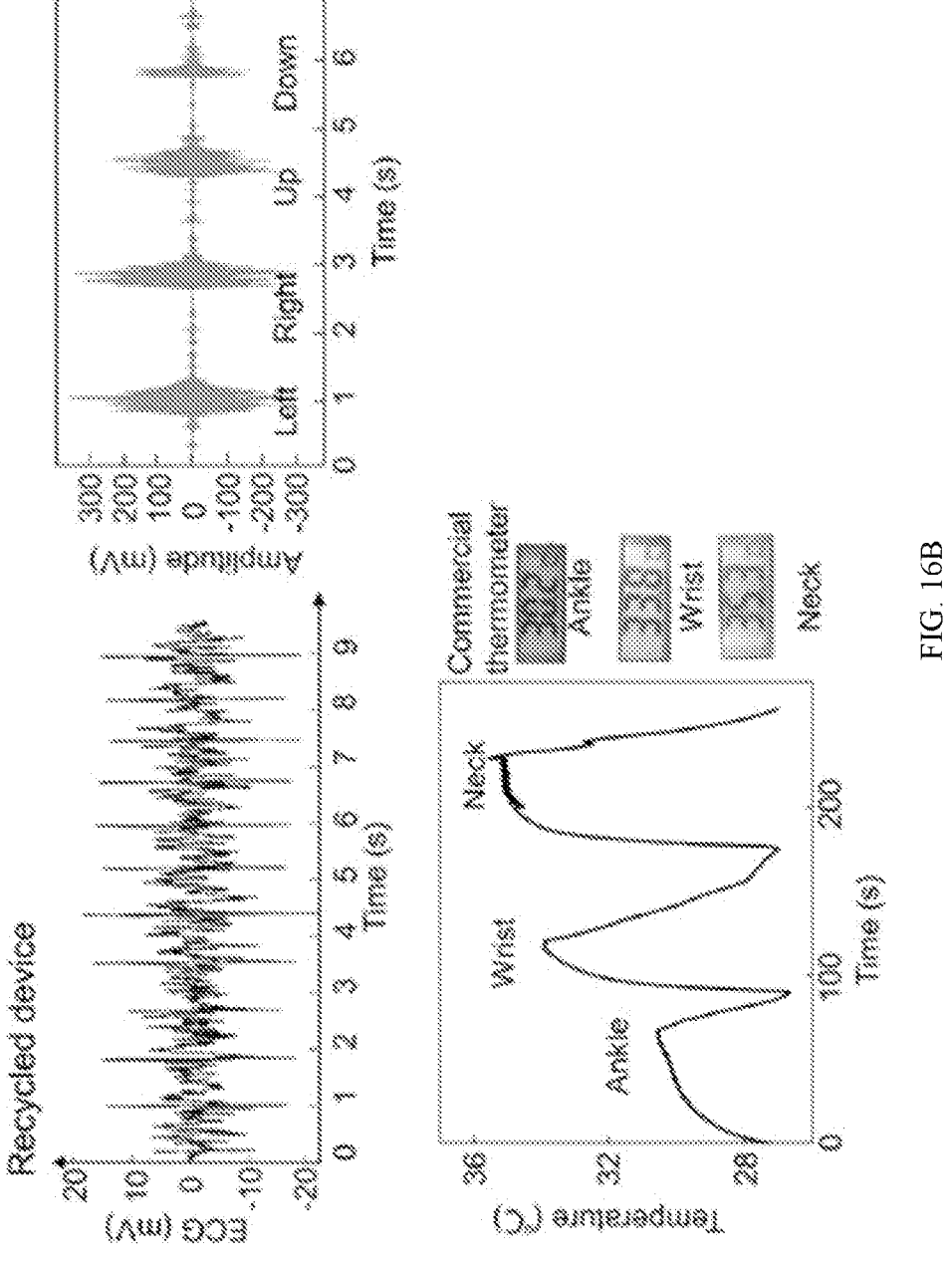

Not only self-healable, the multifunctional electronics is also fully recyclable. When the multifunctional device is soaked in the recycling solution (FIG. 15C, top left), consisting of 3,3'-diamino-N-methyldipropylamine and tris(2-aminoethyl)amine in methanol, the excessive amine monomers can react with the imine bonds inside the polyimine network. Transimination reactions lead to depolymerization of polyimine into oligomers/monomers that are soluble in methanol. The top right and bottom right frames in FIG. 15C show the multifunctional device after being soaked in the recycling solution for 30 and 47 minutes. After 47 minutes, the polyimine matrix is completely depolymerized into oligomers/monomers and dissolved into methanol, the chip components and LM sink to the bottom of the container, which can be easily separated from the solution by using a paper filter. When an appropriate amount of terephthalaldehyde is added to rebalance the stoichiometry between the amine and aldehyde reactants, the recycled solution, chip components and LM can all be reused to make a new multifunctional device (FIG. 15C, bottom left). The recycling process was repeated for 3 times, and the electronic and mechanical performances of the recycled device are shown in FIGS. 15D, 15F, and 16B. The new motion sensor fabricated using the recycled materials shows sensing performance comparable to the original device (FIG. 15D). The sensing performances of the other sensors in the recycled multifunctional device are shown in FIG. 16B. FIG. 15E compares the mechanical property of the self-healed multifunctional electronics with the original device, along both horizontal and vertical directions, which show almost identical curves. The comparison between the recycled multifunctional electronics and the original device in FIG. 15F also shows almost identical mechanical properties in both directions.

Figure 17B:
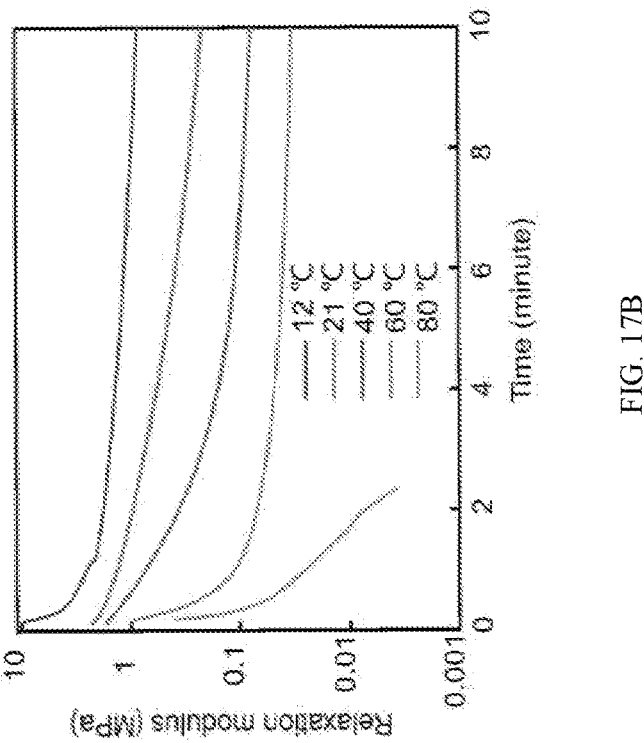
FIGS. 17A-17B depict the elastic properties of the polyimine.
Figure 17A:
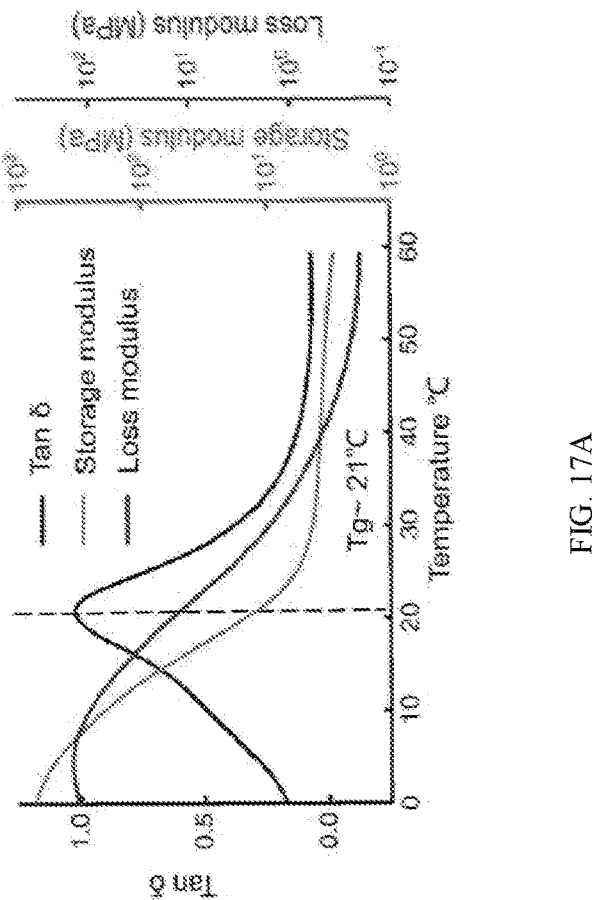

The bond exchange reactions in the dynamic covalent polyimine network enable not only effective self-healing at the interfaces, but also stress relaxation in deformed material, which can be utilized to realize reconfigurable multifunctional electronics. This capability also partially attributes to the fluid behavior of the LM circuitry, as it doesn't add any rigidity or residual stress to the multifunctional wearable electronics. The time and temperature dependent relaxation behavior of the polyimine film can be characterized using dynamic mechanical analyzer (Model Q800, TA Instruments, New Castle, DE, USA). FIG. 17A shows the dependence of storage modulus, loss modulus and tan δ over temperature, and it gives the glass transition temperature of polyimine as 21° C. FIG. 17B gives the results of a series of relaxation tests over a wide range of temperatures (12~80° C.). Specifically, at 60° C., the relaxation modulus decreases from 1 MPa to 0.034 MPa in 10 minutes, which corresponds to 96.6% relaxation of the internal stress in the dynamic covalent network due to bond exchange reactions.

Figure 18A:
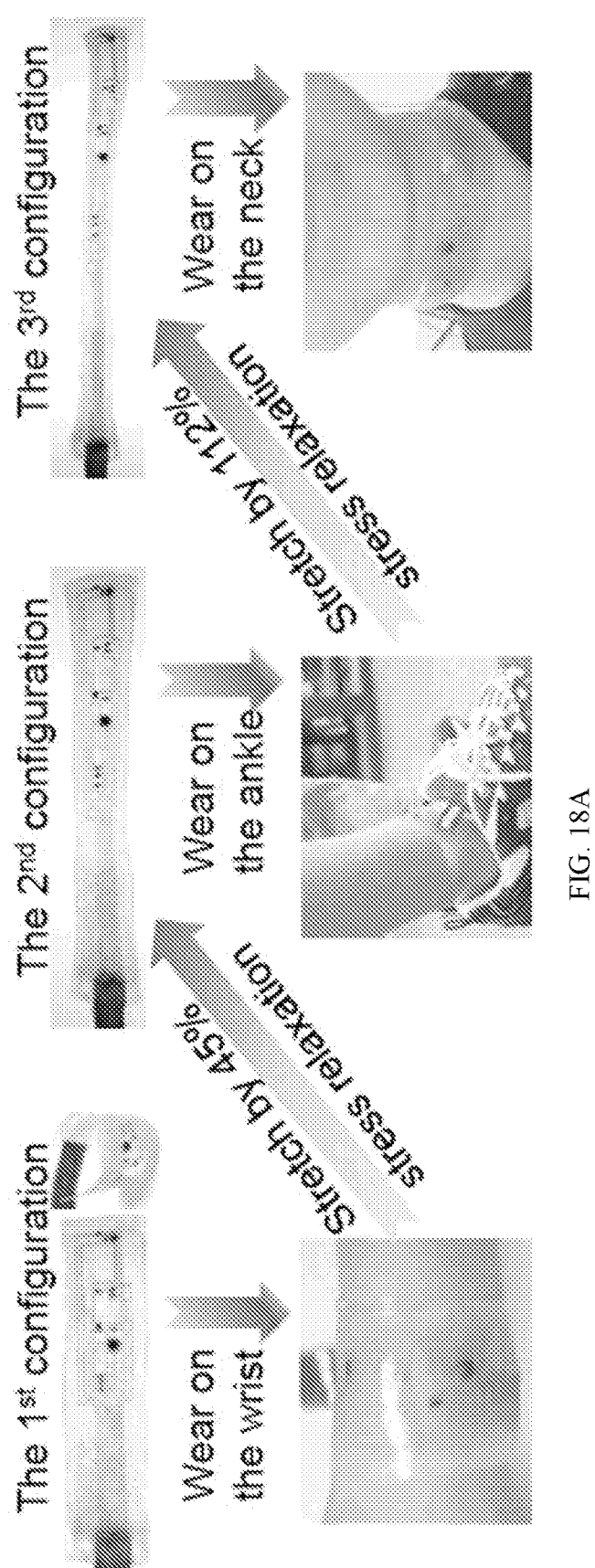
FIGS. 18A-18H depict reconfiguration of the multifunctional wearable electronics.
Figure 18B:
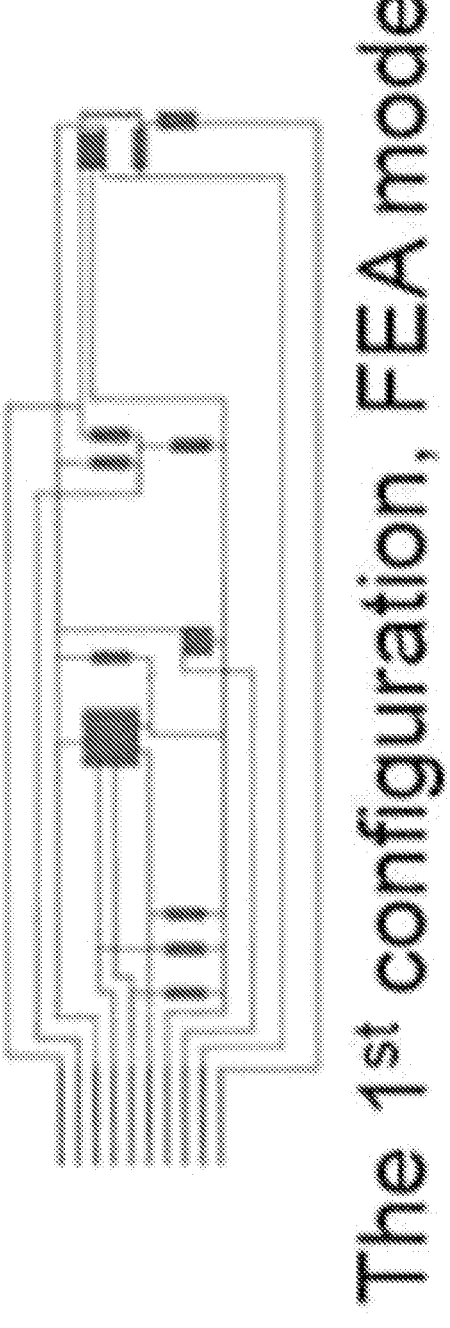
Figure 18C:
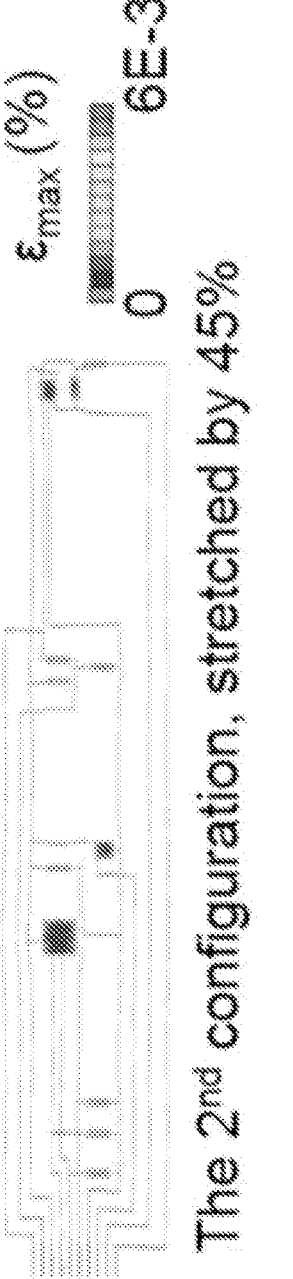
Figure 18D:
Figure 18D:
Figure 18F:
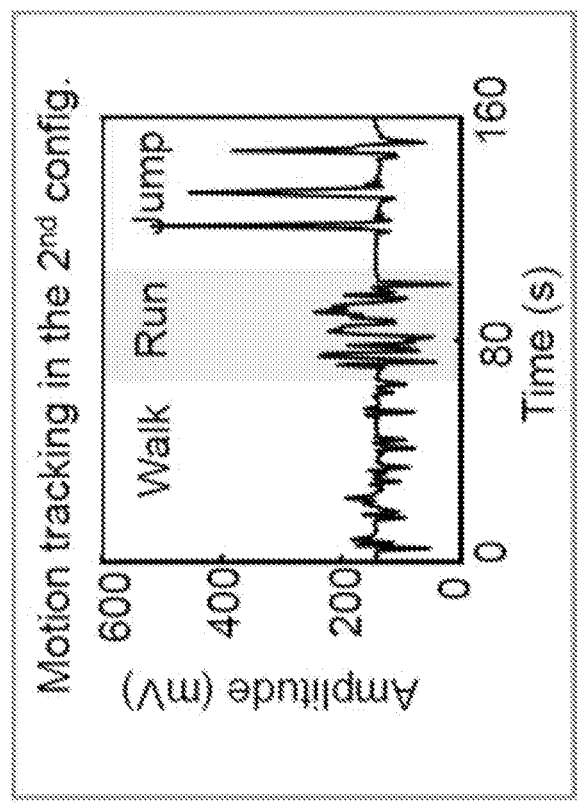
Figure 18E:
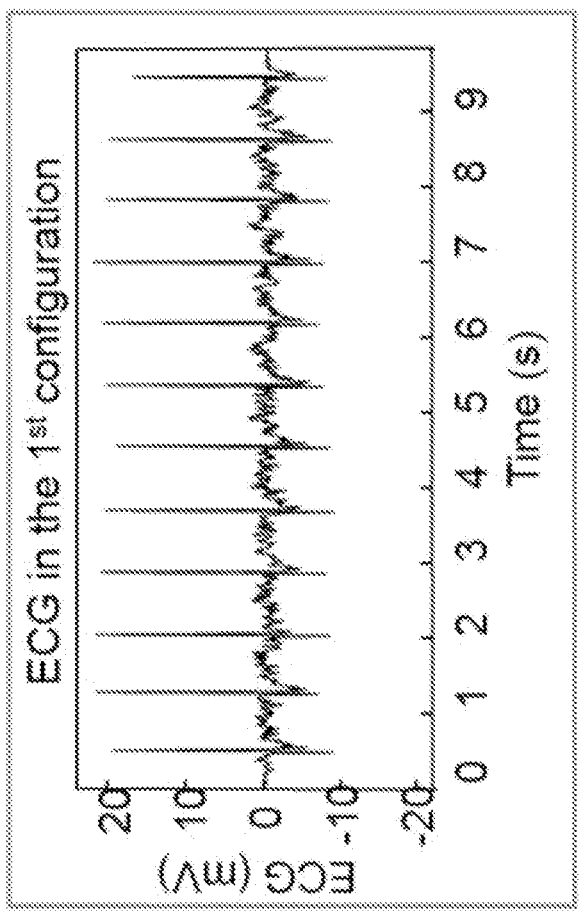
Figure 18H:
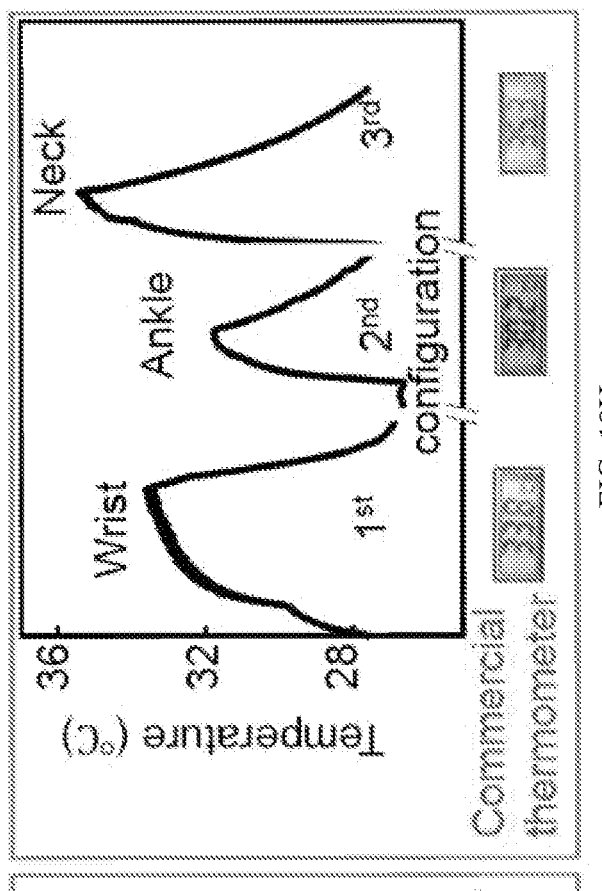
Figure 18G:
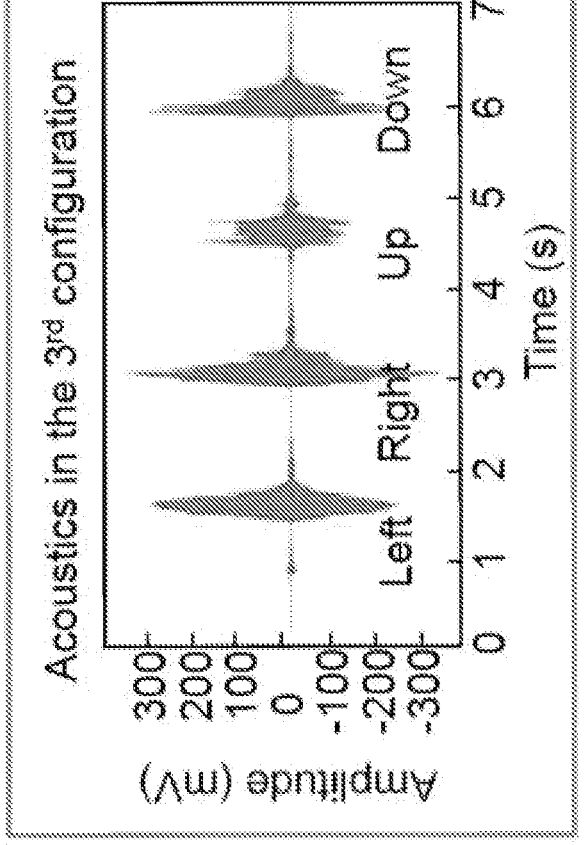
Figure 19A:
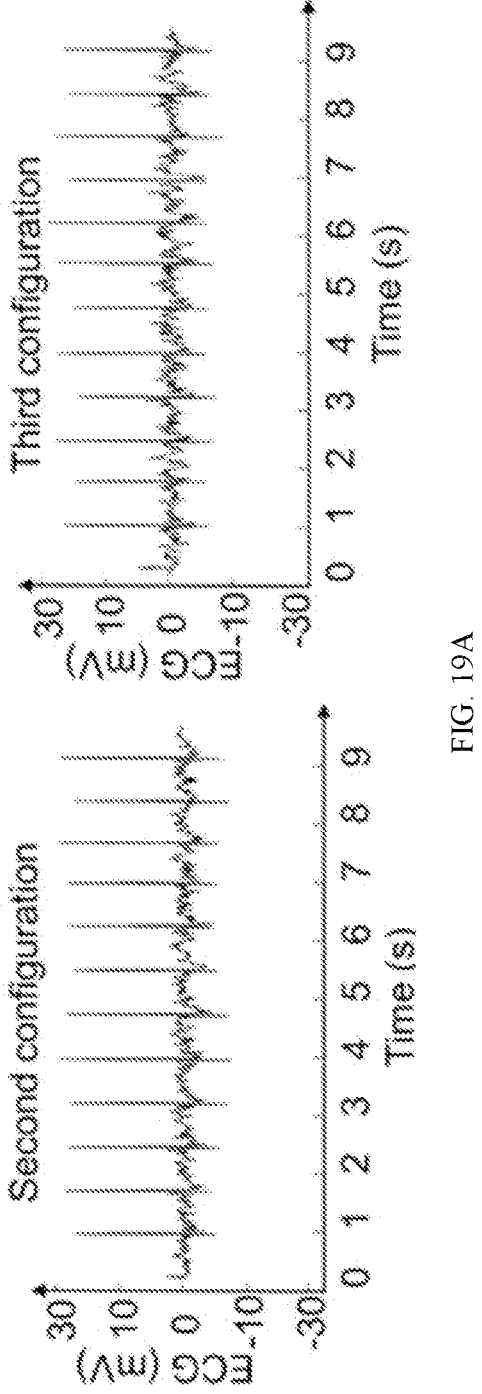
FIGS. 19A-19C depict sensing data of the wearable electronics in its various configurations.
Figure 19B:
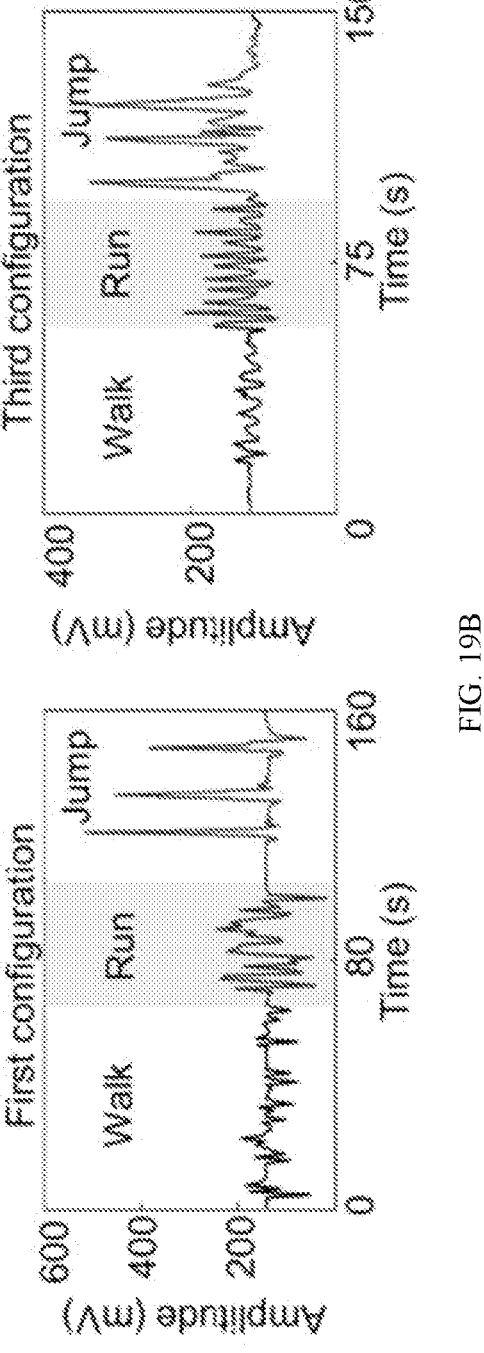
Figure 19C:
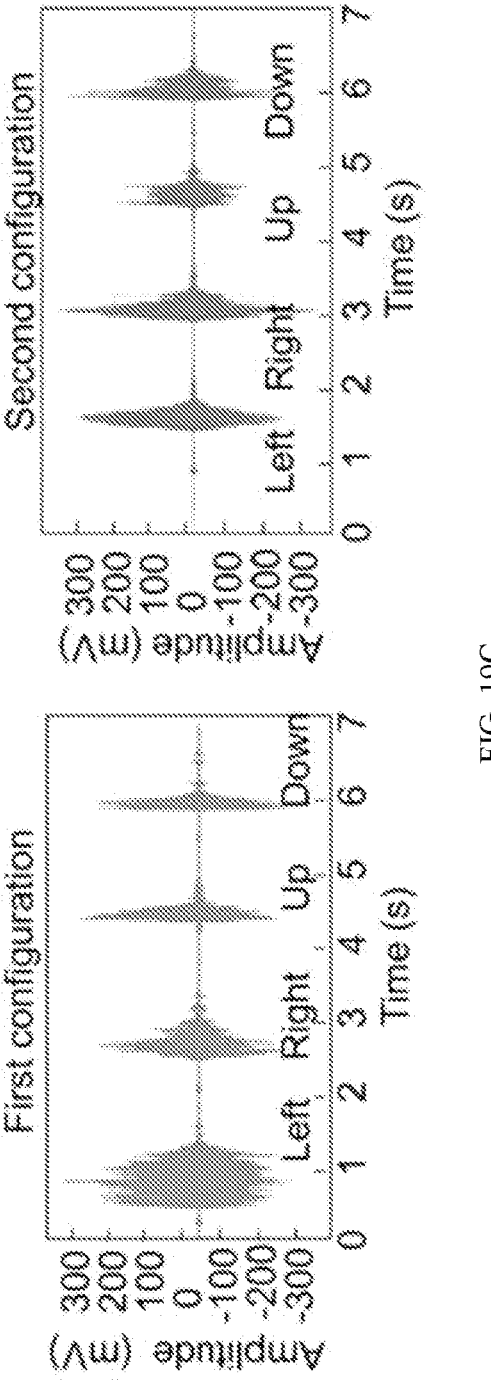

By harnessing the effective stress relaxation in the polyimine network at elevated temperature and the fluid behavior of the LM circuitry, the multifunctional wearable electronics can be reconfigured into distinct configurations that suit for different application scenarios. As demonstrated in FIG. 18A, an initially flat multifunctional wearable device (160 mm long, the first configuration, top left) can be worn on the wrist by relaxing the stress induced by bending (bottom left). Then the device is stretched by 45% and heated to 60° C. to relax the stress, which yields the second flat configuration of the multifunctional device (232 mm long, top middle). It can be further wrapped onto the ankle and stress relaxation keeps the bent state of the device on the ankle (bottom middle). Further stretching the device by 112% and applying heat results in the third flat configuration of the multifunctional device (340 mm long, top right). It is then bent against the neck, and bending induced stress can also be relaxed to make sure the device stays on the neck for reliable sensing (bottom right). This process represents totally six different configurations. Optical microscope images in FIG. 6C prove robust connection between the LM circuitry and the rigid chip components under extreme deformation. Here, relatively thick polyimine films were used for the reconfigurable device, however, much thinner polyimine films can also be adopted, as shown in FIG. 9C, for improved flexibility and conformability. FIGS. 18B, 18C, and 18D present the FEA simulation results of the flat states of the three different flat configurations. The maximum strains in the chip components are less than 0.01%, far below the failure strain of silicon (~1%). FIG. 18E shows the ECG measurement from the device in its first configuration, worn on the wrist. FIG. 18F presents the motion tracking data of the accelerometer in the multifunctional wearable electronics when it's worn on the ankle in the second configuration. FIG. 18G exhibits the acoustic sensing of the device in its third configuration, when wrapped around the neck. The temperature monitoring at the wrist, the ankle and the neck in three different configurations of the same multifunctional wearable device is shown in FIG. 18H, indicating different temperature at different parts of the body, which agrees well with data obtained from a commercial thermometer. The sensing data of all the sensors in the wearable device in different configurations are presented in FIGS. 19A-19C, proving robust sensing performance of the device during reconfiguration. Here, totally 5 times reconfiguration processes have been demonstrated. However, if the applied total stretch is kept below 200%, the device can be reconfigured for many times.

Conclusions

Herein, a highly stretchable, self-healable, recyclable and reconfigurable multifunctional wearable electronic system has been demonstrated that can provide physical motion tracking, body temperature monitoring, and sensing of acoustic and ECG signals. The wearable electronics is realized by electrically interconnecting high-performance, off-the-shelf chip components using liquid metal circuitry, and encapsulated with a dynamic covalent thermoset polyimine matrix. The wearable electronics can be stretched uniaxially by 60% in both horizontal and vertical directions and biaxially by 30% without affecting the electrical sensing performance. Enabled by the bond exchange reactions in the polyimine network and fluid behavior of the liquid metal circuitry, the wearable electronics can self-heal from damages, and can be reconfigured into distinct configurations for different application scenarios. When severely damaged or no longer needed, the wearable electronics can be fully recycled, leading to oligomers/monomers dissolved in methanol, and chip components and liquid metal can be separated from the solution. The recycled solution, chip components and liquid metal can be reused to make new-generation materials and devices. This work can find applications in many areas, including health care, prosthetics, robotics, and human-computer interfaces, and can benefit the wellbeing, economy, and sustainability our society.

Example 2: Recyclable, Healable, and Stretchable High-Power Thermoelectric Generator Direct energy conversion based on thermoelectric (IE) materials is a long-term and maintenance-free energy harvesting technique, and therefore is very promising for self-powered wearable electronics. Yet, it is challenging to achieve high-performance stretchable, healable, and even recyclable thermoelectric generators (TEGs) without compromising IE conversion performance due to the intrinsic mechanical rigidity and brittleness of the inorganic IE materials. Herein, recyclable, healable, and stretchable TEGs (RIS-TEGs) are reported that are assembled from commercial $Bi_2Te_3$ and $Sb_2Te_3$ TE legs generating superior power density via the use of liquid metal as interconnects and dynamic covalent thermoset polyimine as encapsulation. The TEGs fabricated using this strategy are endowed with excellent TE performance, mechanical compliance, and healing and recycling capabilities. The normalized output power density and mechanical stretchability can reach up to 1.08 $\mu$W cm$^{-2}$-K$^2$ and 50%, respectively. After healing and recycling, the TEGs show output performance comparable to the original devices. The TEGs also exhibit high reliability and stability under cyclic deformation. This study paves the way for sustainable application of TEGs as energy harvesters to power wearable electronics using body heat.

Comments

Thermoelectric generators (TEGs), consisting of alternately connected P and N-type thermoelectric (TE) legs by metal electrodes, are very promising sustainable energy conversion devices that generate electricity directly from heat based on the Seebeck effect. The advantages of TEGs over many other power supply systems are direct energy harvesting from environment without mechanical parts, long-lasting, maintenance-free, portable, etc. Therefore, TEGs are especially suitable for applications in self-powered electronic systems. Most high-performance TE materials are inorganic semiconductors, which show high figure of merit values and have irreplaceable applications as power supply systems in space exploration, such as radioisotope TE generators. Nevertheless, traditional inorganic TE materials are mechanically rigid and fragile, thus are not compatible with heat sources with complex surfaces, obstructing their applications in distributed power supply systems, especially wearable electronics.

Two main strategies have been developed to address these issues. One strategy used intrinsically flexible TE materials, including conducting polymers, carbon-based materials, and highly plastic semiconductors. Despite these attractive developments, the intrinsically flexible TE materials still suffered inferior TE properties, and the TEGs based on these films were usually constructed using in-plane configurations that made them difficult to build matched thermal impedance when harvesting heat from human body. Quite recently, ionic TE materials as another candidate for thermal energy conversion, showed a magnitude larger temperature gradient driven voltage based on Soret effect than typical electronic TE materials based on electrons/holes diffusion. However, most of the ionic TEGs only functioned at high humidity, for example, 80 RH %, which severely limited their applications.

The other strategy was based on micro/nano structural design to realize mechanical compliance for rigid inorganic materials, where rigid n/p bulk materials were integrated using stretchable interconnects, such as silver-nanowire based electrodes, wavy serpentine copper wires, and liquid metal, and packaged using stretchable elastomeric matrix. Several groups have demonstrated superiority of this strategy in developing high-performance flexible TEGs. These strategies retain the high performance of inorganic TE materials, yet leaves the major deficiencies of current commercial TEGs addressed to less extent, that is, not capable of self-healing when under external damage, in particular the recyclability not been demonstrated, which is important considering the consumption of large amount of low-abundance Te element in commercial TEGs.

Herein, we report a recyclable, healable, and stretchable TEG (RHS-TEG), which integrates 200 pairs of commercial n/p $Bi_2Te_3$ and $Sb_2Te_3$ TE legs, intrinsically stretchable and self-healable liquid metal (EM) EGaIn interconnects, and dynamic covalent thermoset polyimine encapsulation, by employing low-cost and scalable laser processing, screen printing and flexible packaging techniques. This TEG simultaneously possesses the merits of superior normalized power density of 1.08 $\mu$W c$^{-2}$·K$^2$, excellent stretchability up to 50%, full recyclability, and healing capability.

Non-Limiting Results and Discussion

Figure 20A:
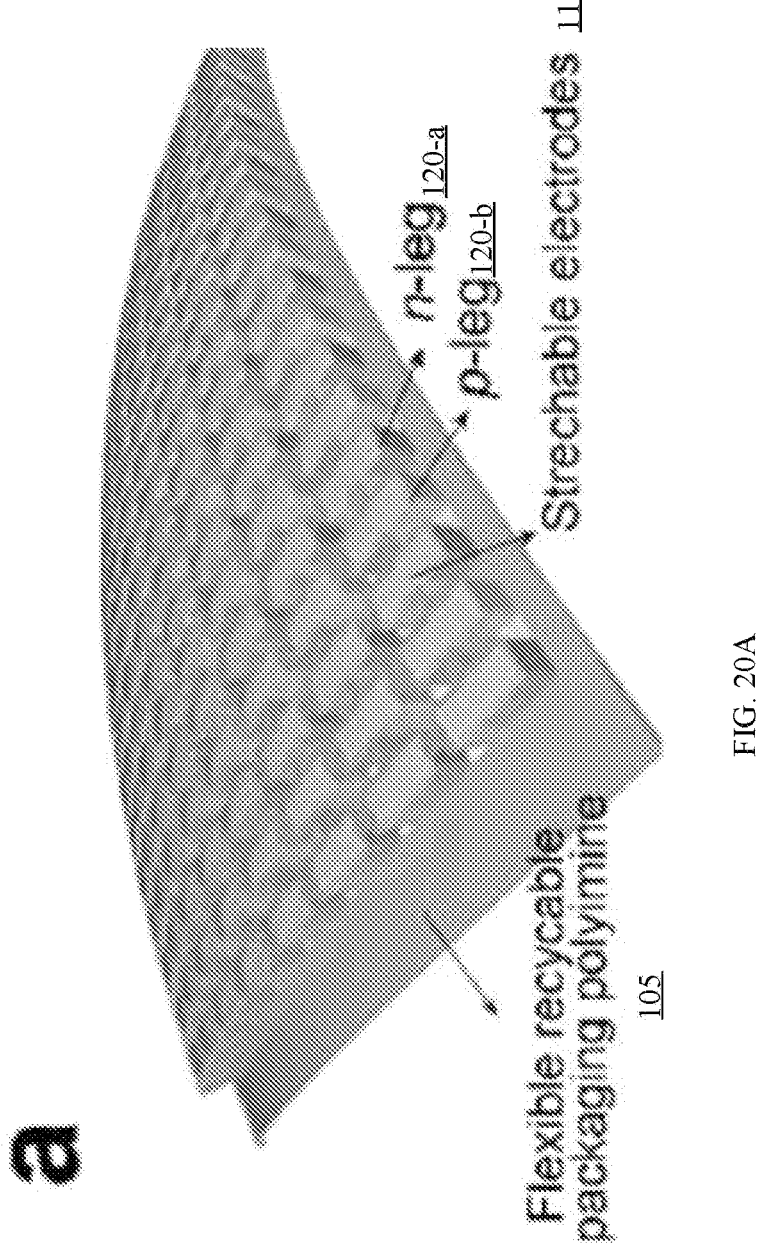
FIGS. 20A-20E depict design and fabrication of a recyclable, healable, and stretchable thermoelectric generator (RHS-TEG).
Figure 20B:
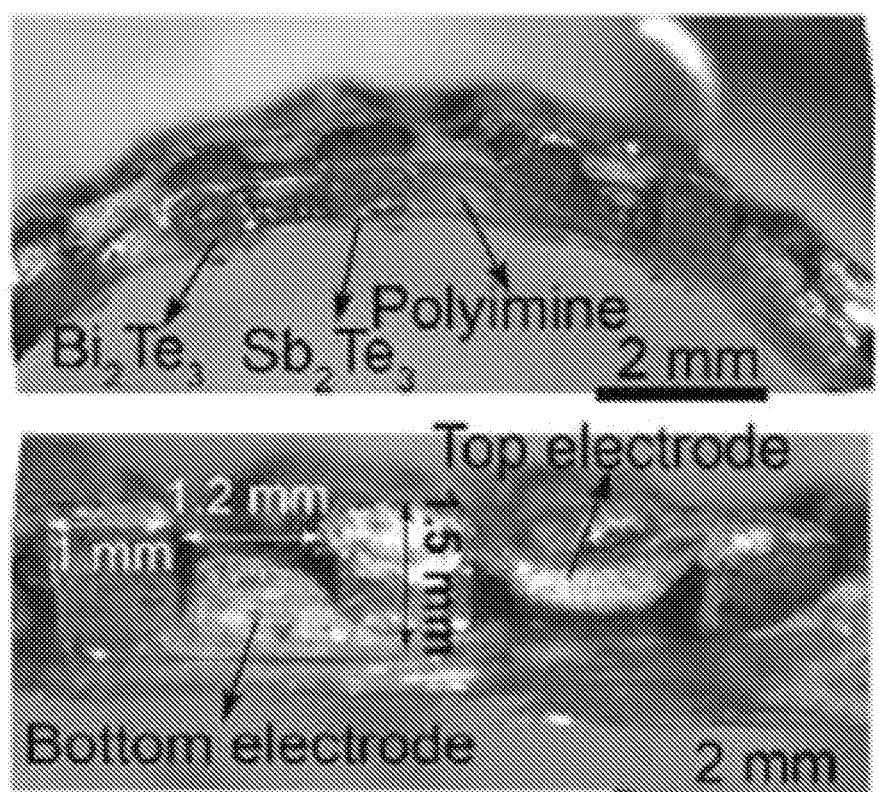
Figure 20C:
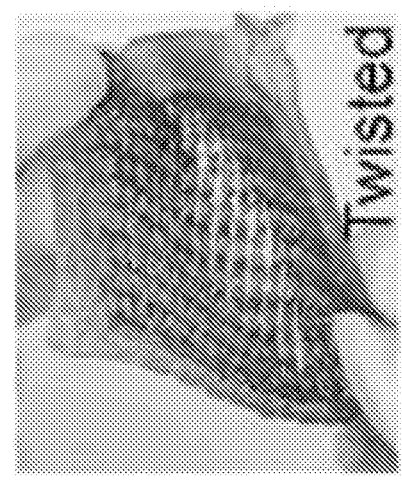
Figure 20C:
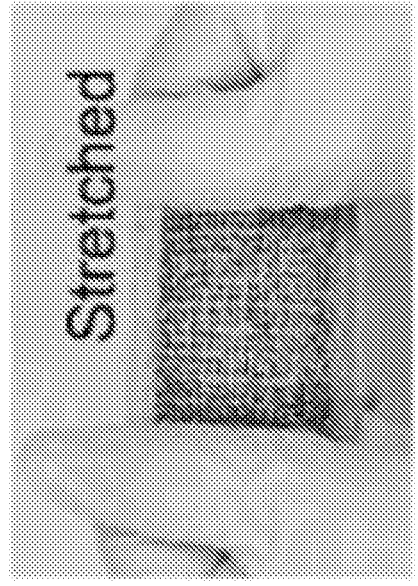
Figure 20C:
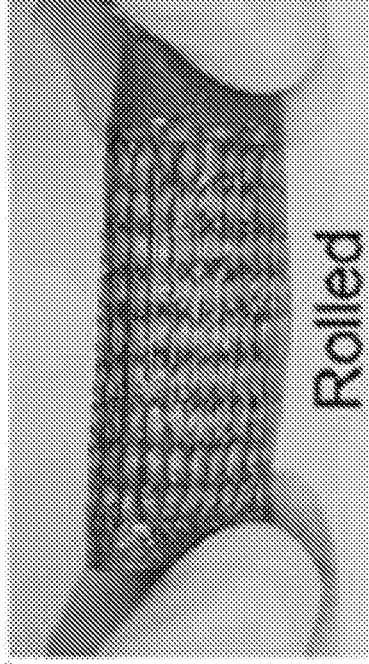
Figure 20C:
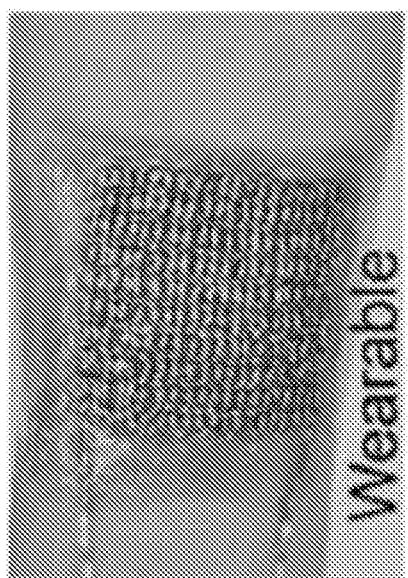
Figure 20D:
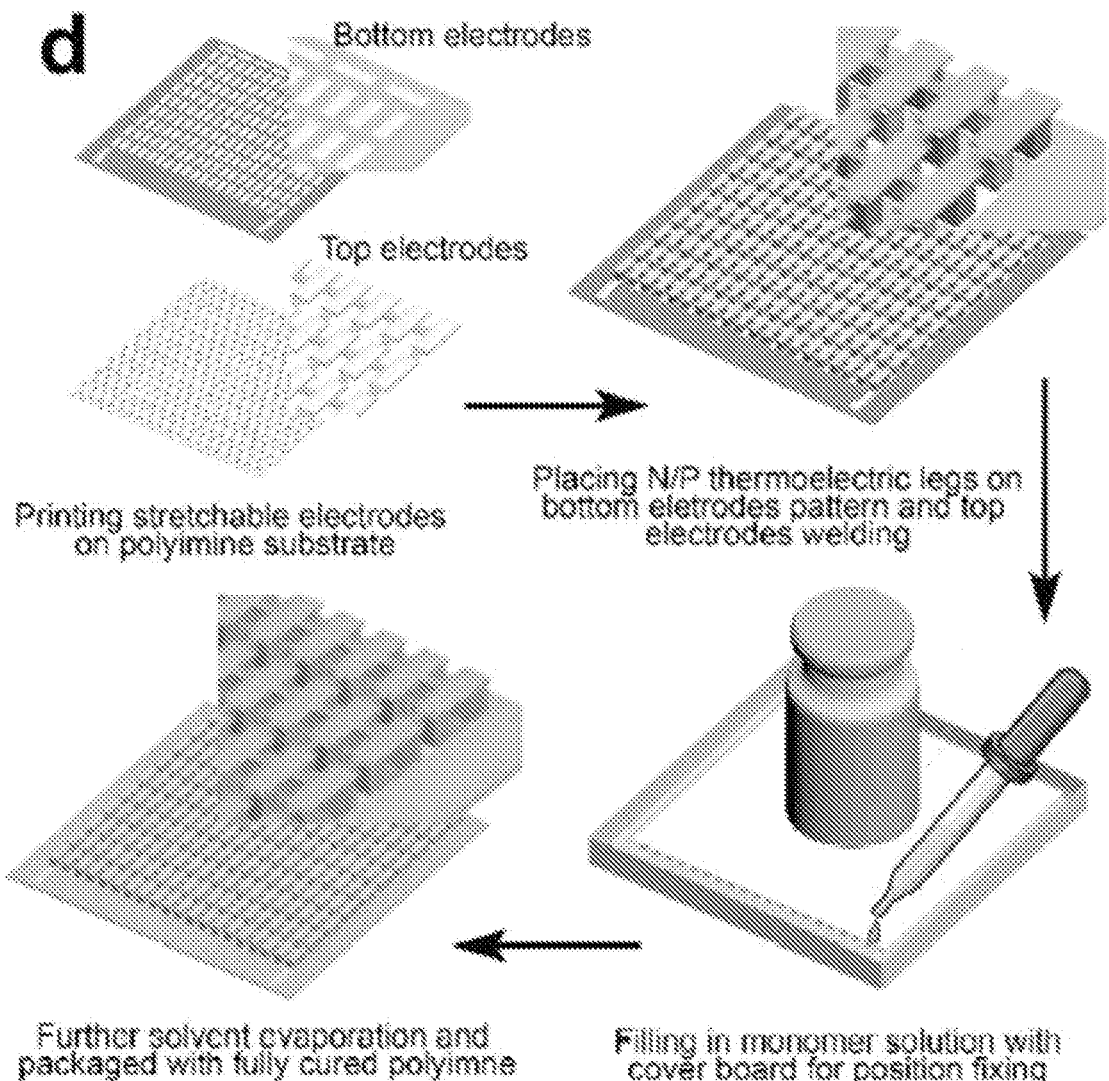

A schematic illustration of the configuration of the RHS-TEG is presented in FIG. 20A. Photos of the cross-section of the device in bent (up) and flat (down) states are shown in FIG. 20B, which clearly show the layout of constituent components. $Bi_2Te_3$ and $Sb_2Te_3$ legs are evenly distributed in polyimine with LM electrodes compactly adhered on two ends of TE legs. When the device is bent, both the TE legs and electrodes are well preserved without splitting or cracking. Photos of an RHS-TEG in various deformation conditions are shown in FIG. 20C, such as being rolled, twisted, stretched, and conformally adhered to an arm, demonstrating its excellent compliance to mechanical deformation and adaptivity to irregular surfaces. The detailed fabrication process of the RHS-TEG is illustrated in FIG. 20D. The process starts with screen printing of top and bottom LM electrodes on polyimine films. 200 pairs of n/p $Bi_2Te_3$ and $Sb_2Te_3$ TE legs are alternately placed on bottom electrodes, followed by attaching top electrodes. The gap between the top and bottom electrodes is then filled with polyimine solution. After polymerization and solvent evaporation, the RHS-TEG is packaged with fully cured dynamic covalent polyimine. The area size of the device encapsulated 200 pairs n/p TE legs is 50×45 mm$^2$, and the internal resistance is 10Ω.

Figure 20E:
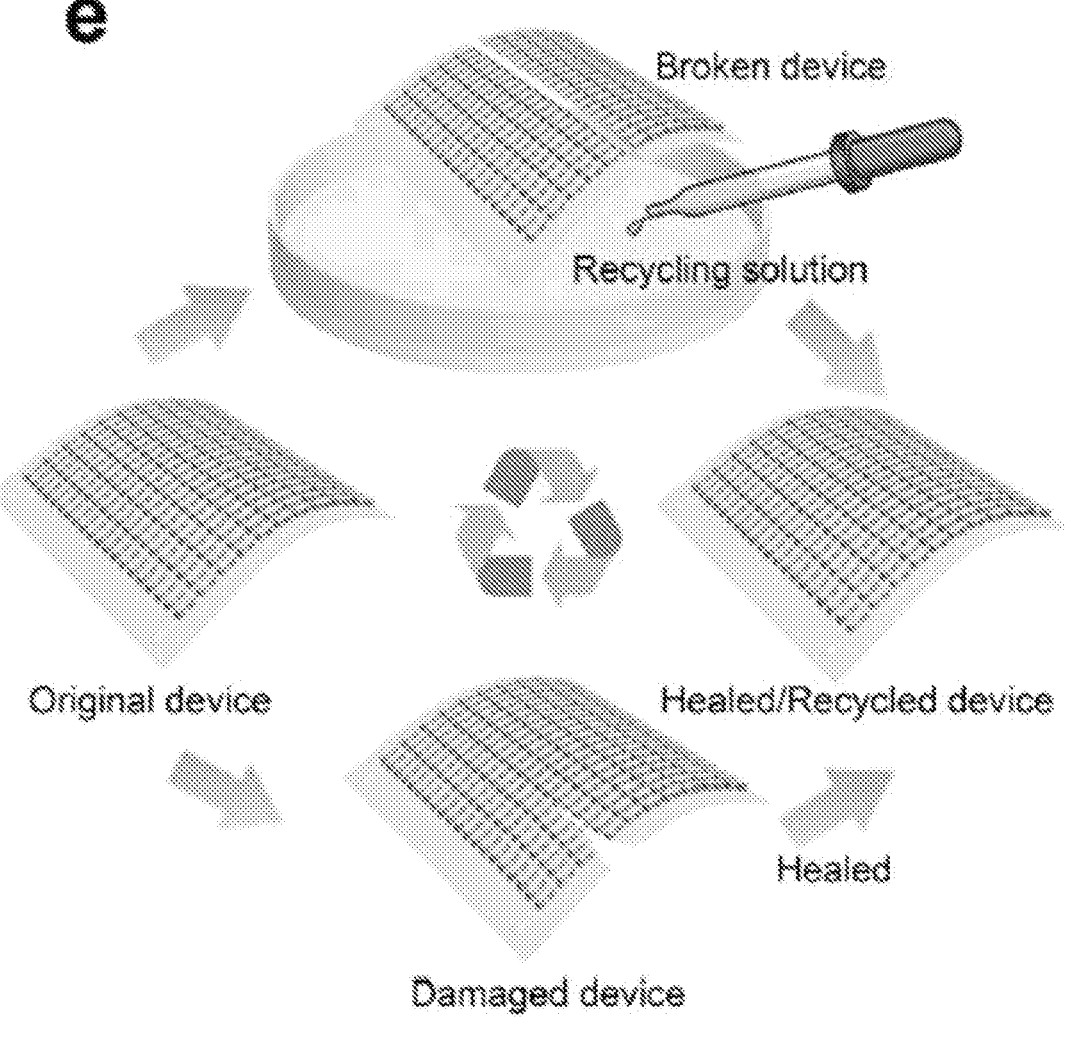

The special characteristics of polyimine enable recycling and healing capabilities of the RHS-TEG. As illustrated in FIG. 20E, when an RHS-TEG is damaged, gently pushing the broken parts into contact leads to instantaneous healing of the LM interconnect due to its flowability. Bond exchange reactions in polyimine network generate covalent bonds across the interface and heal the polymer matrix. To improve the mechanical strength after healing, small amount of uncured monomer solution can also be applied during the healing process. It should be noted that different from self-healing materials using noncovalent interactions (e.g., hydrogen bonding, metal-ligand coordination, etc.), the polyimine matrix used in this study consists of covalent bonds, which makes the devices more robust and stable, and operable under broader conditions. The healed device regains both mechanical and electrical functions. When the device is severely damaged or no longer needed, it can be immersed into the recycling solution consisting of 3,3'-diamino-N-methyldipropylamine, tris(2-aminoethyl)amine, and methanol as solvent. When polyimine is completely depolymerized in the recycling solution, the TE legs and LM electrodes can be easily separated from the solution, and all the components can be reused for a brand new device.

Figure 21:
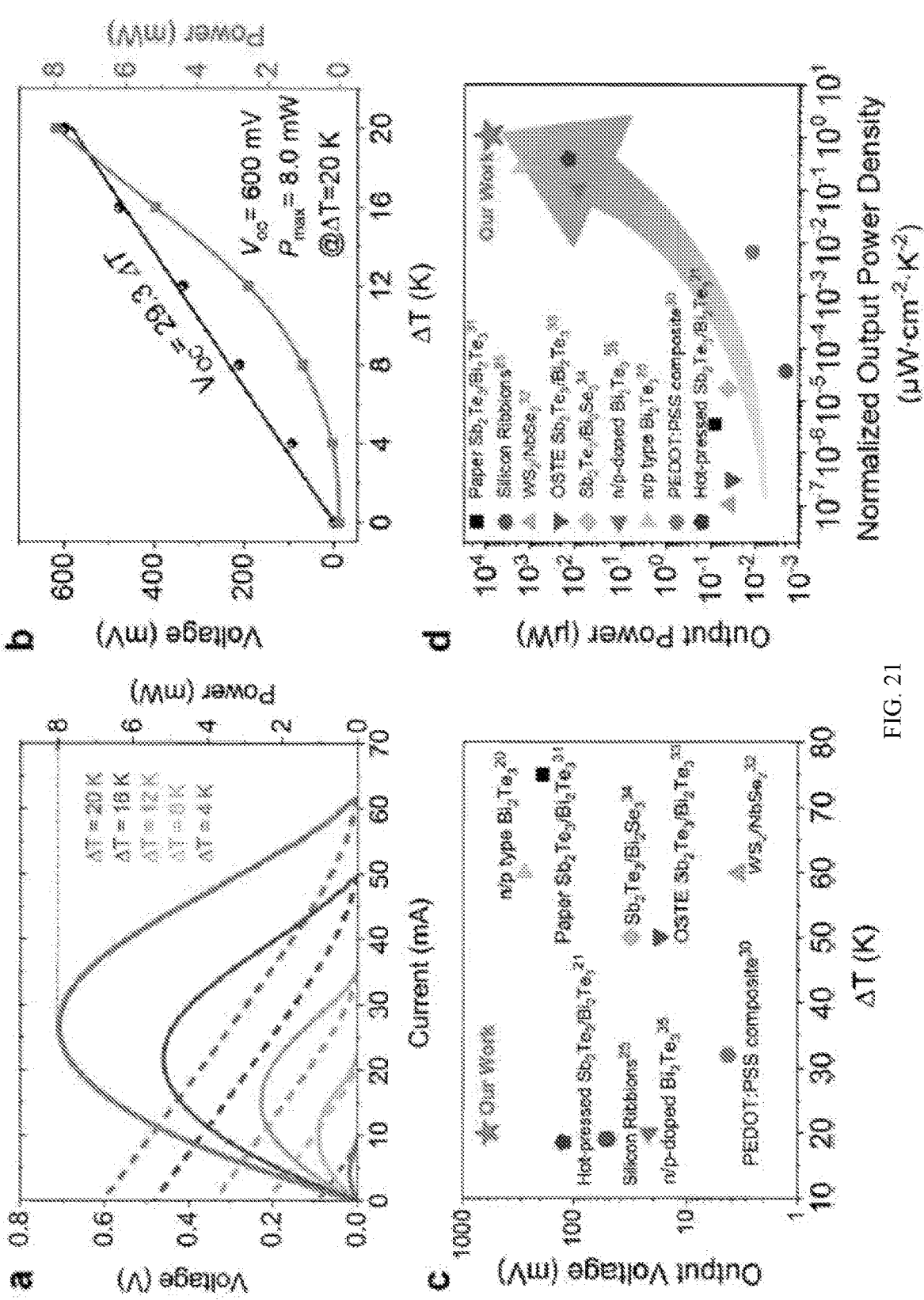
FIGS. 21A-21D depict properties of an RHS-TEG.

The power generation performance of an RHS-TEG comprising 200 pairs of n/p TE legs was measured under temperature differences (AT) ranging from 4 to 20 K. FIG. 21, Panel (a) shows the open-circuit voltage ($V_{oc}$) and output power versus current at different ΔT, recorded by a digital multimeter. FIG. 21, Panel (b) presents the dependency of $V_{oc}$ and the maximum output power $P_{max}$ on ΔT. The open-circuit voltage $V_{oc}$ exhibits a linear relationship with ΔT, obtained as $V_{oc}=29.3$ ΔT, where the slope gives the overall thermopower of the device as 2.93×104 pV K"1. When ΔT=20 K, the RHS-TEG generates a $V_{oc}=0.6$ V and a superior output power P=8.0 mW, which represents a significant advance over the recently reported stretchable TEGs as summarized in FIG. 21, Panels (c) and (d). The output voltage of the RHS-TEG in this study measured at a low temperature difference (ΔT=20 K) exceeds most of the reported values. More importantly, a boosted normalized power density of 1.08 μW cm$^{-2}$·K$^2$ has been achieved. This is due to a large fill factor of 21.6%, low internal resistance of=10Ω of the RHS-TEG compared with other flexible TEGs (typically higher than 20Ω), and good conductivity of the LM electrodes employed here.

Figures 22A, 22B, 22C:
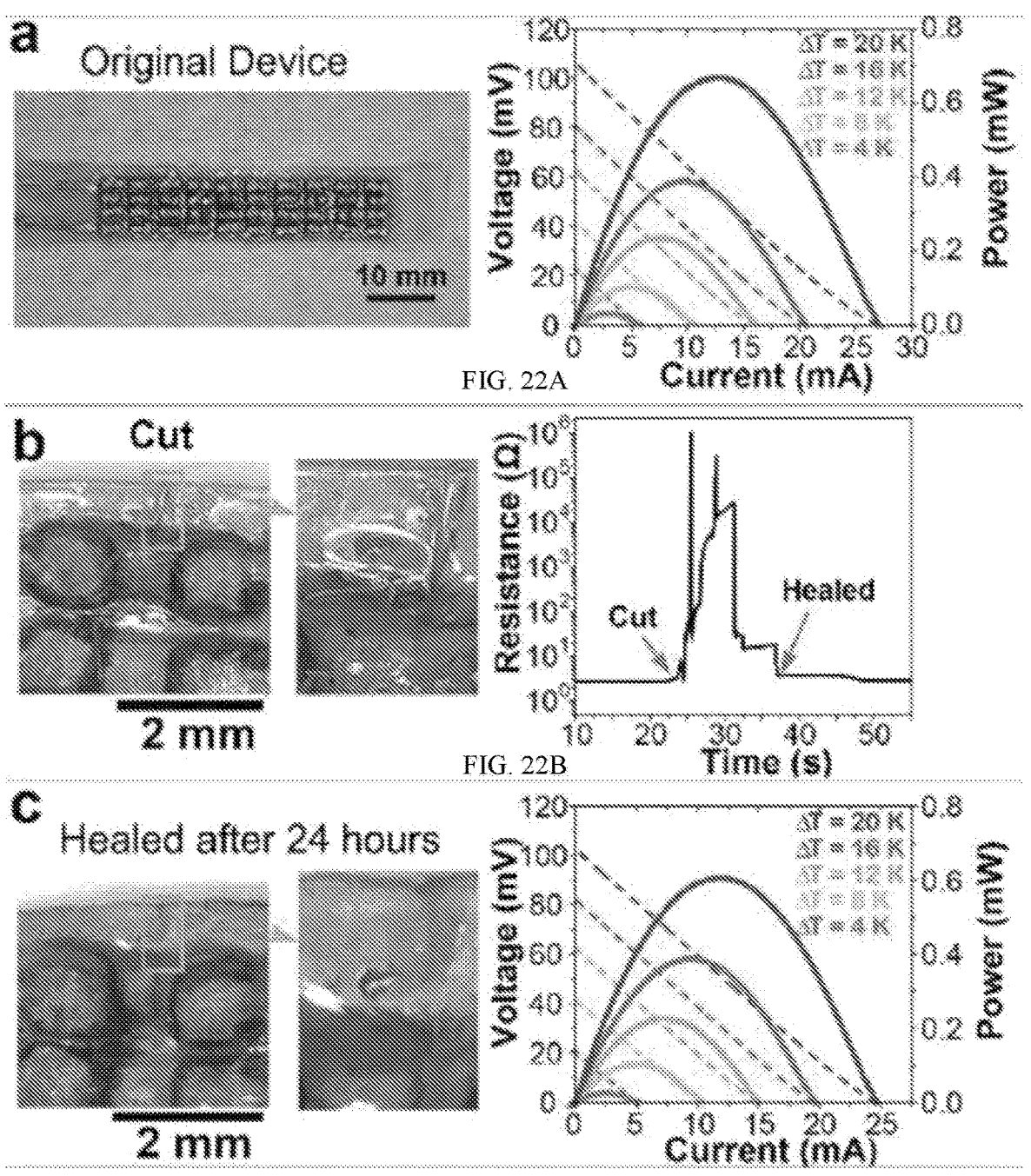
FIGS. 22A-22E depict healing and recycling of an RHS-TEG.

The healing and recycling performances of the RHS-TEG are demonstrated in FIG. 22. A rectangular TEG device (FIG. 22A (left)) consisting of 40 pairs of n/p TE legs (8 mm×43 mm) was adopted for the convenience of mechanical testing. The thermal energy conversion performance under different ΔT was tested and shown in FIG. 22A (right). The $V_{oc}$ and maximum output power of the RHS-TEG reached 105.6 mV and 669.0 μW at ΔT=20 K, respectively. The thermal energy conversion performances of RHS-TEG in different geometries is checked via finite element simulations. The simulations show quite good agreement with the experimental results. Next, the cutting and healing experiment was carried out to demonstrate the healing performance of the RHS-TEG. The LM electrode in the RHS-TEG was cut by a razor blade, and an optical image around the crack is shown in FIG. 22B (left). The recorded internal resistance of the RHS-TEG shows a spike in FIG. 22B (right). After gently pushing the broken pieces, the separated LM slowly flowed back to reconnect, recovering the electrical connection and restoring the internal resistance. A drop of uncured monomers/methanol solution was added to the cutting area, and new covalent imine bonds were formed at the broken area of the polyimine to ensure robust healing of the whole device. As shown in FIG. 22C (left), after 24 hours, the damaged area was fully healed. The power generation performance was tested after healing, and the results are presented in FIG. 22C (right). The open-circuit voltage and maximum output power were 102 mV and 605.7 μW at ΔT=20 K, respectively. The slight decrease in power generation (3.4% for $V_{oc}$ and 9.5% for power) is mainly due to the slight internal resistance rise from 2.46Ω in the original device to 2.57Ω after healing.

Figures 22D, 22E:
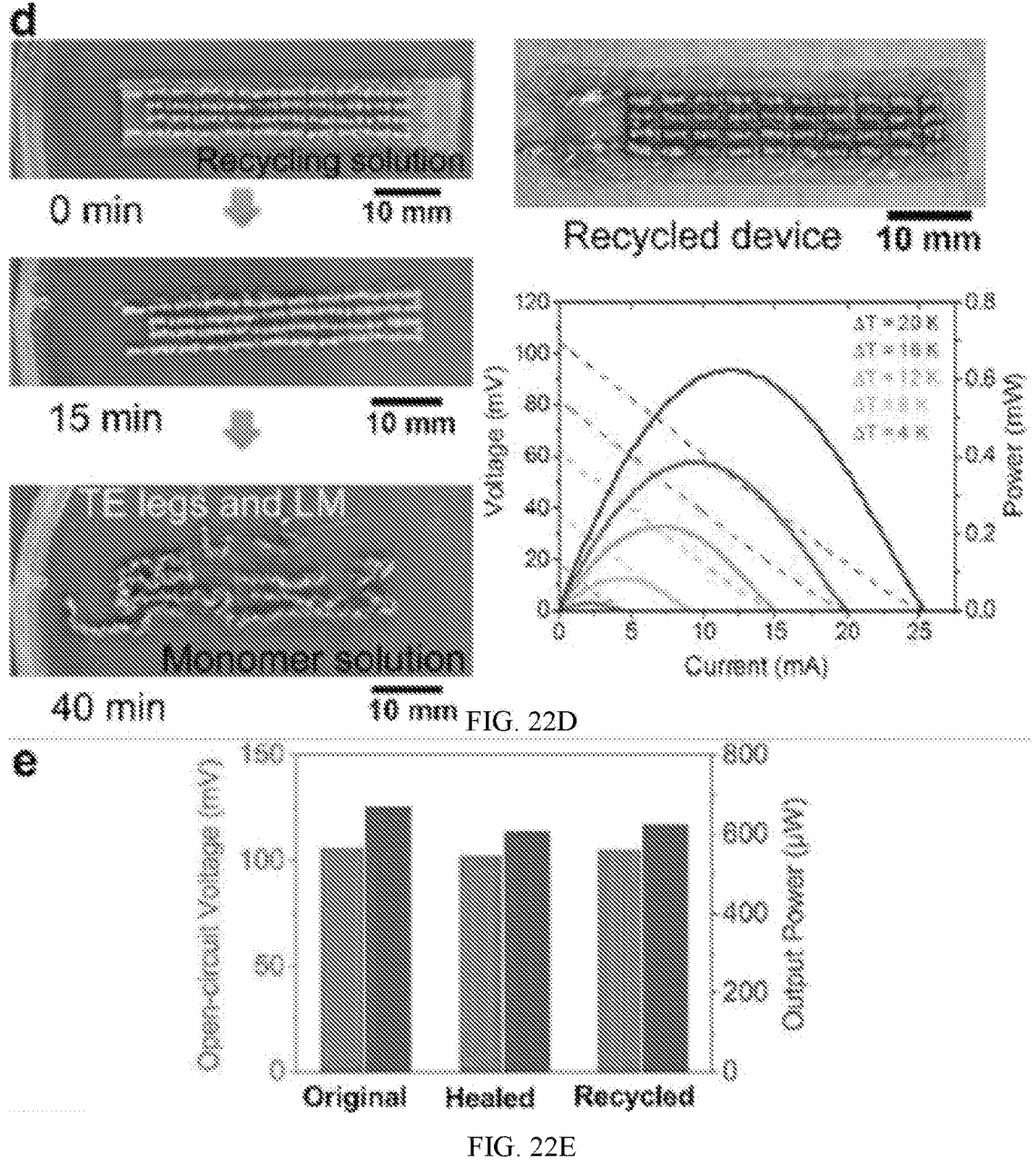

FIG. 22D demonstrates the recycling of the RHS-TEG. A discarded TEG was first soaked in the recycling solution. After 15 min, the polyimine matrix partially depolymerized to monomers in the solution. After 40 min, the polyimine matrix completely depolymerized to monomers and dissolved in methanol. The TE legs and LM were released from the matrix, and can be separated and reused. A new TEG device was then fabricated using the recycled components, as shown in FIG. 22D (top right). The power generation performance of the recycled TEG was tested, and the results are shown in FIG. 22D (bottom right). The open-circuit voltage was 104.5 mV and the output power was 623.1 μW at ΔT=20 K, a slight decrease of 1% for $V_{oc}$ and 6.9% for power when compared with the original TEG. The comparison of output performances between the original RHS-TEG, and the TEG after healing and recycling at ΔT=20 K is presented in FIG. 22E. The slight decreases in $V_{oc}$ and power after healing and recycling mainly came from the small fluctuation in internal resistance after these processes.

The mechanical properties and the effect of deformation on power generation of the RHS-TEG were studied and the results are shown in FIG. 23. FIG. 23A exhibits the stress-strain curve of the TEG, giving an effective modulus of 10 MPa. The TEG can be stretched by 49% before breaking. The inset shows an optical image of the broken device. The internal resistance increased by 42% at 49% tensile strain. FIG. 23B shows optical microscope images of a pair of n/p TE legs in the undeformed state (top) and when stretched by 20% (bottom). Because of the significant difference in mechanical stiffness between the TE legs (Young's modulus 160 GPa) and polyimine (Young's modulus 2 MPa), the mechanical stretching mainly happens in polyimine, so that the TE legs can only experience negligible mechanical deformation. This is manifested by the finite element simulation results shown in FIG. 23C. When the TEG is stretched by 20%, the maximum strain in polyimine reaches 90%, while the strain in TE legs is below 0.01%, far below the failure strain of $Bi_2Te_2$ and $Sb_2Te_3$ bulk materials [=1%]. Since LM is in liquid state and can flow, it doesn't introduce any rigidity to the TEG. Moreover, LM doesn't have fatigue issues and no stress concentration exists at the interface between LM and the rigid TE legs, which ensures robust and reliable interconnection under severe mechanical deformation. FIG. 23D presents the dynamic internal resistance change of the RHS-TEG during cyclic stretching and releasing tests. The resistance increases slightly (less than 6.5%) under 20% stretching, and it returns to the initial value after releasing, further proving the mechanical and electrical robustness of the RHS-TEG.

Figure 23B:
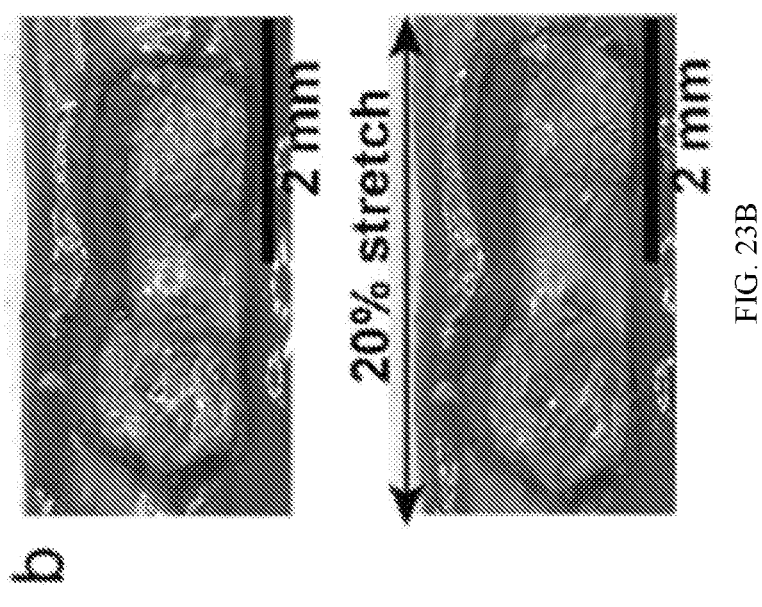
FIGS. 23A-23F depict stretchability and reliability properties of an RHS-TEG.
Figure 23A:
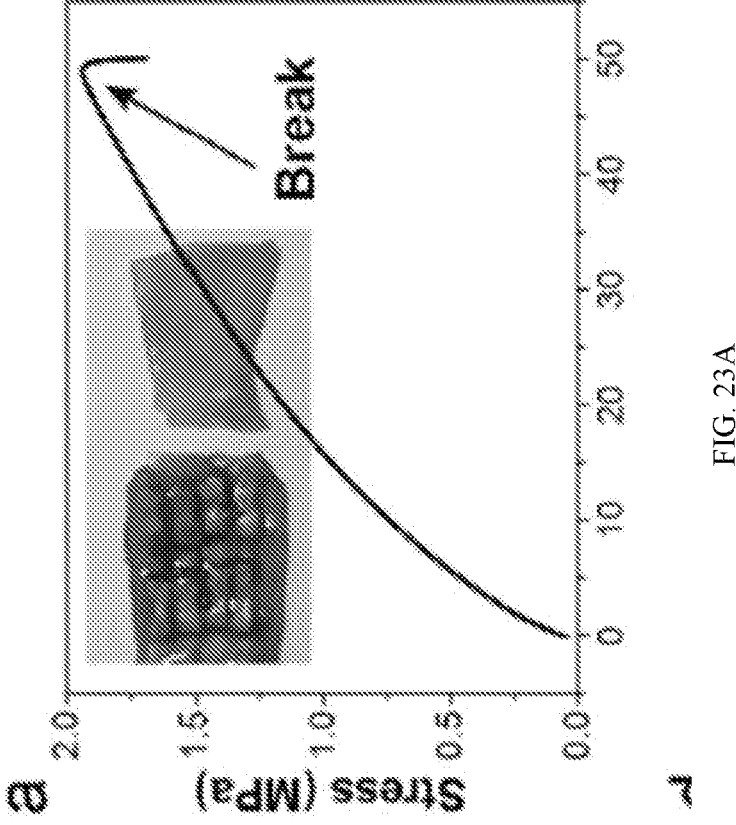
Figure 23C:
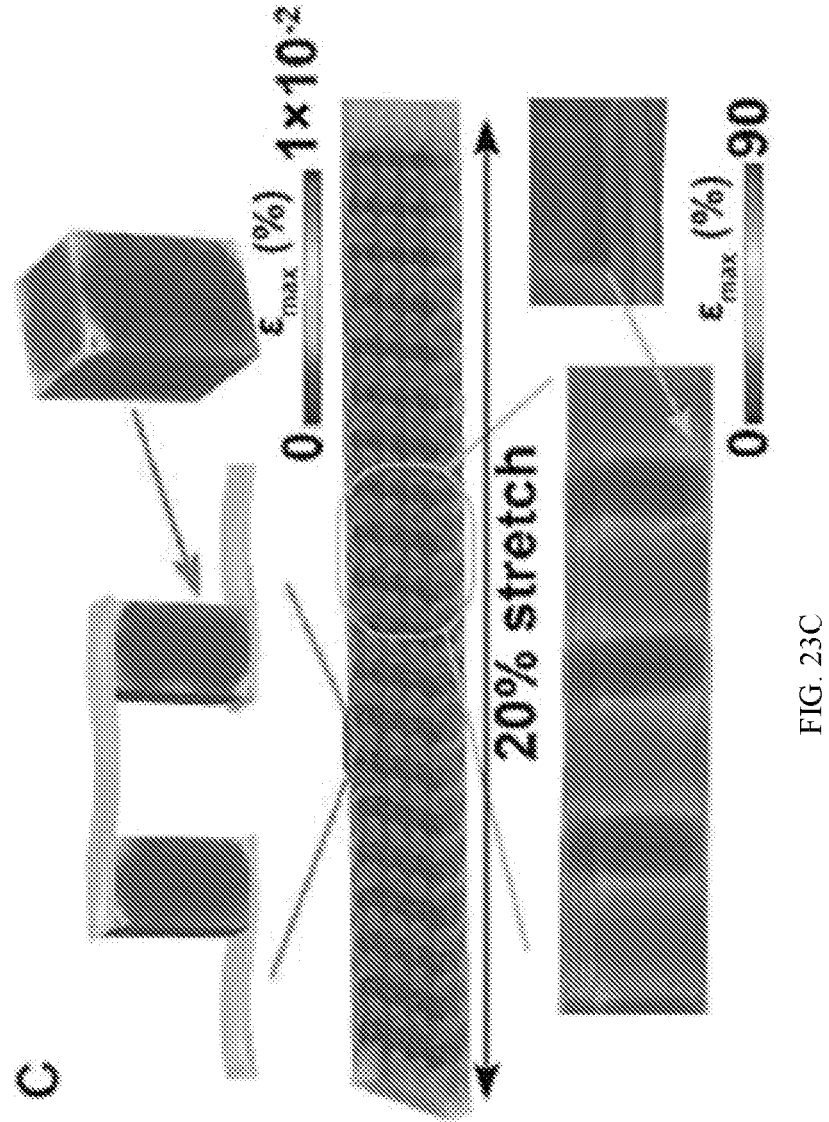
Figure 23D:
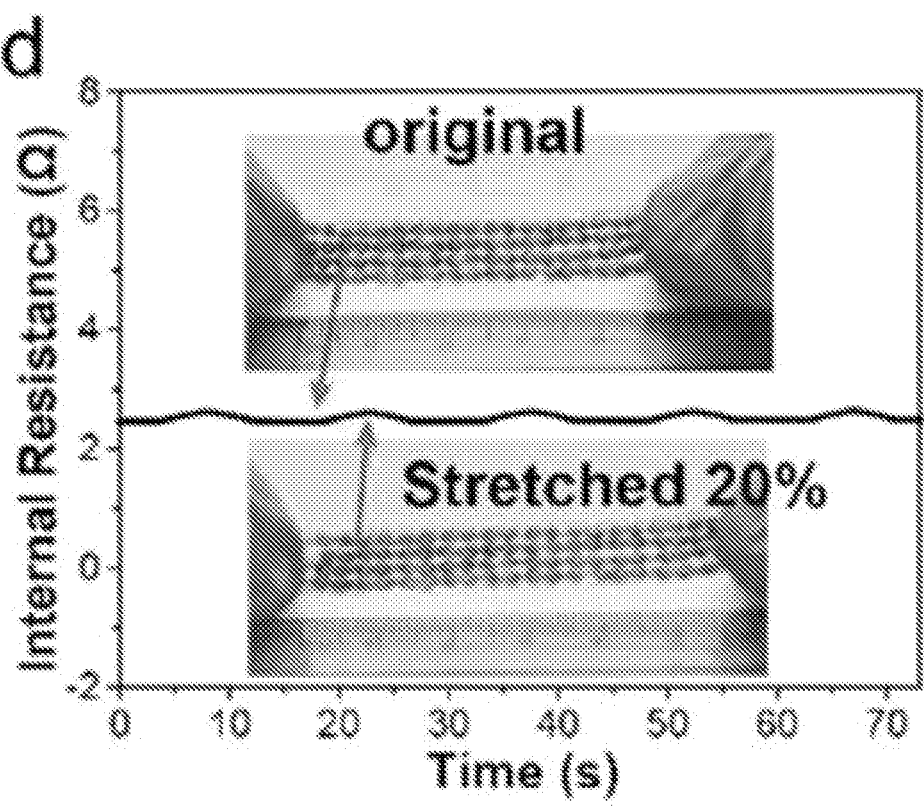
Figures 23E, 23F:
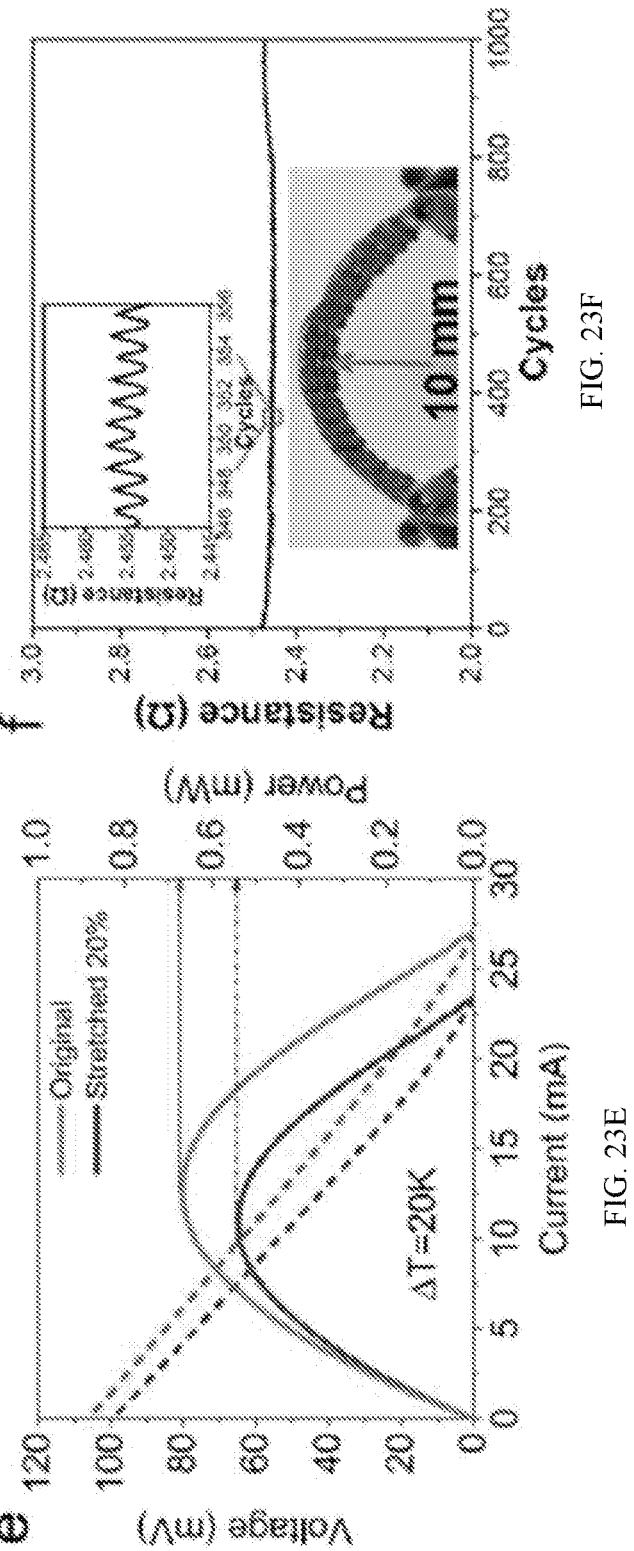

The output performance of the RHS-TEG under 20% stretching was measured and compared with the undeformed state in FIG. 23E. At $\Delta T=20$ K, the stretched device-generated $V_{oc}=100$ mV and $P_{max}=540$ μW, which are decreased by 5.3% and 19.3% compared with those of the undeformed RHS-TEG, respectively. The decrease in $V_{oc}$ may originate from the variation in temperature difference due to the deformation along the thickness direction brought by stretching. According to the I-V curves, the change in internal resistance (r) is calculated to be 9%, consistent with the resistance change under static tensile stress. The cyclic bending test was also carried out to confirm the stability and reliability of the RHS-TEG. The TEG was bent to a radius of 10 mm, as shown in the bottom inset of FIG. 23F. The resistance versus bending cycles is shown in FIG. 23F. After 1000 cycles, the internal resistance remained almost unchanged. The top inset of FIG. 23F shows the magnified curve in 10 bending cycles, indicating good electrical stability and reliability of the TEG under cyclic bending. The healed and recycled TEGs were also measured using cyclic tension tests (20% strain), demonstrating similar behaviors as original TEG.

In the end, the output performance of 200 pairs n/p legs RHS-TEG worn on the human arm to harvest thermal energy from body heat has been tested. The output voltage is around 23.3 mV and the maximum power is 11.6 μW at room temperature in ambient condition, which ambiguously demonstrates the capability of RHS-TEG working as a body heat driven power source for other low-power wearable electronics. The output power density could be further enhanced by optimizing the thermal contact with skin and thermal isolation across the TEG as pointed out by recent work.

A recyclable, healable, and stretchable high-power TEG constructed using commercial TE legs has been demonstrated. By employing liquid metal as intrinsically stretchable and healable interconnects, the TEG is endowed with excellent electrical reliability and mechanical compliance. A superior normalized power density of $1.08$ W cm$^{-2}$·K$^2$ has been achieved, exceeding the reported stretchable TEGs. Furthermore, by adopting dynamic covalent thermoset polyimine as the matrix, the TEGs are recyclable. The recycled and healed TEGs can provide TE conversion performance comparable with the original device. Mechanical tests prove the robustness and reliability of the RHS-TEGs under cyclic loading conditions. This study provides a low-cost and scalable strategy for developing sustainable energy harvesters to power wearable electronics using body heat.

Supplemental Section

Materials: $Bi_2Te_3$, $Sb_2Te_3$ TE legs were from commercial products (Aideepen), in the size of $1\times1\times1.5$ mm$^3$, with Seebeck coefficient of 193.6 μV/K and −186.5 V/K respectively. Terephthalaldehyde, 3,3'-diamino-N-methyldipropylamine, and tris(2-aminoethyl)amine were obtained from Sigma-Aldrich. The LM used in this work was eutectic metal alloy comprising gallium (75%) and indium (25%) (EGain, Sigma-Aldrich).

Synthesis of Polymine: First, terephthalaldehyde (1.5 g, 11.18 mmol), 3,3'-diamino-N-methyldipropylamine (1.251 g, 8.61 mmol), and tris(2-aminoethyljamine (0.252 g, 1.72 mmol) were added in 20 mL of methanol. Afterward, the solution was vigorously stirred to ensure complete dissolution of the chemicals and then poured into a silicon paper mold, followed by evaporating methanol solvent in a fume hood for 12 hours at room temperature. Finally, a faint yellow polyimine film was obtained.

Fabrication of the RHS-TEG: First, a silicon paper mask patterned by a laser cutting machine was laminated over a polyimine film, then the LM electrodes were screen-printed over the silicon paper using a razor blade. The LM bottom electrodes with designed pattern were formed on the polyimine substrate after the paper mask was peeled off. Then a polyimine film was cut into a hollow structure (see FIG. 20D top electrode) for easier evaporation of the methanol solvent, followed by screen-printing top electrodes over the solid area. Second, n/p TE legs with surface metallization were placed alternately on the bottom electrodes. Afterward, the polyimine coated with top LM electrodes were flip over and aligned precisely with the n/p TE legs array, followed by gently attaching it on the top surface of the legs in order to initially connect the thermocouples electrically in series and thermally in parallel. Third, a nonstick silicon paper was placed on the top electrodes with an acrylate board and a weight placed on it to prevent the TE legs and electrodes from moving apart. Then the polyimine monomer solution was used to fill the gap between the top and bottom electrodes, during which in situ polymerization reaction took place to form the gel consisted of polyimine molecule chain and massive methanol solvent. Lastly, silicon paper was removed and the gel encapsulated device was placed in fume hood for 24 hour for solvent evaporation and then the RHS-TEG packaged with fully cured polyimine was obtained.

Healing and Recycling of the RHS-TEG: To heal the damaged RHS-TEG device, the uncured mixed solution was prepared according to the above polyimine synthesis procedure. A drop of the solution was dropped onto the damaged area and the device was placed in a fume hood for 24 hour for thorough healing.

The recycling solution was prepared by adding 0.417 g of 3,3'-diamino-N-methyldipropylamine and 0.084 g of tris(2-aminoethyl)amine into 10 mL of methanol. The waste RHS-TEG was soaked in the recycling solution for 40 min to depolymerize the polyimine into monomers that can dissolve in methanol. Then the rigid TE legs and LM were separated from the solution, followed by adding 0.5 g of terephthalaldehyde to the monomer solution to form a new polyimine film. Dilute sulphuric acid was used to remove the oxide layer on the LM surface, leading to the congregation of LM. All of the LM and TE legs were washed with methanol before reuse.

Characterization: A homemade temperature controlling platform based on Peltier devices was used to control $\Delta T$ across the top and bottom surfaces of the RHS-TEGs, where the cold end was maintained at 20° C. and the hot end increasing from 20 to 40° C. The RHS-TEGs were sandwiched between the heated and cooled metal plates. A thermometer was used to measure the temperature difference, with two thermocouples attached on two sides of the surface of the TEGs. After the thermal equilibrium state was established, the output performances of the RHS-TEGs were measured by a Keithley 2400 source meter. The continuous bending test was performed on a linear motor (LinMot, E1100). The tensile strain test was conducted on a Zwick universal tensile machine.

The disclosures of each and every patent, patent application, and publication cited herein are hereby incorporated herein by reference in their entirety.

While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. An electronic device comprising:
a plurality of electronic chip components;
a plurality of liquid metal (LM) electrical interconnects coupled to the plurality of electronic chips; and
a polyimine film encapsulating the plurality of electronic chip components and the plurality of LM electrical interconnects;
wherein the polyimine film comprises a product of a polymerization reaction between:
(i) a dialdehyde monomer of Formula (I):

Formula (I)

wherein represents $C_1$-$C_{20}$ alkyl, $C_4$-$C_{10}$ heteroaryl, $C_6$-$C_{12}$ aryl, or $C_3$-$C_9$ cycloalkyl;
$R_{10}$ is independently a substituent at each open valence of A; and
each instance of $R_{10}$ is independently selected from the group consisting of hydrogen, deuterium, $C_1$-$C_6$ alkyl, $C_2$-$C_6$ alkenyl, $C_1$-$C_6$ alkoxy, hydroxy, halogen, and combinations thereof;
(ii) a diamine monomer of Formula (II):

Formula (II)

wherein
$Alk_{20}$, $Alk_{21}$, $Alk_{22}$, $Alk_{23}$, $Alk_{24}$, and $Alk_{25}$ are each independently $C_1$-$C_{12}$ alkyl, which is independently optionally substituted with at least one of deuterium, $C_2$-$C_6$ alkenyl, $C_1$-$C_6$ alkoxy, hydroxy, halogen, and any combination thereof; and a, b, and c are each independently an integer from 0 to 5; and
(iii) a triamine monomer of Formula (III):

Formula (III)

wherein
$Alk_{30}$, $Alk_{31}$, $Alk_{32}$, $Alk_{33}$, $Alk_{34}$, and $Alk_{35}$ are each independently $C_1$-$C_{12}$ alkyl, which is independently optionally substituted with deuterium, $C_2$-$C_6$ alkenyl, $C_1$-$C_6$ alkoxy, hydroxy, halogen, and combinations thereof; and
d, e, and f are each independently an integer from 0 to 5.

2. The electronic device of claim 1, wherein the polyimine film comprises a layer of substrate and an enveloping layer, with the plurality of electronic chip components and the plurality of LM interconnects encapsulated between the layer of substrate and the enveloping layer.

3. The electronic device of claim 1, further comprising polyimine insulation interlayers disposed between at least two LM electrical interconnects that physically intersect each other.

4. The electronic device of claim 1, wherein the plurality of electronic chip components are each coupled to LM contact pads, wherein the plurality of electronic chip components and the plurality of LM interconnects are coupled via the LM contact pads.

5. The electronic device of claim 1, wherein the plurality of electronic chip components comprises a thermal sensor, an accelerometer, an electrocardiogram (ECG) sensor, or any combination thereof.

6. The electronic device of claim 1, wherein the polyimine film and the plurality of LM interconnects are self-healable.

7. The electronic device of claim 1, wherein the electronic device is a wearable device.

8. The electronic device of claim 1, wherein a dimension of the plurality of LM interconnects can be stretched to 200% relative to an initial size of the dimension.

9. The electronic device of claim 1, wherein a dimension of the electronic device can be stretched to 60% relative to an initial size of the dimension.

10. The electronic device of claim 1, wherein the plurality of LM interconnects comprise eutectic gallium-indium (EGaIn).

11. The electronic device of claim 1, wherein the plurality of electronic chip components comprise a thermoelectric generator.

12. A method for manufacturing an electronic device, the method comprising:
disposing a volume of liquid metal (LM) on a polyimine substrate to form a plurality of electrical interconnects;
disposing a plurality of electronic chip components onto the polyimine substrate and in contact with the plurality of electrical interconnects; and
applying a layer of polyimine onto the polyimine substrate, the plurality of electrical interconnects, and the plurality of electronic chip components;
wherein the polyimine substrate comprises a product of a polymerization reaction between (i) a dialdehyde monomer of Formula (I):

Formula (I)

wherein represents $C_1$-$C_{20}$ alkyl, $C_4$-$C_{10}$ heteroaryl, $C_6$-$C_{12}$ aryl, or $C_3$-$C_9$ cycloalkyl;

$R_{10}$ is independently a substituent at each open valence of A; and each instance of $R_{10}$ is independently selected from the group consisting of hydrogen, deuterium, $C_1$-$C_6$ alkyl, $C_2$-$C_6$ alkenyl, $C_1$-$C_6$ alkoxy, hydroxy, halogen, and combinations thereof;

(ii) a diamine monomer of Formula (II):

Formula (II)

wherein $Alk_{20}$, $Alk_{21}$, $Alk_{22}$, $Alk_{23}$, $Alk_{24}$, and $Alk_{25}$ are each independently $C_1$-$C_{12}$ alkyl, which is independently optionally substituted with at least one of deuterium, $C_2$-$C_6$ alkenyl, $C_1$-$C_6$ alkoxy, hydroxy, halogen, and any combination thereof; and a, b, and c are each independently an integer from 0 to 5; and (iii) a triamine monomer of Formula (III):

Formula (III)

wherein $Alk_{30}$, $Alk_{31}$, $Alk_{32}$, $Alk_{33}$, $Alk_{34}$, and $Alk_{35}$ are each independently $C_1$-$C_{12}$ alkyl, which is independently optionally substituted with deuterium, $C_2$-$C_6$ alkenyl, $C_1$-$C_6$ alkoxy, hydroxy, halogen, and combinations thereof; and d, e, and f are each independently an integer from 0 to 5.

13. The method of claim 12, further comprising:

applying a layer of insulating polyimine over a portion of the electrical interconnects; and applying a second volume of LM on the polyimine substrate to form additional electrical interconnects, wherein a portion of the additional electrical interconnects overlap a portion of the layer of insulating polyimine.

14. The method of claim 12, further comprising:

compressing a portion of the layer of polyimine, the polyimine substrate, and/or both; and generating covalent bonds within the portion of the layer of polyimine, the polyimine substrate, and/or both, from the compressing.

15. The method of claim 12, further comprising:

introducing a volume of diamine monomers, triamine monomers, or both, to the polyimine substrate and the layer of polyimine; and depolymerizing the polyimine substrate and the layer of polyimine with the volume of diamine monomers, triamine monomers, or both;

wherein the volume of diamine monomers, triamine monomers, or both are components of a recycling solution comprising:

(i) a diamine monomer of Formula (II):

Formula (II)

wherein $Alk_{20}$, $Alk_{21}$, $Alk_{22}$, $Alk_{23}$, $Alk_{24}$, and $Alk_{25}$ are each independently $C_1$-$C_{12}$ alkyl, which is independently optionally substituted with deuterium, $C_2$-$C_6$ alkenyl, $C_1$-$C_6$ alkoxy, hydroxy, halogen, and any combination thereof; and a, b, and c are each independently an integer from 0 to 5; or (ii) a triamine monomer of Formula (III):

Formula (III)

wherein $Alk_{30}$, $Alk_{31}$, $Alk_{32}$, $Alk_{33}$, $Alk_{34}$, and $Alk_{35}$ are each independently $C_1$-$C_{12}$ alkyl, which is independently optionally substituted with deuterium, $C_2$-$C_6$ alkenyl, $C_1$-$C_6$ alkoxy, hydroxy, halogen, and any combinations thereof; and d, e, and f are each independently an integer from 0 to 5; or a combination of (i) and (ii).

16. The method of claim 15, further comprising:

disposing the plurality of electronic chips onto another polyimine substrate and in contact with another plurality of electrical interconnects subsequent to the depolymerization.

17. The method of claim 12, wherein disposing the volume of LM on the polyimine substrate is performed via screen printing or 3-D printing.

* * * * *